(12) United States Patent
Cheon et al.

(10) Patent No.: US 11,600,632 B2
(45) Date of Patent: Mar. 7, 2023

(54) VERTICAL MEMORY WITH SIMPLIFIED INTEGRATION

(71) Applicant: SAMSUNG ELECTRONICS CO., LTD., Suwon-si (KR)

(72) Inventors: Jisung Cheon, Ansan-si (KR); Seokcheon Baek, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 55 days.

(21) Appl. No.: 16/752,141

(22) Filed: Jan. 24, 2020

(65) Prior Publication Data
US 2020/0402996 A1    Dec. 24, 2020

(30) Foreign Application Priority Data

Jun. 20, 2019  (KR) .................. 10-2019-0073611

(51) Int. Cl.
 *H01L 27/11582*  (2017.01)
 *H01L 27/11157*  (2017.01)
(52) U.S. Cl.
 CPC .... *H01L 27/11582* (2013.01); *H01L 27/1157* (2013.01)
(58) Field of Classification Search
 CPC .................... H01L 27/11521–11597
 See application file for complete search history.

(56) References Cited

U.S. PATENT DOCUMENTS

| | | | |
|---|---|---|---|
| 8,901,745 B2 | 12/2014 | Hwang et al. | |
| 9,230,987 B2 | 1/2016 | Pachamuthu et al. | |
| 9,691,781 B1 | 6/2017 | Nishikawa et al. | |
| 9,985,048 B2 | 5/2018 | Lee | |
| 10,090,321 B2 | 10/2018 | Nakajima | |
| 10,114,590 B1 | 10/2018 | Wicklein | |
| 2010/0013049 A1 | 1/2010 | Tanaka et al. | |
| 2011/0031630 A1* | 2/2011 | Hashimoto | H01L 27/11578 257/774 |
| 2011/0220987 A1* | 9/2011 | Tanaka | H01L 27/11578 257/324 |
| 2017/0236746 A1 | 8/2017 | Yu et al. | |
| 2018/0331117 A1 | 11/2018 | Titus et al. | |
| 2019/0006381 A1 | 1/2019 | Nakatsuji et al. | |
| 2021/0082941 A1* | 3/2021 | Son | H01L 27/1157 |

FOREIGN PATENT DOCUMENTS

| | | |
|---|---|---|
| JP | 2010-027870 | 2/2010 |
| JP | 2018-049968 | 3/2018 |

\* cited by examiner

*Primary Examiner* — Didarul A Mazumder
*Assistant Examiner* — Gustavo G Ramallo
(74) *Attorney, Agent, or Firm* — F. Chau & Associates, LLC

(57) ABSTRACT

A vertical memory device is provided including a first structure on a substrate. The first structure includes gate patterns spaced apart from each other in a vertical direction perpendicular to an upper surface of the substrate to form a plurality of layers. A second structure is connected to the first structure. The second structure includes pad patterns electrically connected to the gate patterns of a respective one of the layers. A channel structure passes through the gate patterns. A first contact plug passes through the second structure and electrically connects with a pad pattern of one of the layers. The first contact plug is electrically insulated from gate patterns of other layers. At least one bent portion is included at each of a sidewall of the channel structure and a sidewall of the first contact plug.

15 Claims, 43 Drawing Sheets

VERTICAL MEMORY WITH SIMPLIFIED INTEGRATION

CROSS-REFERENCE TO RELATED APPLICATION

This application claims priority under 35 U.S.C. § 119 to Korean Patent Application No. 10-2019-0073611, filed on Jun. 20, 2019, in the Korean Intellectual Property Office (KIPO), the disclosure of which is incorporated by reference herein in its entirety.

TECHNICAL FIELD

The present inventive concept relates to vertical memory devices.

DISCUSSION OF THE RELATED ART

Recently, a vertical memory device including a plurality of memory cells vertically stacked on a substrate has been developed. One example of a vertical memory device includes a NAND-type flash memory. Although the vertical memory device has increased integration, as the number of stacked memory cells increases, wiring structures for connecting the memory cells may become complicated.

SUMMARY

According to an exemplary embodiment of the present inventive concept, a vertical memory device is provided including a first structure on a substrate. The first structure includes gate patterns spaced apart from each other in a vertical direction perpendicular to an upper surface of the substrate to form a plurality of layers. A second structure is connected to the first structure. The second structure includes pad patterns electrically connected to the gate patterns of a respective one of the layers. A channel structure passes through the gate patterns. A first contact plug passes through the second structure and electrically connects with a pad pattern of one of the layers. The first contact plug is electrically insulated from gate patterns of other layers. At least one bent portion is included at each of a sidewall of the channel structure and a sidewall of the first contact plug.

According to an exemplary embodiment of the present inventive concept, there is provided a vertical memory device including a circuit pattern on a substrate. A base pattern and a base insulation layer are disposed on the circuit pattern. A first structure is disposed on the base pattern. The first structure includes gate patterns spaced apart from each other in a vertical direction perpendicular to an upper surface of the substrate. The gate patterns extend in a first direction parallel to the upper surface of the substrate. A second structure connected to the first structure, the second structure includes pad patterns in separate layers. The pad patterns are electrically connected to the gate patterns of a same layer. A channel structure passes through the gate patterns, and the channel structure extends in the vertical direction. A first contact plug passing through the second structure is electrically connected with a pad pattern of one of the layers, and the first contact plug extends in the vertical direction.

According to an exemplary embodiment of the present inventive concept, there is provided a vertical memory device including a first structure disposed on a substrate. The first structure includes gate patterns spaced apart from each other in a vertical direction perpendicular to an upper surface of the substrate. The gate patterns extend in a first direction parallel to the upper surface of the substrate. A second structure is connected to the first structure, the second structure includes pad patterns spaced apart in separate layers and electrically connected to gate patterns of a same layer. A channel structure passes through the gate patterns. The channel structure extends in the vertical direction. A first contact plug passes through the second structure and electrically connects with a pad pattern of one of the layers, and the first contact plug extends in the vertical direction, and the first contact plug passes through the second structure. The first contact plug is electrically insulated from gate patterns of other layers. A third structure is spaced apart from the second structure, and a second contact plug passes through the third structure, and the second contact plug extends in the vertical direction. An upper surface of the channel structure and upper surfaces of the first contact plug and the second contact plug are coplanar with each other.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF THE EMBODIMENTS

Figure 1:
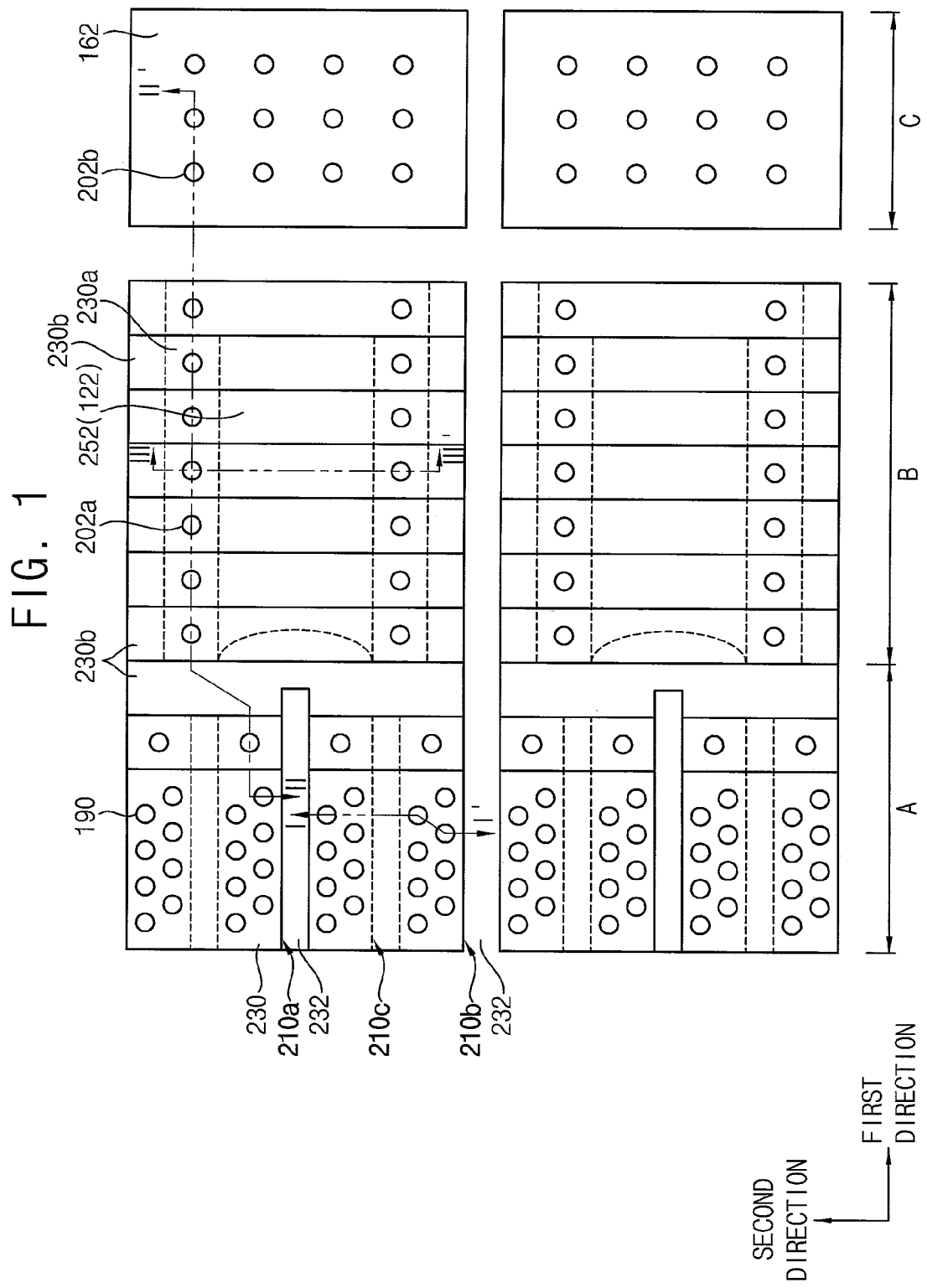
FIG. 1 is a plan view illustrating a vertical memory device in accordance with an exemplary embodiment of the present inventive concept.
Figure 2:
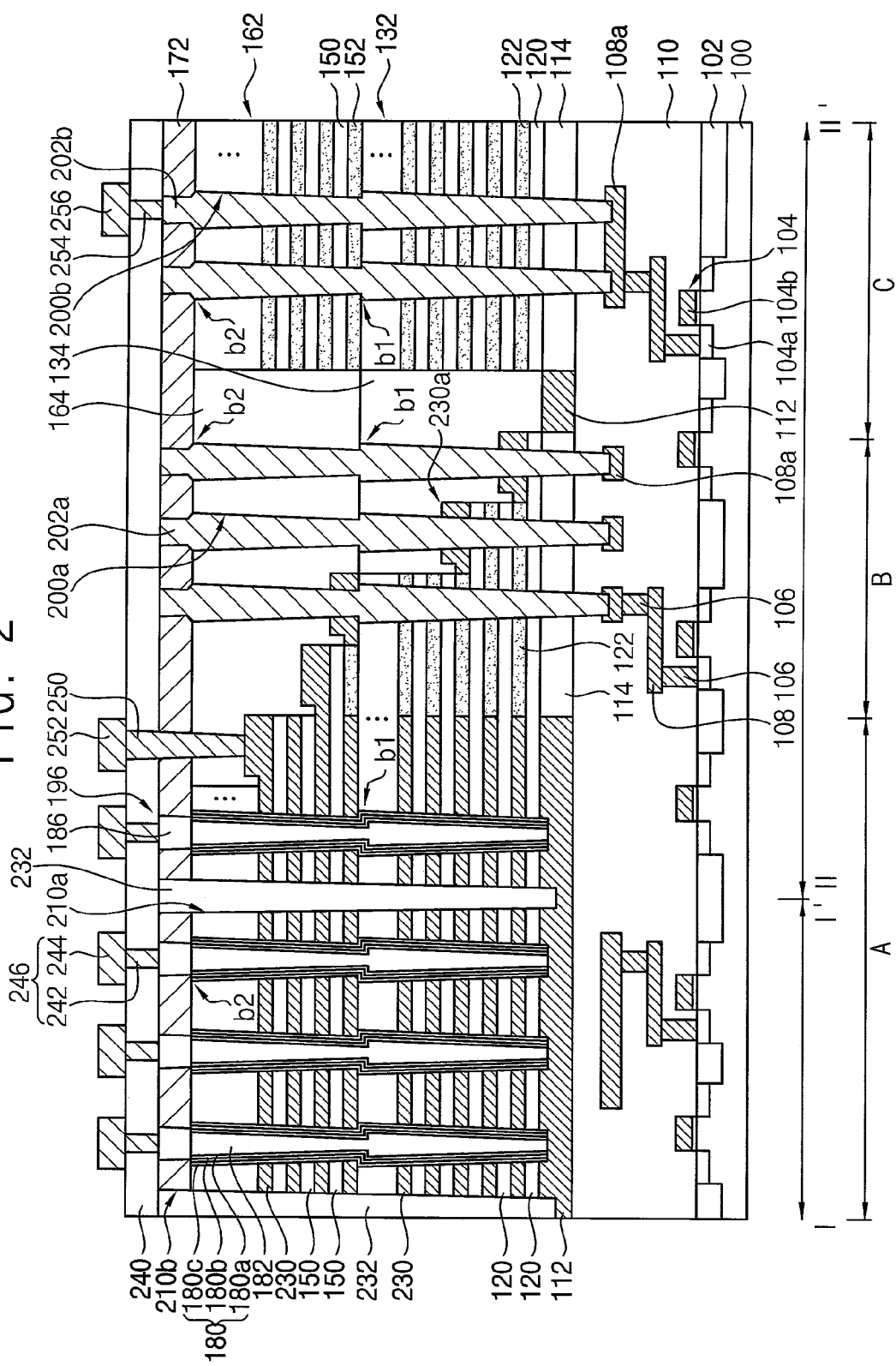
FIG. 2 is a cross-sectional view taken along line I-I' and II-II' illustrating a vertical memory device in accordance with an exemplary embodiment of the present inventive concept.
Figure 3A:
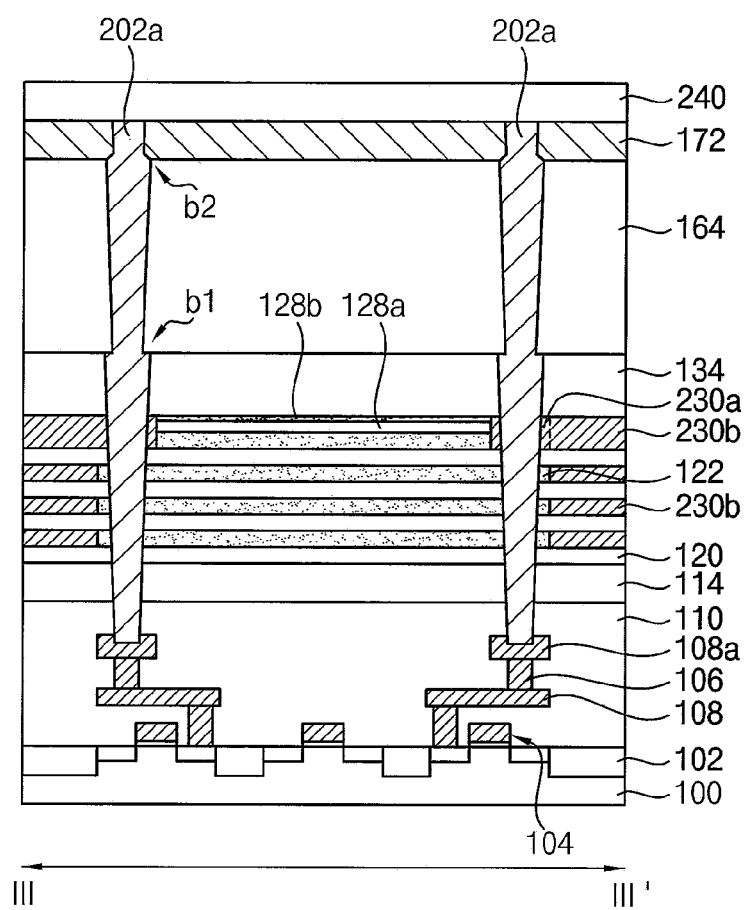
FIG. 3A is a cross-sectional view illustrating a cross-section taken along line of the vertical memory device of FIG. 1 in accordance with an exemplary embodiment of the present inventive concept.
Figure 3B:
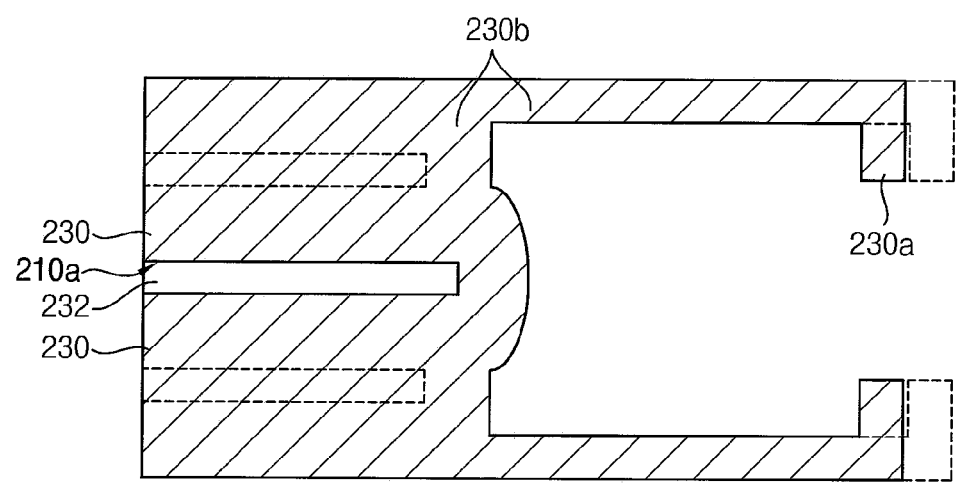
FIG. 3B is a plan view illustrating a gate pattern, a conductive pattern and a pad pattern at one level in the vertical memory device of FIG. 1 in accordance with an exemplary embodiment of the present inventive concept.
Figure 4A:
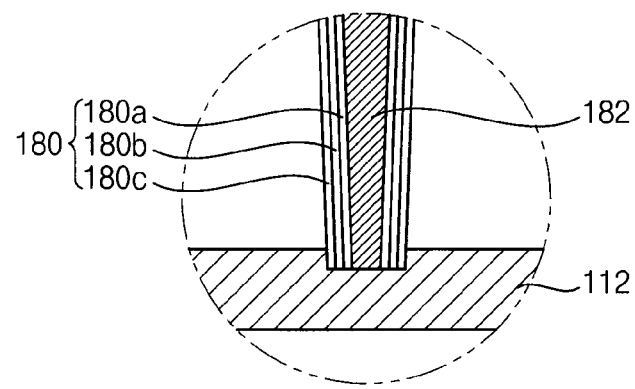
FIGS. 4A, 4B and 4C are cross-sectional views illustrating lower portions of the vertical memory device in accordance with exemplary embodiments of the present inventive concept.
Figure 4B:
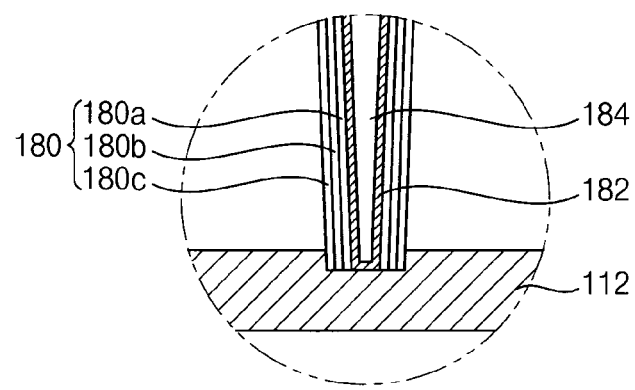
Figure 4C:
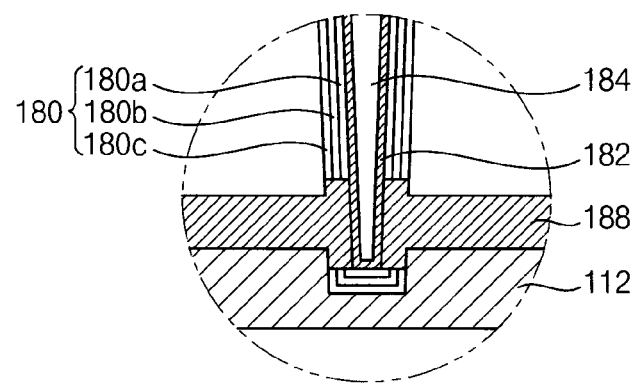

FIG. 1 is a plan view illustrating a vertical memory device in accordance with an exemplary embodiment of the present inventive concept. FIG. 2 is a cross-sectional view taken along line I-I' and II-II' illustrating a vertical memory device in accordance with an exemplary embodiment of the present inventive concept. FIG. 3A is a cross-sectional view illustrating a cross-section taken along line of the vertical memory device of FIG. 1 in accordance with an exemplary embodiment of the present inventive concept. FIG. 3B is a plan view illustrating a gate pattern, a conductive pattern and a pad pattern at one level in the vertical memory device of FIG. 1 in accordance with an exemplary embodiment of the present inventive concept. FIGS. 4A, 4B and 4C are cross-sectional views illustrating lower portions of the vertical memory device in accordance with exemplary embodiments of the present inventive concept.

Hereinafter, a direction substantially perpendicular to an upper surface of the substrate may be a vertical direction, and two directions crossing with each other in horizontal directions substantially parallel to the upper surface of the substrate may be a first direction and a second direction, respectively. In exemplary embodiments of the present inventive concept, the first and second directions may be perpendicular to each other.

Referring to FIGS. 1, 2, 3A and 3B, the vertical semiconductor device may include a circuit pattern formed on a substrate 100. The substrate 100 may include a cell region A, a cell wiring region B, and a through wiring region C. A channel structure 190 may be formed in the cell region A, a first contact plug 202a may be formed in the through cell wiring region B, and the second contact plug 202b may be formed in the through wiring region C. The channel structure 190, the first contact plug 202a and the second contact plug 202b may each have a tapered shape that narrows in a vertical direction perpendicular to an upper surface of the substrate 100. The channel structure 190, the first contact plug 202a and the second contact plug 202b may be formed over the circuit pattern. For example, the channel structure 190 may be formed over the circuit pattern in the cell region A and the first contact plug 202a and the second contact plug 202b may be formed over the circuit pattern in the through cell wiring region B and the wiring region C, respectively. Each of the first contact plug 202a and the second contact plug 202b may be electrically connected to the circuit patterns. The vertical semiconductor device may have a Cell Over Peripheral (COP) structure. In other words, peripheral circuits for driving memory cell may be formed on the substrate 100 under the memory cells.

The substrate 100 may include a semiconductor material, e.g., silicon, germanium, silicon-germanium and/or a III-V semiconductor compounds, e.g., GaP, GaAs, GaSb, etc. In an exemplary embodiment of the present inventive concept, the substrate 100 may be a silicon-on-insulator (SOI) substrate or a germanium-on-insulator (GOI) substrate.

The circuit pattern may include lower transistors 104, lower contact plugs 106, lower wirings 108, or the like. In an exemplary embodiment of the present inventive concept, the lower contact plug 106 and the lower wiring 108 may be formed to have multiple layers.

A lower insulating interlayer 110 covering the circuit patterns may be formed on the substrate 100. The lower contact plugs 106 may contact impurity regions 104a and/or a gate 104b of the lower transistor 104.

The lower wirings 108 may include a lower pad 108a. In exemplary embodiments of the present inventive concept, the lower pad 108a may be a pattern disposed at an uppermost portion among the lower wirings 108. The lower pad 108a may directly contact bottom surfaces of the first and second contact plugs 202a and 202b.

Base patterns 112 may be formed on the lower insulating interlayer 110 (e.g., an upper surface). In an exemplary embodiment of the present inventive concept, the base patterns 112 may be formed below the cell region A. The base patterns 112 may include, e.g., a polysilicon layer and/or a single crystal silicon layer.

A base insulation layer 114 may be formed between the base patterns 112 on the lower insulating interlayer 110. The base insulation layer 114 may be disposed at a penetrating portion of the first contact plug 202a and the second contact plug 202b. In other words, sidewalls of the first contact plug 202a and the second contact plug 202b may contact the base insulation layer 114. The base insulation layer 114 may include, e.g., silicon oxide. A base pattern 112 may be disposed between penetrating portions of the first contact plug 202a and the second contact plug 202b.

A first structure may be formed on the base pattern 112 in the cell region A. The first structure may include a structure in which first insulation layers 120 and conductive patterns are alternately and repeatedly stacked and a structure in which second insulation layers 150 and the conductive patterns alternately and repeatedly stacked thereon. A third insulating interlayer 172 may be formed on the first structure. Each of the conductive patterns may serve as a gate pattern 230.

The gate pattern 230 may include a metal material. For example, the gate pattern 230 may include tungsten (W).

The third insulating interlayer 172 may include silicon oxide. In an exemplary embodiment of the present inventive concept, the third insulating interlayer 172 may include a tetraethyl orthosilicate (TEOS) material.

A second trench 210b may be formed through the first structure and the third insulating interlayer 172, and may extend in a first direction. Therefore, a plurality of first structures may be divided by the second trench 210b. For example, the plurality of first structures may be arranged in the second direction. The base pattern 112 or the base insulation layer 114 may be exposed by a bottom surface of the second trench 210b.

At least one of the gate patterns 230 may serve as one of a ground select line (GSL), word lines, and a string select line (SSL).

A channel hole may be formed through the third insulating interlayer 172 and the first structure, and the channel hole may extend to an upper surface of the base pattern 112. The channel structure 190 may be formed on the channel hole. Thus, the channel structure 190 may contact an upper surface of the base pattern 112.

The memory cell may include the channel structure 190 and the gate pattern 230.

In exemplary embodiments of the present inventive concept, as shown in FIG. 2, the channel structure 190 may include a charge storage structure 180, a channel 182, and an upper conductive pattern 186. The charge storage structure 180 may include a blocking pattern 180c, a charge storage pattern 180b and a tunnel insulation pattern 180a stacked on a sidewall of the channel hole 176a (shown in FIG. 14). The upper conductive pattern 186 may be formed on the channel 182, and may fill an upper portion of the channel hole 176a. The channel 182 and the upper conductive pattern 186 may include polysilicon.

In some exemplary embodiments of the present inventive concept, as shown in FIG. 4B, the channel structure 190 may include a charge storage structure 180, a channel 182, a filling insulation pattern 184, and an upper conductive pattern 186. The channel 182 may have a cylindrical shape. Also, the filling insulation pattern 184 may be formed on the channel 182 to fill the channel hole 176a.

In some exemplary embodiments of the present inventive concept, as shown in FIG. 4C, a channel connection pattern 188 may be further formed on the base pattern to surround an outerwall (e.g., sidewalls) of a lower portion of the channel. Thus, the channel connection pattern 188 may be electrically connected with the neighboring channels 182 and the base pattern 112.

The channel hole 176a may include two bent portions. Therefore, a sidewall of the channel structure 190 formed in the channel hole 176a may include two bent portions b1 and b2.

An upper surface of the channel structure 190 may be coplanar with an upper surface of the third insulating interlayer 172.

Also, a first trench 210a may be formed through the third insulating interlayer 172 and the first structure, and may extend in the first direction. The first trench 210a may be formed in the first structure, so that the first trench 210a may serve as a cutting region of the word line. The base pattern 112 may be exposed by a bottom surface of the first trench 210a.

In an exemplary embodiment of the present inventive concept, a third trench 210c serving as a cutting region of the string select line SSL. The third trench 210c may be formed by etching an uppermost gate pattern and at least one of the gate patterns under the uppermost gate pattern.

A second structure may be formed on the base insulation layer 114 in the through cell wiring region B, and the second structure may have a staircase shape at an edge portion in a first direction. Therefore, the edge portion in the first direction of the second structure may have a different level for each layer. For example, the second structure may have a stepped shape in which a length of each step extends in the first direction, and the steps have a decreasing length as they are spaced further in the vertical direction away from an upper surface of the substrate 100.

The second structure may include a structure in which the first insulation layers 120, the second insulation layers 150, the conductive patterns 230b and the pad pattern 230a are stacked and a structure in which the first insulation layers 120, the second insulation layers 150, a first sacrificial layer 122 and a fourth sacrificial layer 152 are stacked. In other words, a portion of the second structure may have a conductive pattern 230b interposed between the insulation layers, and a remaining portion of the second structure may include only insulating material layers stacked.

A first insulating interlayer 134 and a second insulating interlayer 164 may be formed to cover the second structure. The first insulating interlayer 134 may cover a lower stepped portion of the second structure, and the second insulating interlayer 164 may cover an upper stepped portion of the second structure. The third insulating interlayer 172 may be formed on the second structure.

The first and second structures may be connected to each other, so that the first and second structures may be merged into one body structure (e.g., integrally formed).

The second structure may be divided by the second trench 210b to form a plurality of second structures. In other words, the second trench 210b may extend from the cell area A to the through cell wiring region B in the first direction and the second structures may be spaced apart in a second direction orthogonal to the first direction in a plan view. A trench or an opening may not be included in each of the second structures. In other words, one second structure may be formed per cell block.

The conductive pattern (i.e., the gate pattern 230) of the first structure may extend in the first direction to the second structure. In other words, the gate pattern 230 may be connected to the conductive pattern 230b included in the second structure. The conductive pattern 230b may extend in the second direction to an edge of the second structure adjacent to the second trench 210b.

According to an exemplary embodiment of the present inventive concept, the collective pad pattern 230a may have a rectilinear shape in the through cell wiring region B including two first sides extending in the first direction and second sides extending in the second direction, in a plan view. The conductive pattern 230b may contact one of the first sides of the pad pattern 230a. Inner surfaces of the first sides of the pad pattern 230a may surround first sacrificial patterns 122 and first insulation layers 120 alternately disposed.

Also, the pad pattern 230a may be formed at a stepped portion of the second structure, and the a sidewall of pad pattern 230a may be connected to the conductive pattern 230b. The gate pattern 230 may be electrically connected to the pad pattern 230a via the conductive pattern 230b. Therefore, the gate patterns 230 of the same level may be electrically connected with the conductive pattern 230b and the pad pattern 230a of the same level.

The gate pattern 230, the conductive pattern 230b, and the pad pattern 230a may include substantially the same conductive material.

The pad pattern 230a may further protrude from the conductive pattern in the second direction toward a central portion of the second structure. The pad pattern 230a may serve as a pad for contacting the first contact plug 202a electrically connected with the gate pattern 230 and the circuit pattern.

In an exemplary embodiment of the present inventive concept, a structure including the first insulation layer 120, the second insulation layer 150, and the first sacrificial layers 122 and the fourth sacrificial layers 152 stacked may be below the pad pattern 230a in the vertical direction. Thus, no conductive material may be disposed below the pad pattern 230a in the vertical direction.

In an exemplary embodiment of the present inventive concept, an upper surface of the pad pattern 230a may be higher in the vertical direction than an upper surface of the gate pattern disposed in the same layer to the pad pattern 230, and a thickness of the pad pattern 230a may be greater than a thickness of the gate pattern disposed in the same layer as the pad pattern 230.

A contact hole may pass through the third insulating interlayer 172, the second insulating interlayer 164, the first insulating interlayer 134, the second structure and the base insulation layer 114, and the contact hole may extend to an upper portion of the lower insulating interlayer 110 (e.g., partially penetrate therethrough). An upper surface of the lower pad 108a may be exposed by a bottom surface of the first contact hole 200a. A first contact plug 202a may be formed in the first contact hole 200a.

Sidewalls of the first contact plug 202a may contact the pad pattern 230a (e.g., penetrate ends of the stepped portion of the second structure on which the pad pattern 230a is disposed), and a bottom surface of the first contact plug 202a may contact the upper surface of the lower pad 108a. Thus, at least one of the gate patterns 230 and the peripheral circuits may be electrically connected by the first contact plug 202a.

In an exemplary embodiment of the present inventive concept, the first contact plug 202a may include a metal. The first contact plug 202a may include a metal such as W, copper (Cu), aluminum (Al), or the like. For example, the first contact plug 202a may include a barrier metal pattern and/or a metal pattern.

The first contact hole 200a may include two bent portions. Therefore, a sidewall of the first contact plug 202a formed in the first contact hole 200a may include two bent portions b1 and b2. For example, the two bent portions b1 and b2 may each have a tapered shape that narrows in a vertical direction towards the upper surface of the substrate 100. The narrowed end of the bent portion b2 may be disposed on a widest portion of the bent portion b1.

An upper surface of the first contact plug 202a may be coplanar with an upper surface of the third insulating interlayer 172.

A third structure including the first insulation layer 120, the first sacrificial layer 122, the second insulation layer 150 and the fourth sacrificial layer 152 stacked may be formed on the base insulation layer 114 in the through wiring region C. The third structure may include a second lower mold structure 132 and a second upper mold structure 162. In an exemplary embodiment of the present inventive concept, the third structure may have no conductive material.

The third insulating interlayer 172 may be formed to cover the third structure.

In other words, the third insulating interlayer 172 may be formed on the first to third structures.

A second contact hole 200b may be formed through the third insulating interlayer 172, the third structure and the base insulation layer 114, and the second contact hole 200b may extend to an upper portion of the lower insulating interlayer 110. An upper surface of the lower pad 108a may be exposed by a bottom surface of the second contact hole 200b. A second contact plug 202b may be formed in the second contact hole 200b.

A sidewall of the second contact plug 202b may not contact a conductive material, and a bottom surface of the second contact plug 202b may contact the upper surface of the lower pad 108a. Thus, the second contact plug 202b may be electrically connected to the peripheral circuits.

In an exemplary embodiment of the present inventive concept, the second contact plug 202b may include a metal substantially the same as a metal of the first contact plug 202a.

The second contact hole 200b may include two bent portions. Therefore, a sidewall of the second contact plug 202b formed in the second contact hole 200b may include two bent portions b1 and b2. According to an exemplary embodiment of the present inventive concept, the shape of the bent portions b1 and b2 may be substantially the same as the bent portions b1 and b2 described in reference to the second structure.

An upper surface of the second contact plug 202b may be coplanar with an upper surface of the third insulating interlayer 172.

In an exemplary embodiment of the present inventive concept, the upper surfaces of the channel structure 190, the first contact plug 202a and the second contact plug 202b may be coplanar with each other.

The first bent portions b1 disposed at lower portions of the channel structure 190 of the first contact plug 202a and the second contact plug 202b may be coplanar with each other. Also, the second bent portions b2 disposed at upper portions of the channel structure 190 of the first contact plug 202a and the second contact plug 202b may be coplanar with each other.

In an exemplary embodiment of the present inventive concept, an insulation pattern 232 may be formed in the first and second trenches 210a and 210b.

A fourth insulating interlayer 240 may be formed on the channel structure 190, the first contact plug 202a, the second contact plug 202b, the insulation pattern 232 and the third insulating interlayer 172.

A first upper contact 242 may be formed through the fourth insulating interlayer 240 to contact the upper conductive pattern 186 of the channel structure 190. A second upper contact 254 may be formed through the fourth insulating interlayer 240 to contact the second contact plug 202b.

Also, a first upper wiring 244 may be electrically connected to the first upper contact 242, and a second upper wiring 256 may be electrically connected to the second upper contact 254 may be formed on the fourth insulating interlayer 240. The first upper wiring 244 may serve as a bit line.

In an exemplary embodiment of the present inventive concept, an additional upper wiring may not be formed on the first contact plug 202a.

In an exemplary embodiment of the present inventive concept, a SSL contact 250 may be further formed through the fourth insulating interlayer 240, the third insulating interlayer 172 and the second insulating interlayer 164 to contact the gate pattern 230. In addition, a third upper wiring 252 may be further formed to contact the SSL contact 250.

In an exemplary embodiment of the present inventive concept, a fifth insulating interlayer may be further formed to cover the first upper wiring 244, the second upper wiring 256 and the third upper wiring 252.

FIGS. 5, 6, 7, 8, 9, 10, 11, 12, 13, 14, 15, 16, 17, 18, 19, 20, 21, 22, 23 and 24 are plan views and cross-sectional views illustrating stages of a method of manufacturing the vertical memory device in accordance with an exemplary embodiment of the present inventive concept.

Figure 17:
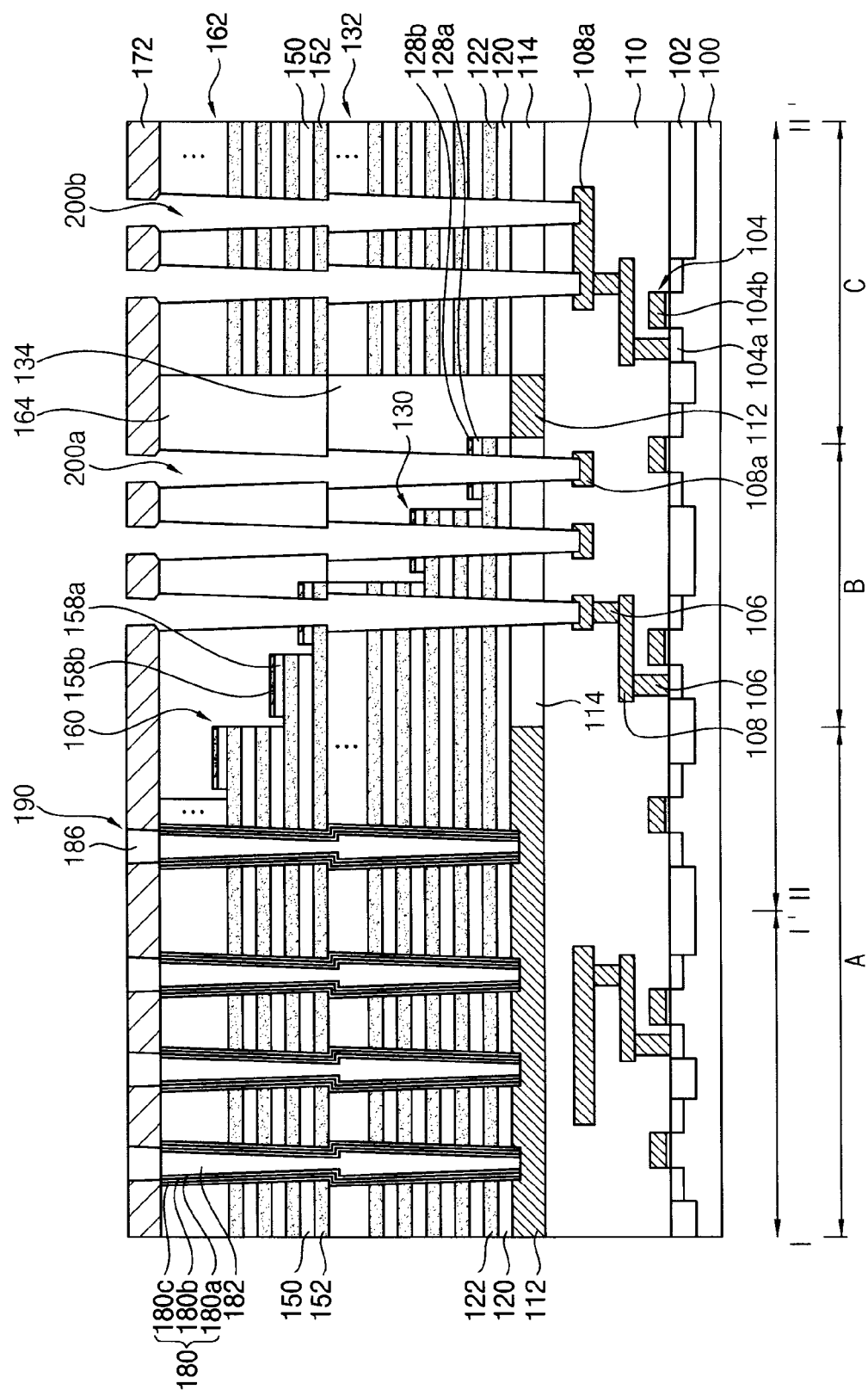
Figure 18:
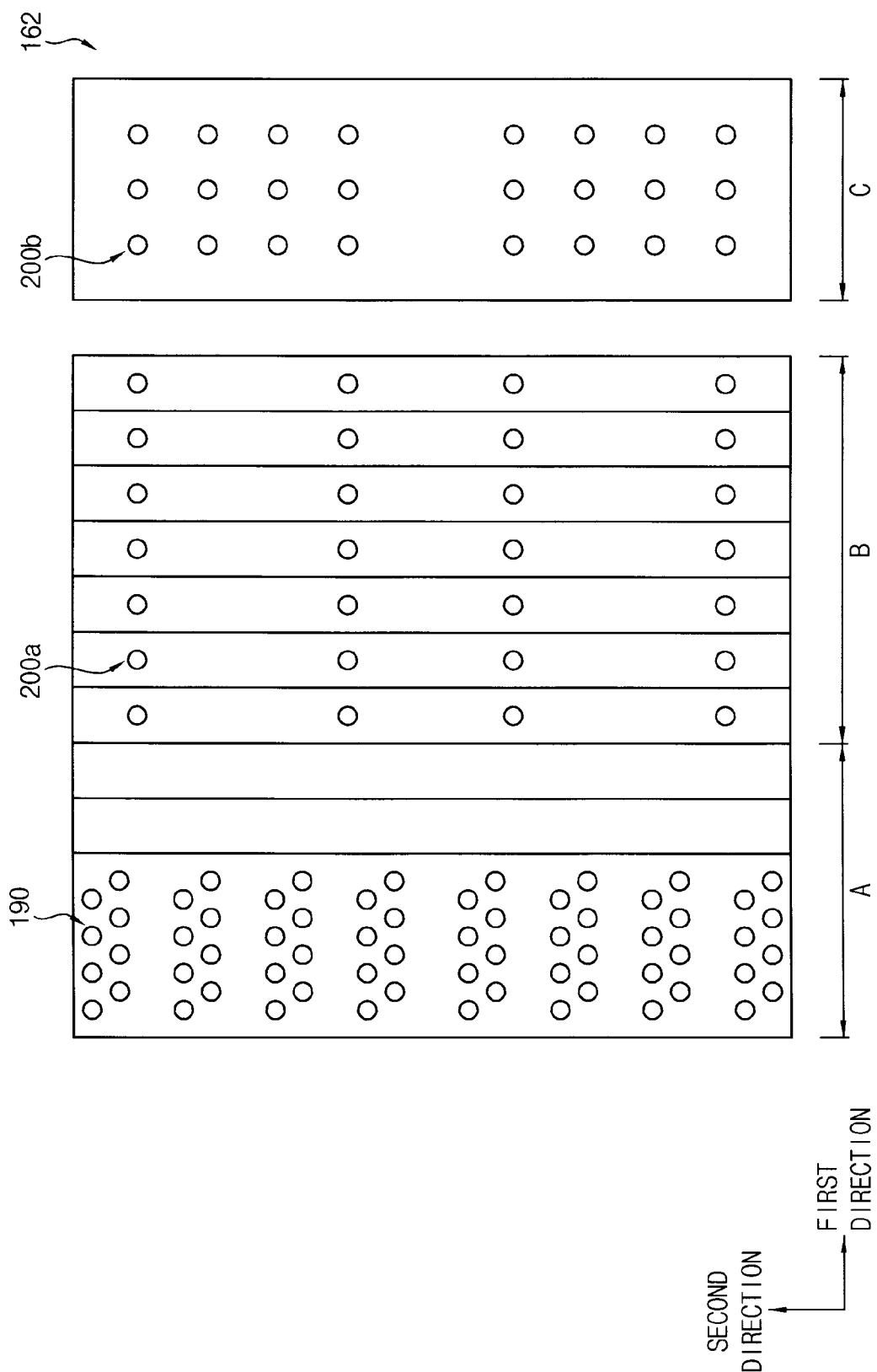
Figure 19:
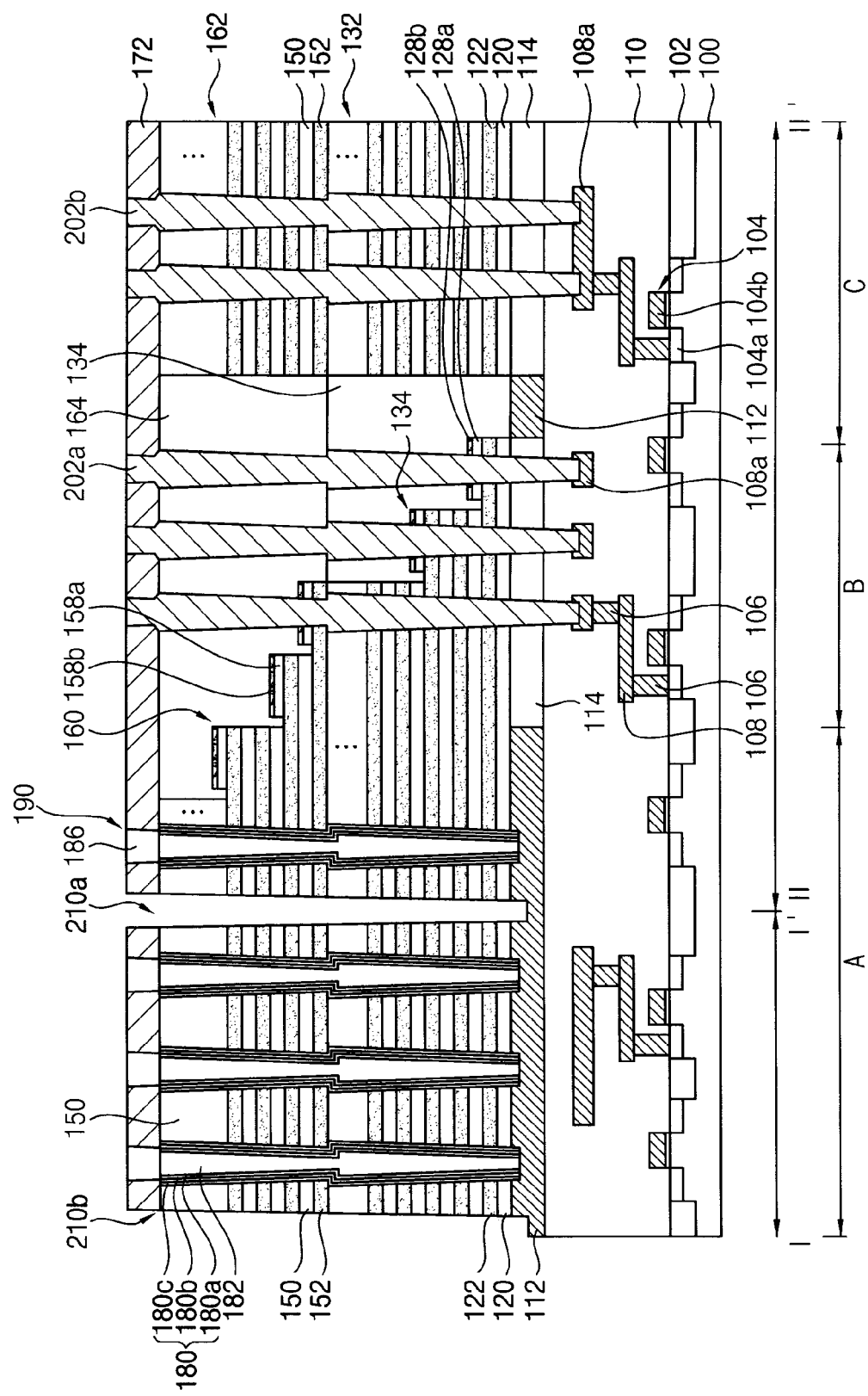
Figure 20:
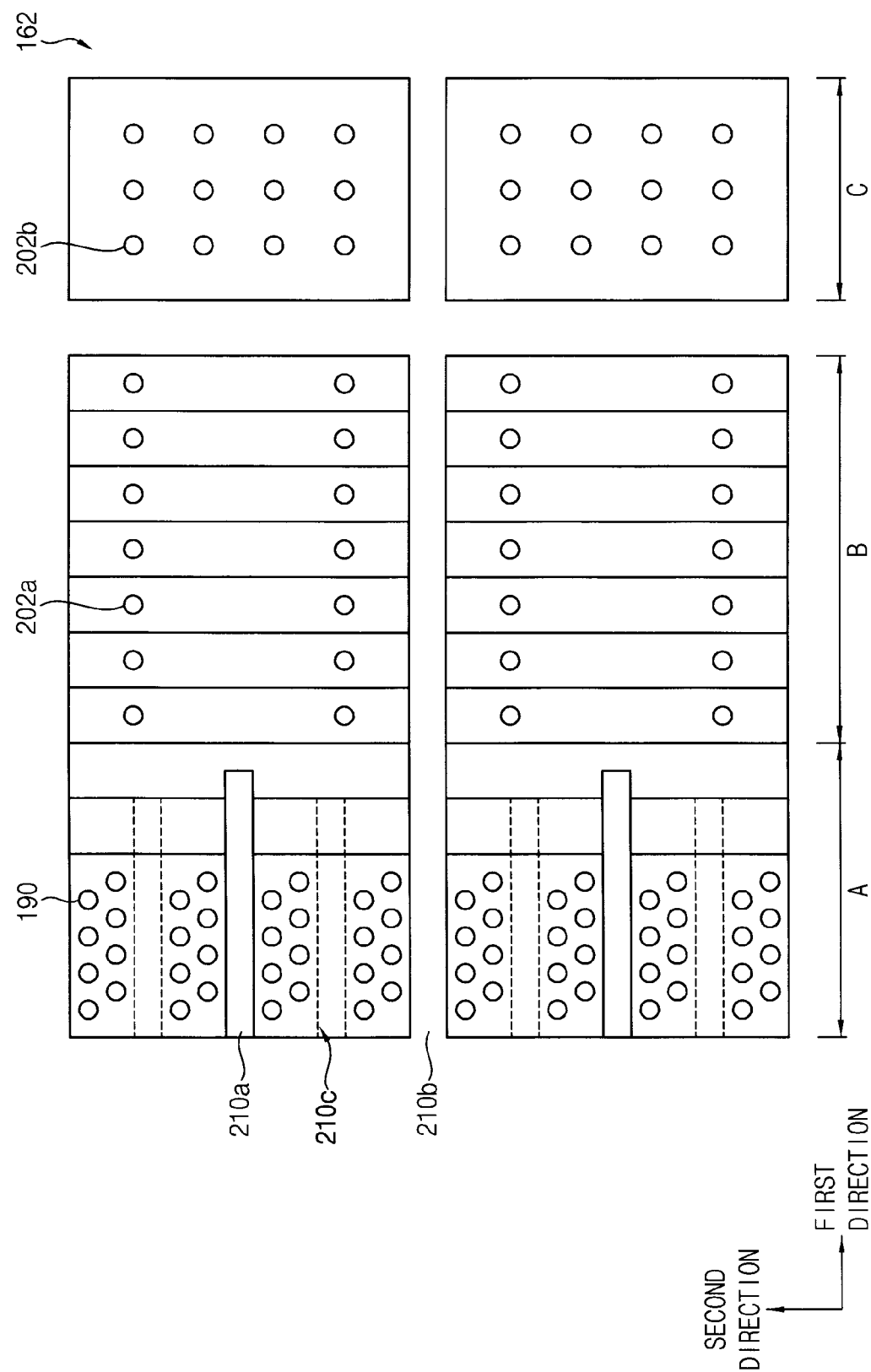
Figure 21:
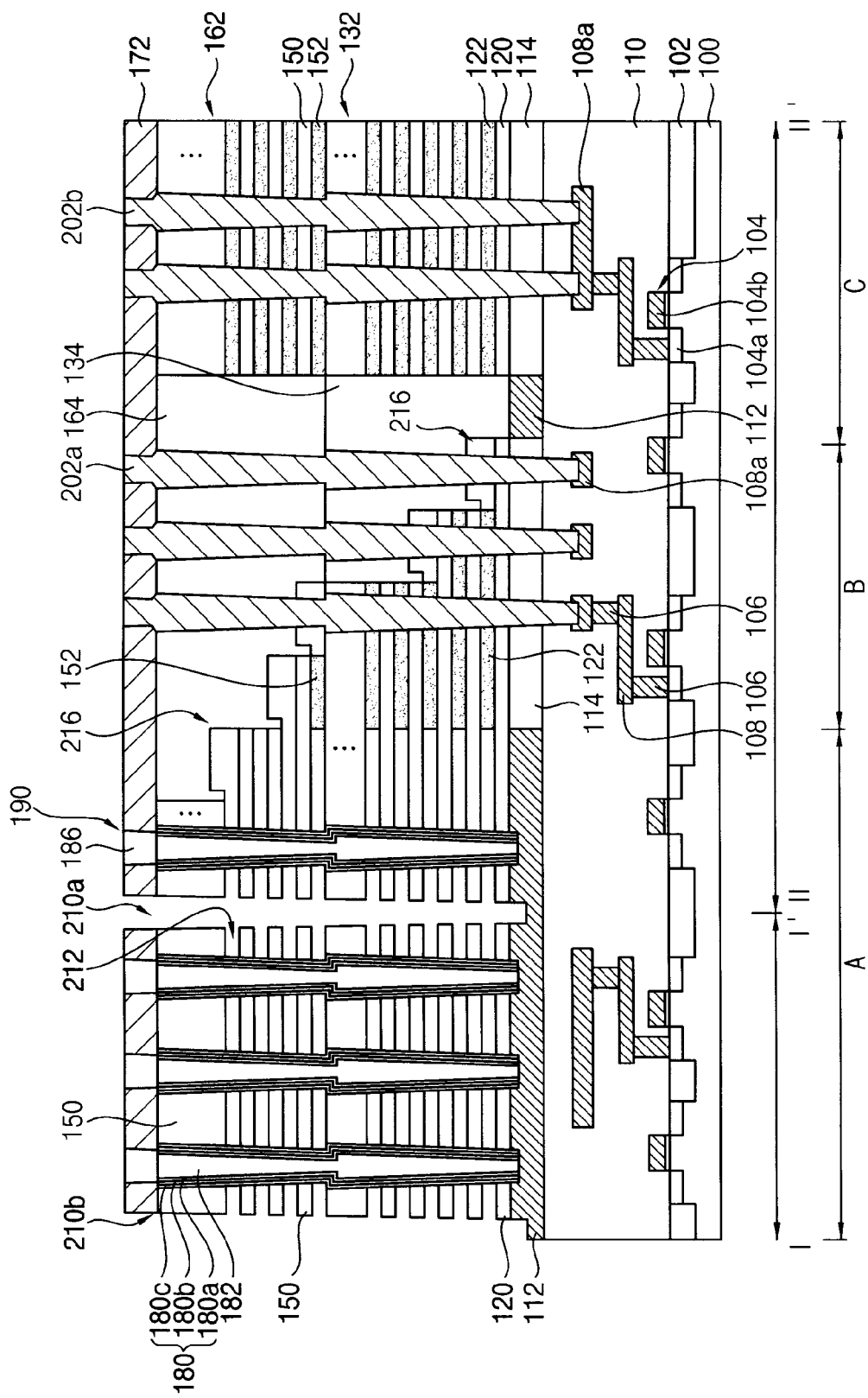
Figure 22:
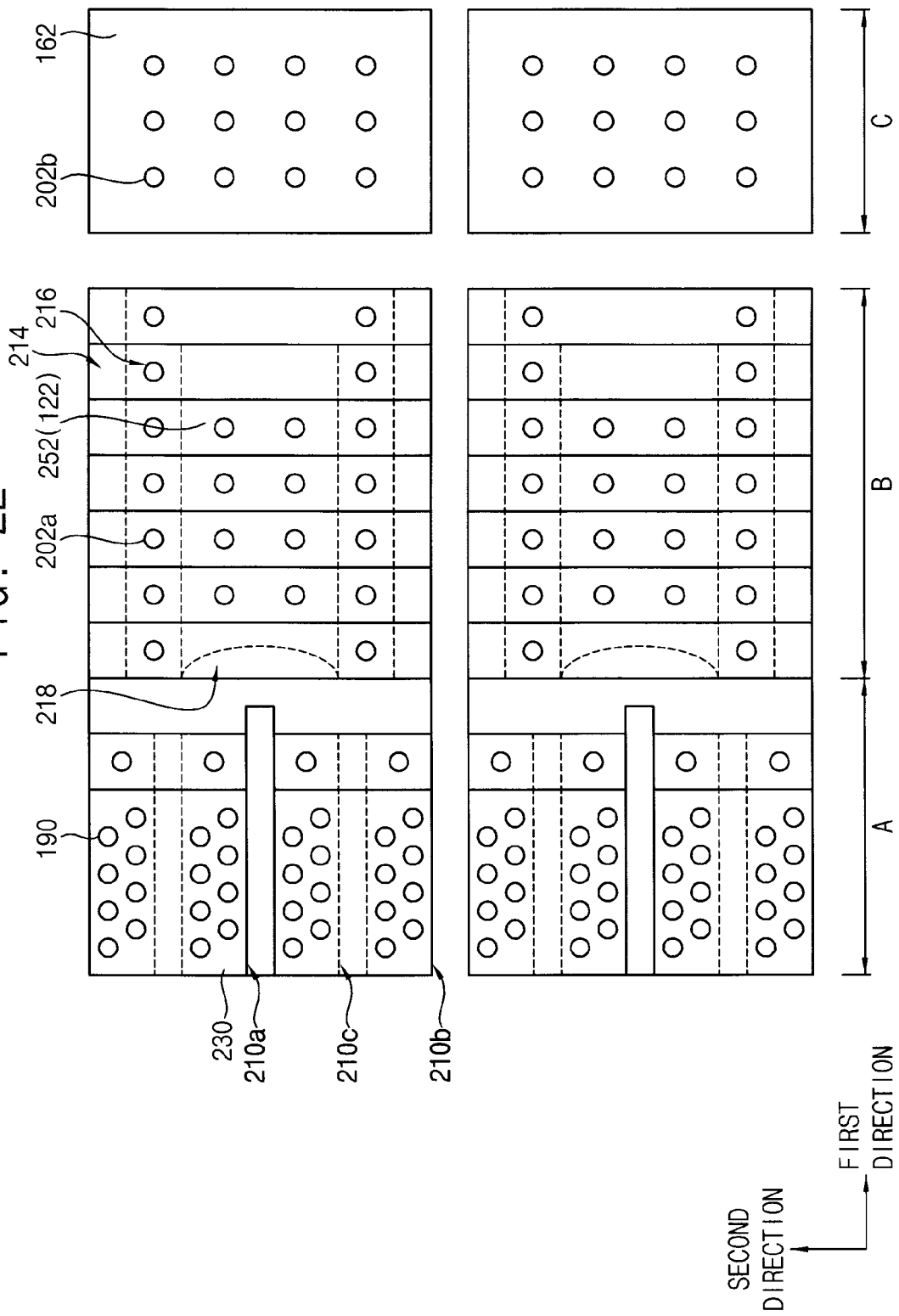

FIGS. 18, 20 and 22 are plan views. FIGS. 5, 6, 7, 8, 8, 10, 11, 12, 13, 14, 15, 16, 17, 19, 21, 23 and 24 are cross-sectional views taken along line I-I' and of FIG. 1.

Figure 5:
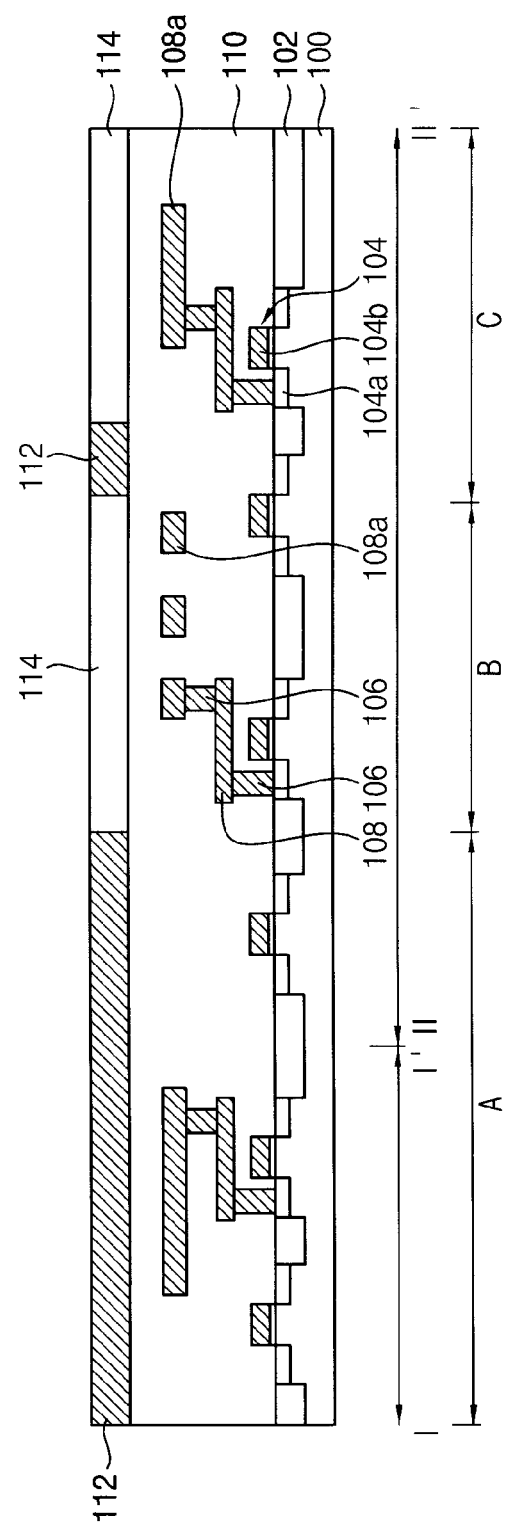
FIGS. 5, 6, 7, 8, 9, 10, 11, 12, 13, 14, 15, 16, 17, 18, 19, 20, 21, 22, 23 and 24 are plan views and cross-sectional views illustrating stages of a method of manufacturing the vertical memory device in accordance with an exemplary embodiment of the present inventive concept.

Referring to FIG. 5, a circuit pattern constituting a peripheral circuit may be formed on the substrate 100, and the lower insulating interlayer 110 may be formed to cover the circuit pattern. The substrate 100 may include the cell region A, the through cell wiring region B, and the through wiring region C.

A trench isolation process may be performed on the substrate 100 to form a field region having an isolation pattern 102 and an active region having no isolation pattern.

The circuit pattern may include lower transistors 104, lower contact plugs 106, lower wirings 108, or the like. Each of the lower transistors 104 may include the gate structure 104*b* and the impurity regions 104*a*. The lower contact plugs 106 may be formed to contact the gate structure 104*b* and/or the impurity region 104*a*. For example, a first lower contact plug 106 may have a lower surface that contacts the gate structure 104*b* or the impurity region 104*a*, and an upper surface that contacts the lower wirings 108 or the lower pad 108*a*. The lower wirings 108 may be electrically connected to the lower contact plugs 106.

Some of the lower wirings 108 may serve as the lower pad 108*a* for contacting first and second contact plugs subsequently described. In an exemplary embodiment of the present inventive concept, the lower contact plugs 106 and the lower wirings 108 may be formed to have multiple layers.

Base patterns 112 may be formed on the lower insulating interlayer 110. The base pattern 112 may include, e.g., polysilicon and/or silicon. The base patterns 112 may be etched or otherwise processed to produce gaps between remaining segments. Also, a base insulation layer 114 may be formed on the lower insulating interlayer 110 to fill a space between the base patterns 112. In an exemplary embodiment of the present inventive concept, upper surfaces of the base pattern 112 and the base insulation layer 114 may be coplanar with each other. According to an exemplary embodiment of the present inventive concept, the base insulation layer 114 may be disposed on the lower insulating layer 110 prior to forming the base pattern 112, and the base pattern 112 may be disposed in etched spaces between remaining segments of the base insulation layer 114. A first base pattern 112 may be disposed under the eventual first structure in the cell region A and the second base pattern 112 may be disposed at an edge portion of the wiring region C.

A plurality of base insulation layers 114 may be formed at portions for forming the first and second contact plugs, respectively.

Figure 6:
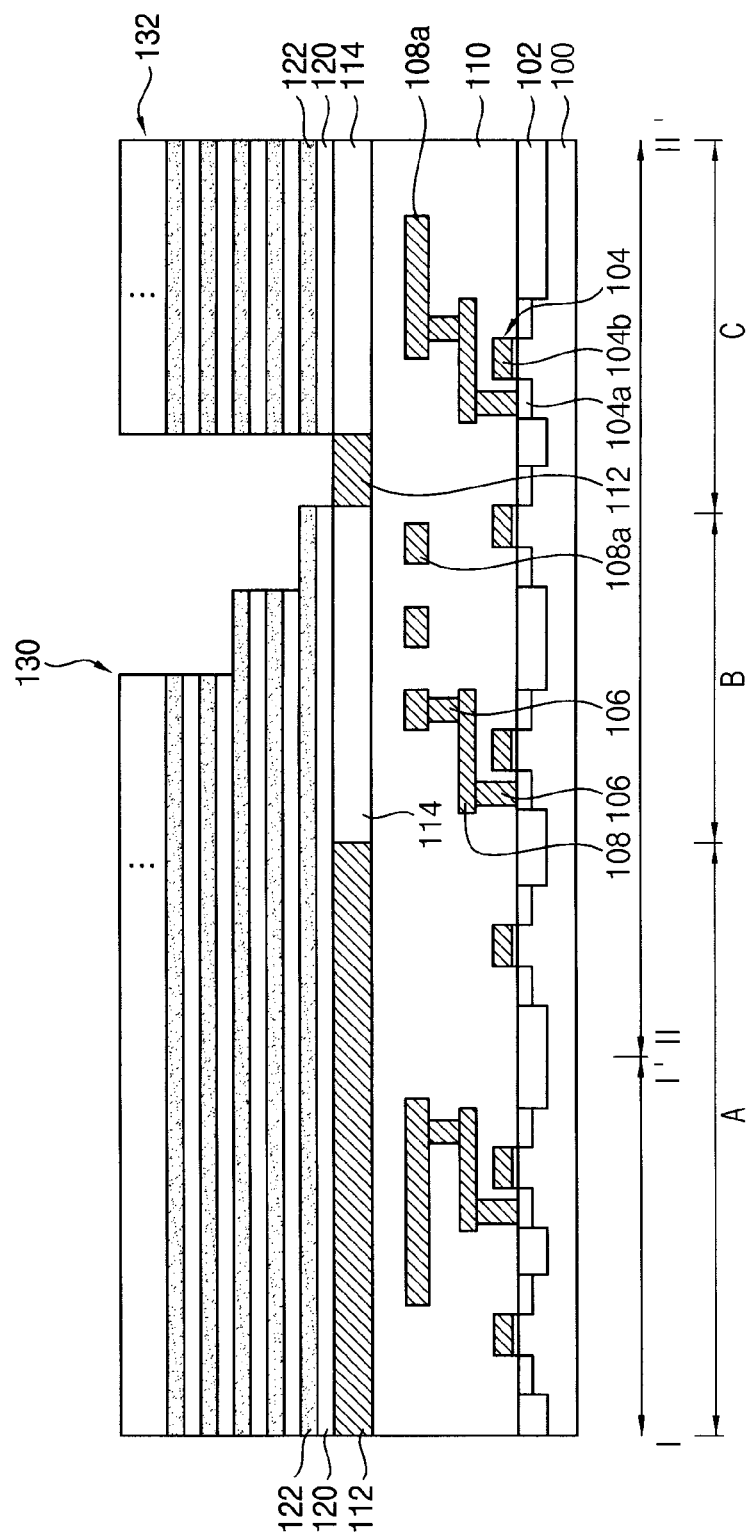

Referring to FIG. 6, the first insulation layers 120 and the first sacrificial layers 122 may be alternately and repeatedly stacked on the base pattern 112 and the base insulation layer 114. The first insulation layer 120 may include, for example, silicon oxide. The first sacrificial layer 122 may include a material having an etch selectivity with respect to the first insulation layer 120. The first sacrificial layer 122 may include a nitride such as silicon nitride.

A structure including the first insulation layers 120 and the first sacrificial layers 122 repeatedly stacked may be patterned to form the first lower mold structure 130 having a staircase shape (e.g., a stepped shape) at an edge portion thereof. A lowermost step of the staircase shape may be aligned with an outer surface of a remaining portion of the base pattern 112 in the vertical direction. Also, the second lower mold structure 132 may be formed adjacent to the first lower mold structure 130. The second lower mold structure 132 may not have a staircase shape at an edge portion thereof. For example, a sidewall of the second lower mold structure 132 may have a vertical slope.

The first lower mold structure 130 may be formed on the cell region A and the through cell wiring region B of the substrate 100. A stepped portion of the first lower mold structure 130 may be formed on the through cell wiring region B. The second lower mold structure may be formed on the through wiring region C.

In an exemplary embodiment of the present inventive concept, the first sacrificial layer 122 may be exposed by an upper surface of each stepped portion of the first lower mold structure 130. For example, the upper surface of each stepped portion may be an end portion of a corresponding first sacrificial layer 122.

Figure 7:
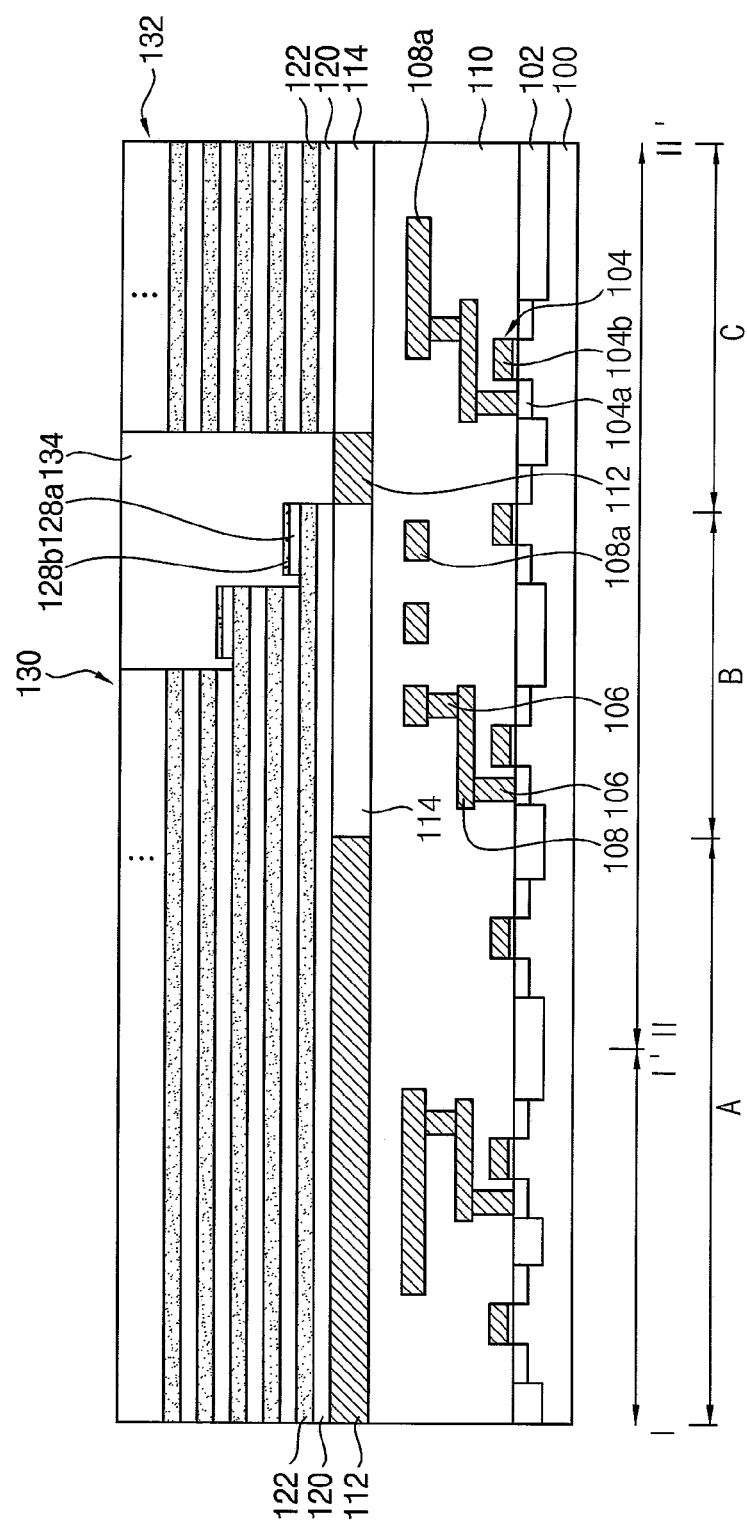

Referring to FIG. 7, a second sacrificial layer 128*a* may be conformally formed on the surface of the first lower mold structure 130. The second sacrificial layer 128*a* may include silicon nitride-based material similar to the material of the first sacrificial layer 122, but the second sacrificial layer 128*a* may have an etching rate higher than an etching rate of the first sacrificial layer 122.

A plasma surface treatment process may be performed on the surface of the second sacrificial layer 128*a*. As the plasma is injected onto the surface of the second sacrificial layer 128*a*, plasma damage may occur on a flat upper surface portion of the second sacrificial layer 128*a*. In this case, the plasma damage may hardly occur on the second sacrificial layer formed on the sidewall of the stepped portion. Herein after, the plasma treated portion of the second sacrificial layer 128*a* may also be referred to as a third sacrificial pattern 128*b*.

The third sacrificial pattern 128*b* may have a density higher than a density of the second sacrificial layer 128*a*, and the third sacrificial pattern 128*b* may have an impurity concentration higher than an impurity concentration of the second sacrificial layer 128*a*. Therefore, the third sacrificial pattern 128*b* may have an etching rate lower than that of the second sacrificial layer 128*a*.

Then, a second sacrificial layer 128*a* formed on the sidewall of the stepped portion of the first lower mold structure 130 may be selectively etched to form a second sacrificial pattern 128*a*. The etching process may include a wet etching process. In this case, the third sacrificial pattern 128*b* may be used as an etching mask in the wet etching process. Thus, a structure including the second sacrificial pattern 128*a* and the third sacrificial pattern 128*b* stacked may be formed on the first sacrificial layer 122 formed on the stepped portion (i.e., an exposed edge portion) of the first lower mold structure 130.

In an exemplary embodiment of the present inventive concept, the first sacrificial layer 122 may have a first etching rate, the second sacrificial pattern 128*a* may have a second etching rate higher than the first etching rate, and the third sacrificial pattern 128*b* may have a third etching rate lower than the second etching rate. Also, the third etching rate may be lower than the first etching rate.

An insulation layer may be formed to cover an edge portion of the first lower mold structure 130, and an upper surface of the insulation layer may be planarized to form a first insulating interlayer 134. In an exemplary embodiment of the present inventive concept, upper surfaces of the first lower mold structure 130, the first insulating interlayer 134 and the second lower mold structure 132 may be coplanar with each other. In addition, the first insulating interlayer 134 may form a complementary shape to the stepped structure of the first lower mold structure 130.

Figure 8:
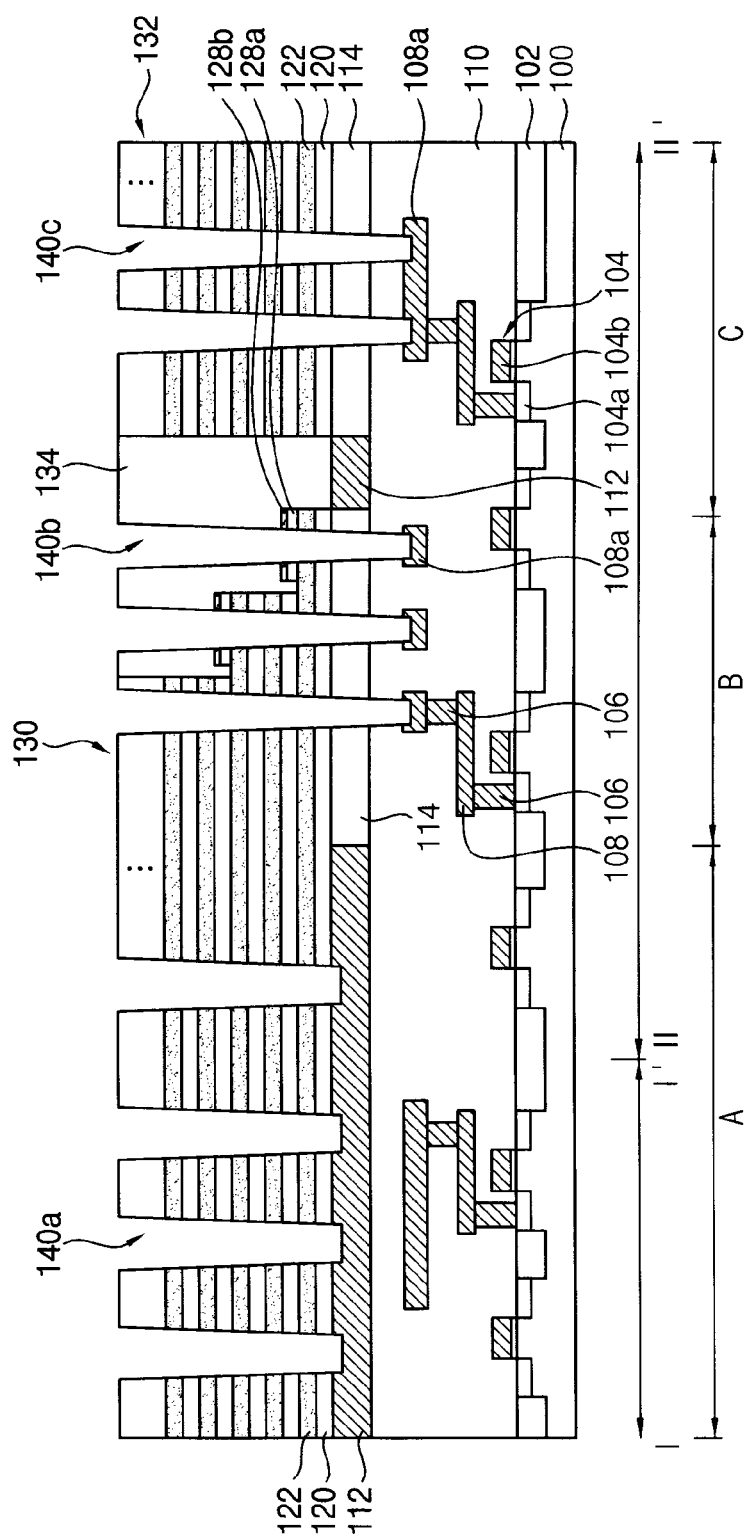

Referring to FIG. 8, the first insulating interlayer 134, the first lower mold structure 130, the second sacrificial patterns 128*a* and the third sacrificial patterns 128*b*, the second lower mold structure 132, the base insulation layer 114 and the lower insulating interlayer 110 may be partially etched to form first channel holes 140*a*, first through holes 140*b* and second through holes 140*c*.

The first channel hole 140*a* may be formed through the first lower mold structure 130 on the cell region A. An upper surface of the base pattern 112 may be exposed by a bottom surface of the first channel hole 140*a*.

The first through hole 140b may pass through the first insulating interlayer 134, the first lower mold structure 130, the second sacrificial patterns 128a and the third sacrificial patterns 128b and the base insulation layer 114 on the through cell wiring region B. Further, an upper portion of the lower insulating interlayer 110 may be partially etched to expose an upper surface of the lower pad 108a by the first through hole 140b. Some of first through holes 140b may pass through portions of the second and third sacrificial patterns 128a and 128b in the through cell wiring region B. Thus, side surfaces of the second sacrificial patterns 128a and the third sacrificial patterns 128b may be exposed by a sidewall of the first through hole 140b. Also, some of the first through holes 140b may pass through only the first lower mold structure 130.

The second through hole 140c may pass through the second lower mold structure 132 and the base insulation layer 114 on the through wiring region C. Further, an upper portion of the lower insulating interlayer 110 may be partially etched to expose the upper surface of the lower pad 108a by the second through hole 140c.

The first channel holes 140a, the first through holes 140b, and the second through holes 140c may be formed together by one etching process. The etching process may include an anisotropic etching process.

Figure 9:
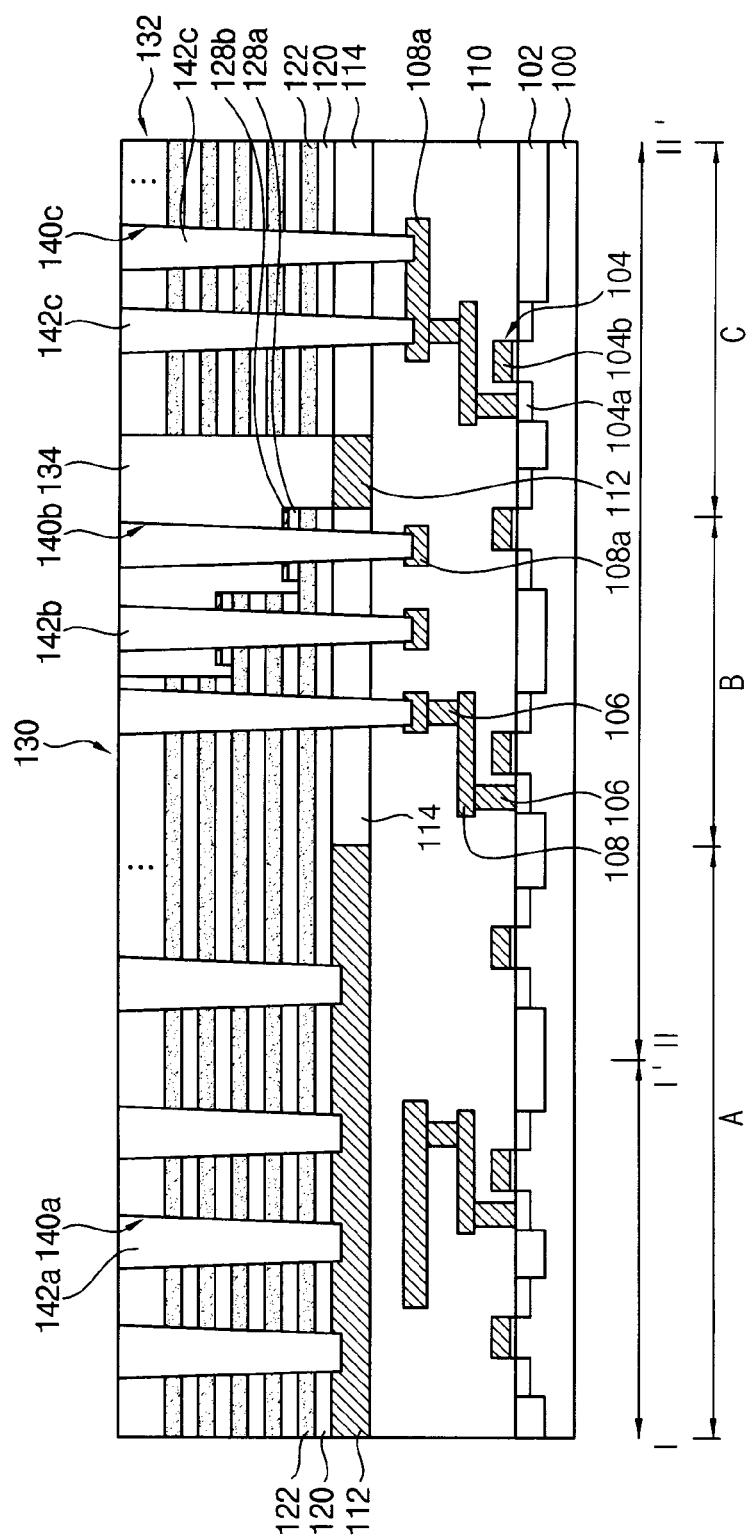

Referring to FIG. 9, a filling layer may be formed to fill the first channel holes 140a, the first through holes 140b and second through holes 140c, and the filling layer may be planarized until upper surfaces of the first insulating interlayer, the first lower mold structure 130 and the second lower mold structure 132 may be exposed. Thus, a first filling pattern 142a may be formed in each of the first channel holes 140a, a second filling pattern 142b may be formed in each of the first through holes 140b, and a third filling pattern 142c may be formed in each of the second through holes 140c.

The first filling patterns 142a, the second filling patterns 142b, and the third filling patterns 142c may include a material having a high etching selectivity with respect to each of the first sacrificial layer 122 and the first insulation layer 120. In some exemplary embodiments of the present inventive concept, the first filling patterns 142a, the second filling patterns 142b, and the third filling patterns 142c may include polysilicon.

Figure 10:
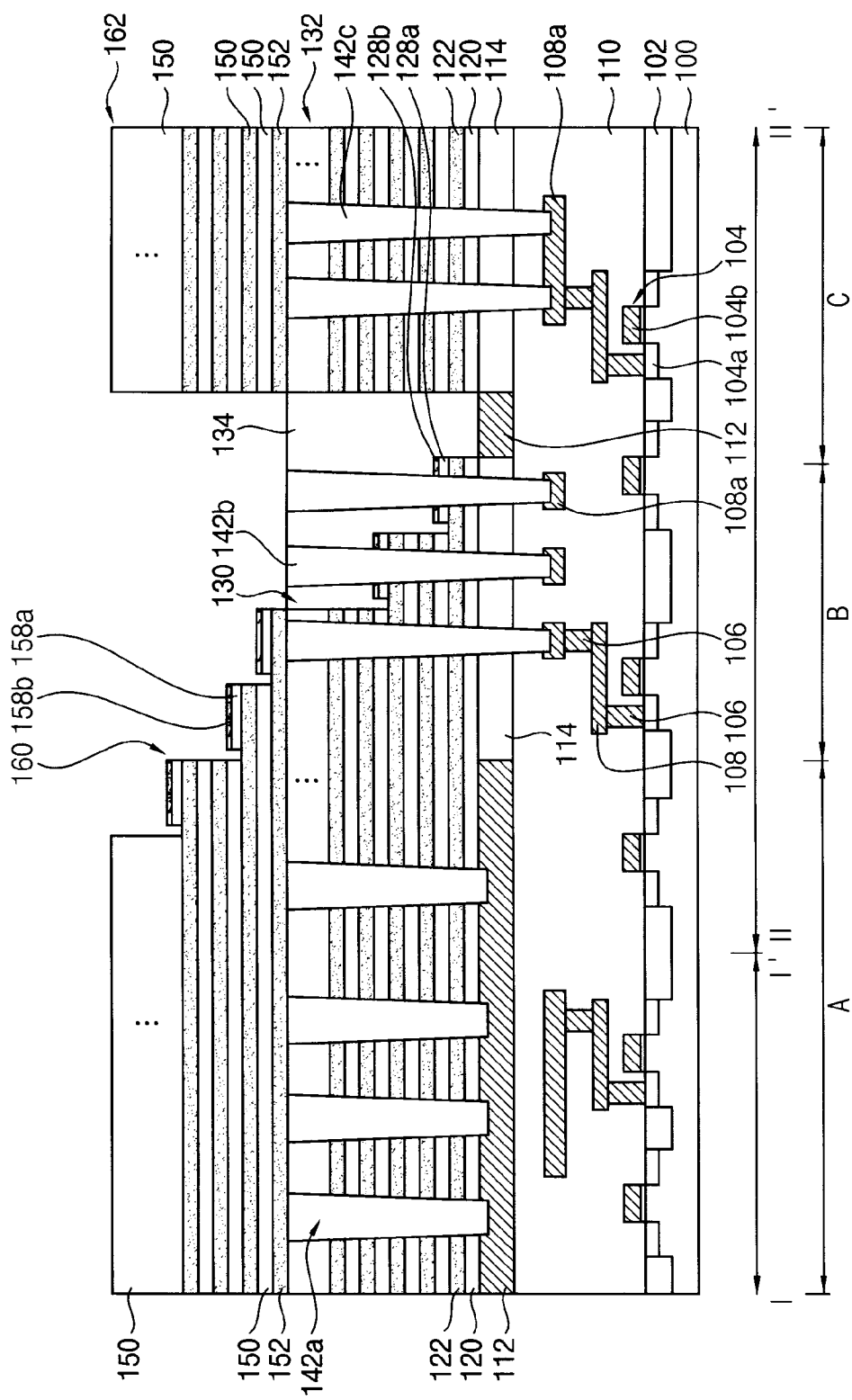

Referring to FIG. 10, a first upper mold structure 160 and a second upper mold structure 162 may be formed on the first insulating interlayer 134, the first lower mold structure 130, the second lower mold structure 132 and the first filling patterns 142a, the second filling patterns 142b, and the third filling patterns 142c.

Particularly, second insulation layers and fourth sacrificial layers may be alternately and repeatedly stacked on the first insulating interlayer 134, the first lower mold structure 130, the second lower mold structure 132 and the first filling patterns 142a, the second filling patterns 142b, and the third filling patterns 142c. The second insulation layers 150 and fourth sacrificial layers 152 may be patterned to form the first upper mold structure 160 and the second upper mold structure 162.

The first upper mold structure 160 may be formed on the first lower mold structure 130. An edge of the first upper mold structure 160 may have a staircase shape (e.g., a stepped shape) connected to the stepped portion of the edge of the first lower mold structure 130. For example, an edge of the first upper mold structure 160 may be aligned with an edge of the first lower mold structure 130.

Then, a fifth sacrificial pattern 158a and a sixth sacrificial pattern 158b are stacked on the fourth sacrificial layer 152 at the edge of the first upper mold structure 160. The process for forming the fifth and sixth sacrificial patterns 158a and 158b may be substantially the same as that illustrated with reference to FIG. 7 in forming the second sacrificial pattern 128a and the third sacrificial pattern 158b.

Figure 11:
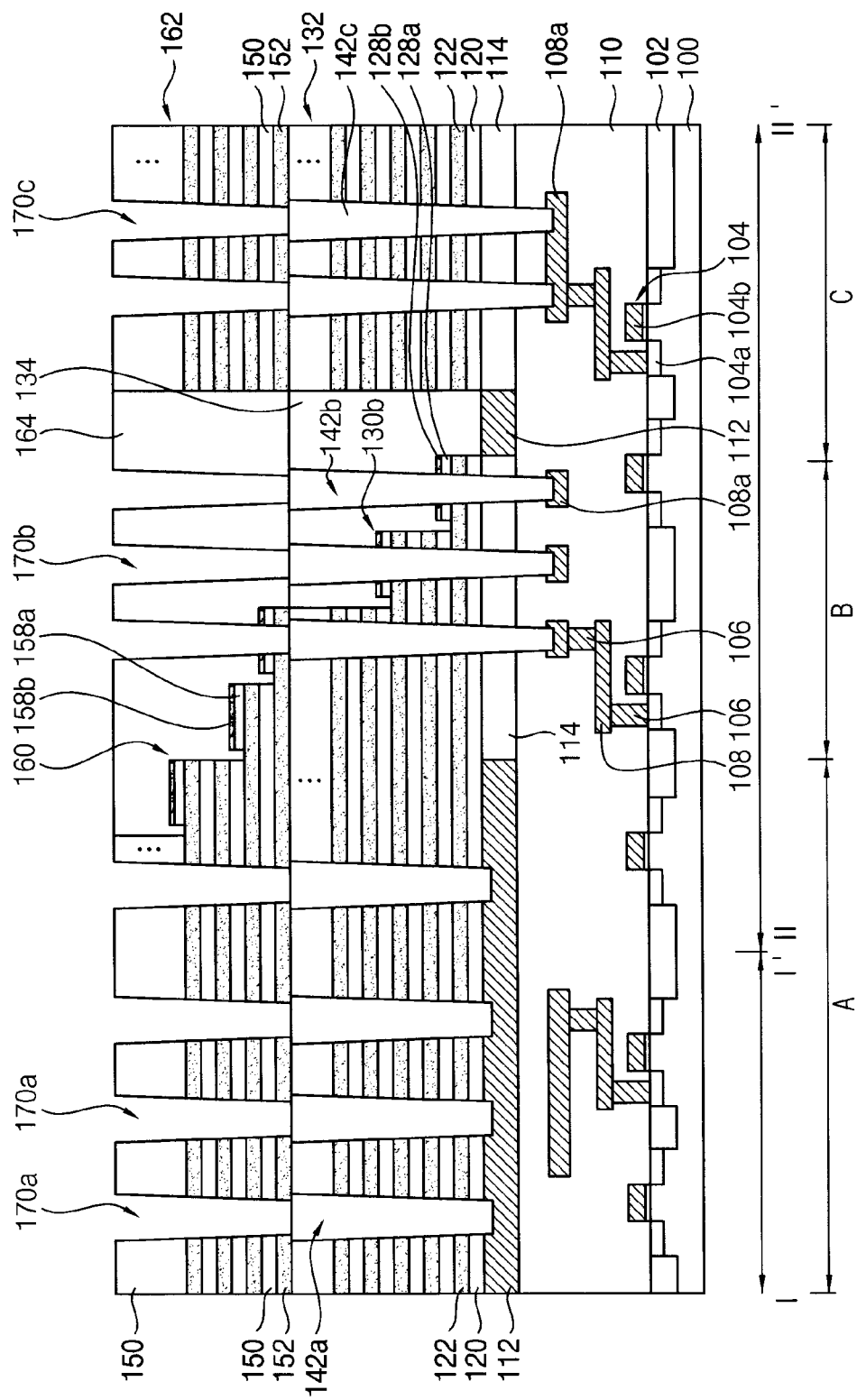

Referring to FIG. 11, an insulation layer may be formed to cover the edge portion of the first upper mold structure 160, and the insulation layer may be planarized to form the second insulating interlayer 164. In an exemplary embodiment of the present inventive concept, upper surfaces of the first upper mold structure 160, the second insulating interlayer 164, and the second upper mold structure 162 may be coplanar with each other.

The second insulating interlayer 164, the first upper mold structure 160, the fifth sacrificial patterns and 158a and the sixth sacrificial patterns 158b and the second upper mold structure 162 may be partially etched to form second channel holes 170a, the third through holes 170b and the fourth through holes 170c.

The second channel hole 170a may be formed through the first upper mold structure 160 on the cell region A. An upper surface of the first filling pattern 142a may be exposed by a bottom surface of the second channel hole 170a.

The third through hole 170b may be formed through the second insulating interlayer 164, the first upper mold structure 160 and the fifth sacrificial patterns 158a and the sixth sacrificial patterns 158b on the through cell wiring region B. Some of the third through holes 170b may pass through only the second insulating interlayer 164. An upper surface of the second filling pattern 142b may be exposed by a bottom surface of the third through hole 170b.

The fourth through hole 170c may be formed through the second upper mold structure 162 on the through wiring region C. An upper surface of the third filling pattern 142c may be exposed on a bottom surface of the fourth through hole 170c.

The second channel holes 170a, the third through holes 170b and the fourth through holes 170c may be formed together by one etching process. The etching process may include, for example, an anisotropic etching process.

Figure 12:
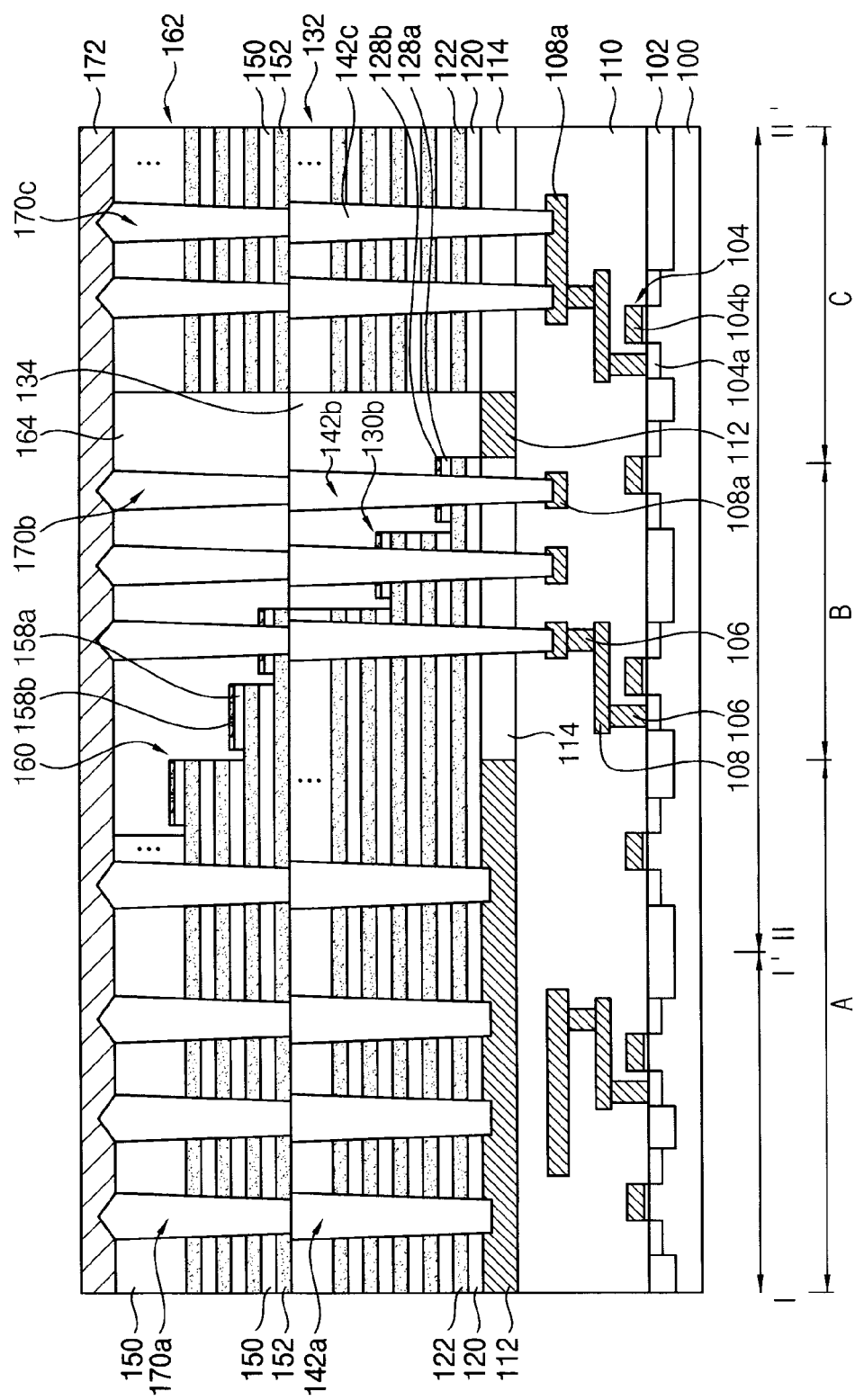

Referring to FIG. 12, a third insulating interlayer 172 may be formed to cover the first upper mold structure 160, the second upper mold structure 162 and the second insulating interlayer 164. The third insulating interlayer 172 may be formed so as not to fill the second channel holes 170a, the third through holes 170b and the fourth through holes 170c. Therefore, inner spaces of the second channel holes 170a, the third through holes 170b and the fourth through holes 170c may be maintained under the third insulating interlayer 172.

The third insulating interlayer 172 may include silicon oxide. The third insulating interlayer 172 may be formed by a deposition process having poor step coverage properties. For example, the third insulating interlayer 172 may be formed by a chemical vapor deposition process. In an exemplary embodiment of the present inventive concept, the third insulating interlayer 172 may include TEOS material.

Figure 13:
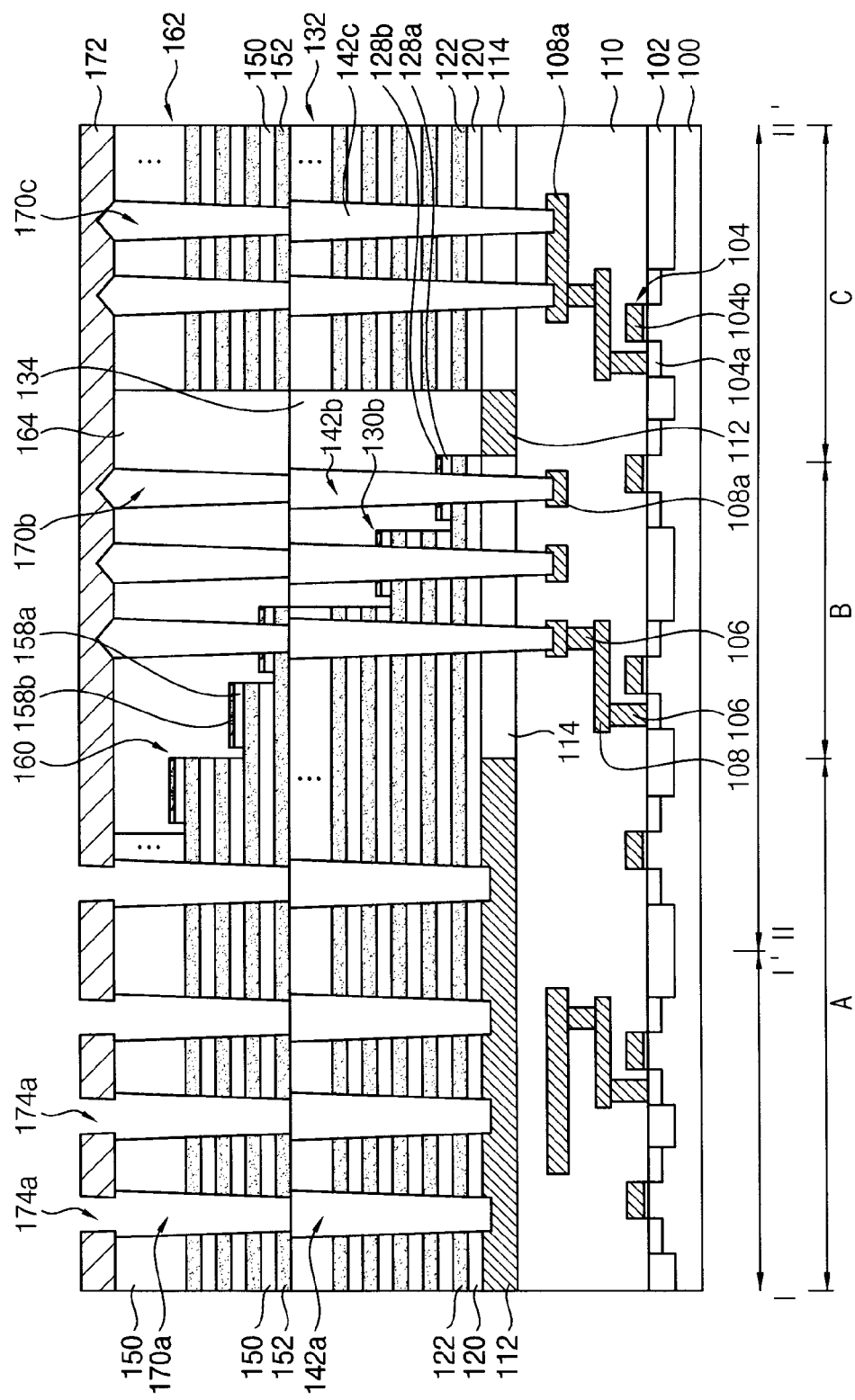

Referring to FIG. 13, the third insulating interlayer 172 on the cell region A may be etched to form a first upper hole 174a connected to the second channel hole 170a. Therefore, an upper surface of the first filling pattern 142a may be exposed by the first upper hole 174a and the second channel hole 170a. In an exemplary embodiment of the present inventive concept, a sidewall of a portion between the first upper hole 174*a* and the second channel hole 170*a* may have a bent shape.

In this case, upper portions of the third through holes 170*b* and the fourth through holes 170*c* may be covered by the third insulating interlayer 172.

Figure 14:
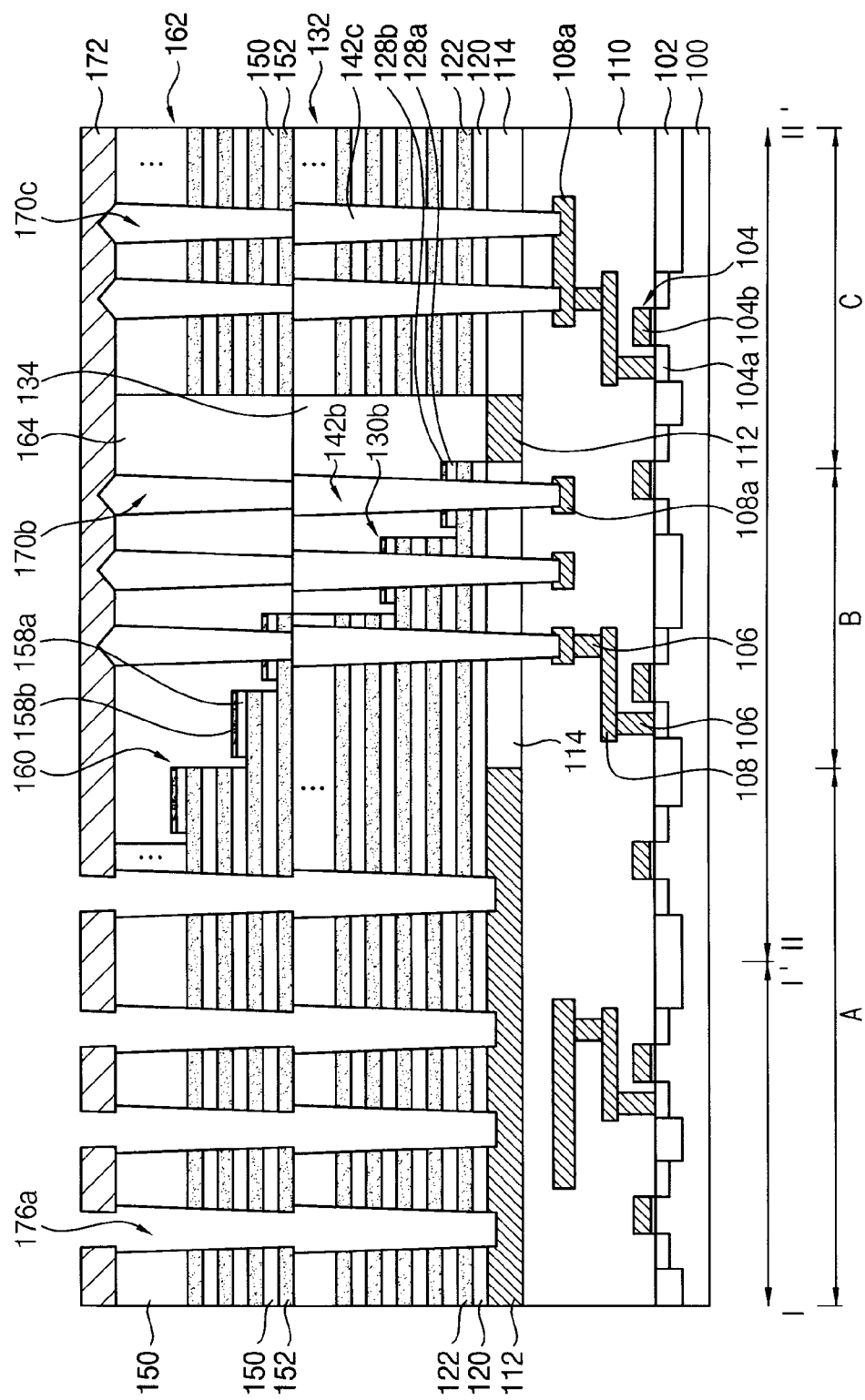

Referring to FIG. 14, the first filling pattern 142*a* exposed by the first upper hole 174*a* and the second channel hole 170*a* may be removed. The removal process may include, for example, an isotropic etching process.

Thus, the first upper hole 174*a*, the second channel hole 170*a* and the first channel hole 140*a* may be connected with each other in the vertical direction to form one channel hole 176*a*. In the channel hole 176*a*, the sidewall of the portion between the first upper hole 174*a* and the second channel hole 170*a* and a sidewall of a portion between the second channel hole 170*a* and the first channel hole 140*a* may be have bent portions, respectively. In other words, the channel hole 176*a* may include two bent portions b1 and b2.

Figure 15:
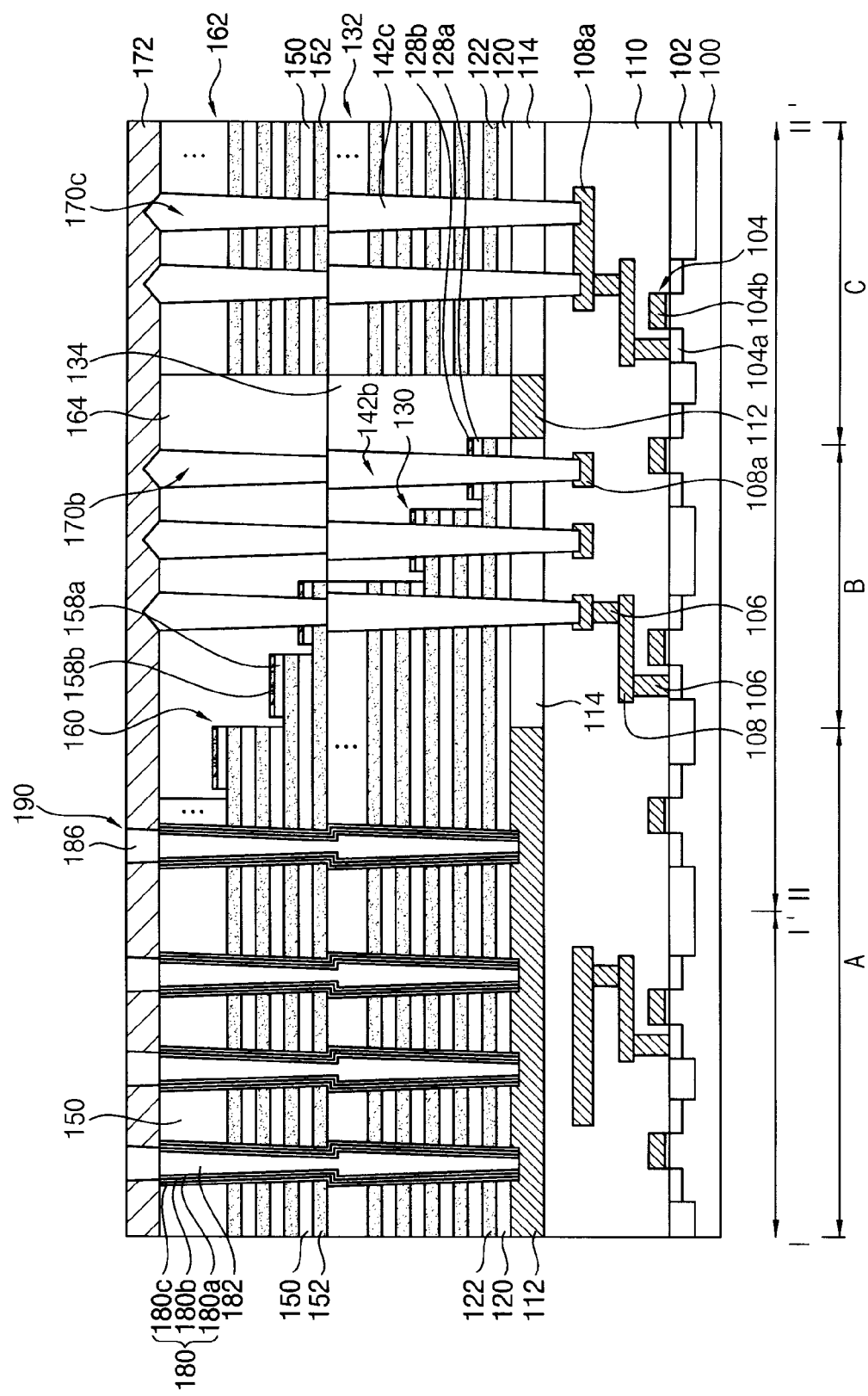

Referring to FIG. 15, a channel structure 190 may be formed in the channel hole 176*a*.

In an exemplary embodiment of the present inventive concept, the channel structure 190 may include a charge storage structure 180, a channel 182, and an upper conductive pattern 186. The channel 182 may be electrically connected to the base pattern 112.

Particularly, the charge storage structure 180 including a blocking pattern 180*c*, a charge storage pattern 180*b*, and a tunnel insulation pattern 180*a* may be formed on the sidewall of each of the channel holes 176*a*. Thereafter, a channel layer may be formed on the charge storage structure 180 to fill the channel hole 176*a*, and an upper surface of the channel layer may be planarized. Thus, the channel 182 may be formed to fill the first and second channel holes 140*a* and 170*a*, and the upper conductive pattern 186 may be formed in the first upper hole 174*a*. The channel 182 and the upper conductive pattern 186 may include, for example, polysilicon.

In some exemplary embodiments of the present inventive concept, as shown in FIG. 4B, the channel structure 190 may include the charge storage structure 180, the channel 182, the filling insulation pattern 184 and the upper conductive pattern 186. In other words, the channel 182 may be formed to have a cylindrical shape. Also, the filling insulation pattern 184 may be formed on the channel to fill the first and second channel holes 140*a* and 170*a*.

In some exemplary embodiments of the present inventive concept, as shown in FIG. 4C, a channel connection pattern 188 may be further formed on the base pattern 112 to surround an outerwall of a lower portion of the channel 182. Thus, the channel connection pattern 188 may be electrically connected with the neighboring channels 182 and the base pattern 112.

Figure 16:
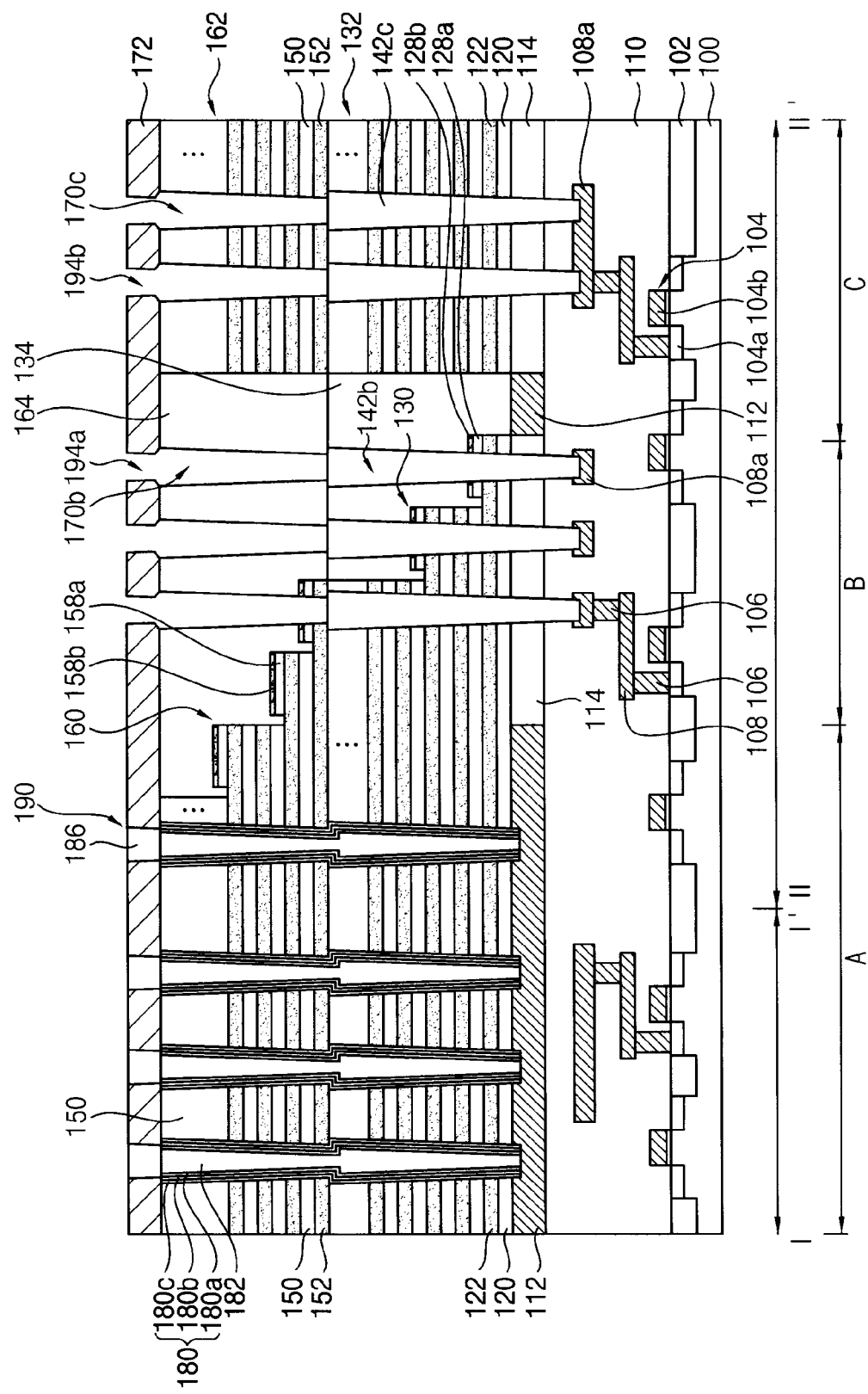

Referring to FIG. 16, a third insulating interlayer 172 may be formed on the through cell wiring region B and may be etched to form a second upper hole 194*a* connected with the third through hole 170*b*. Also, the third insulating interlayer 172 on the through wiring region C may be etched to form a third upper hole 194*b* being communicated with the fourth through hole 170*c*. The second upper holes 194*a* and the third upper holes 194*b* may be formed together by the same etching process.

Therefore, an upper surface of the second filling pattern 142*b* may be exposed by the second upper hole 194*a* and the third through hole 170*b*. Also, an upper surface of the third filling pattern 142*c* may be exposed by the third upper hole 194*b* and the fourth through hole 170*c*.

Referring to FIGS. 17 and 18, the second filling pattern 142*b* exposed by the second upper hole 194*a* and the third through hole 170*b* may be removed, and the third filling pattern 142*c* exposed by the third upper hole 194*b* and the fourth through hole 170*c* may be removed to form a first contact hole 200*a* and a second contact hole 200*b*

Thus, the second upper hole 194*a*, the third through hole 170*b* and the first through hole 140*b* may be connected with each other in the vertical direction to form the first contact hole 200*a*. The second sacrificial patterns 128*a* and the third sacrificial patterns 128*b* or the fifth sacrificial patterns 158*a* and the sixth sacrificial patterns 158*b* may be exposed by a sidewall of the first contact hole 200*a*. Also, an upper surface of the lower pad 108*a* may be exposed by a bottom of the first contact hole 200*a*. The first contact hole 200*a* may include two bent portions b1 and b2.

Also, the third upper hole 194*b*, the fourth through hole 170*c*, and the second through hole 140*c* may be connected with each other in the vertical direction to form the second contact hole 200*b*. An upper surface of the lower pad 108*a* may be exposed by a bottom of the second contact hole 200*b*. The second contact hole 200*b* may include two bent portions b1 and b2.

Referring to FIGS. 19 and 20, a conductive layer may be formed to fill the first contact hole 200*a* and the second contact hole 200*b*, and the conductive layer may be planarized until an upper surface of the third insulating interlayer 172 and may be exposed to form a first contact plug 202*a* and a second contact plug 202*b*. The first contact plug 202*a* may be formed in the first contact hole 200*a*, and the second contact plug 202*b* may be formed in the second contact hole 200*b*. The first contact plug 202*a* and the second contact plug 202*b* may include a metal.

In an exemplary embodiment of the present inventive concept, an upper surface of the channel structure 190 and upper surfaces of the first contact plugs 202*a* and the second contact plugs 202*b* may be coplanar with each other.

Subsequently, portions of the stacked structure including the first upper mold structure 160 and the first lower mold structure 130 may be etched to form first trenches 210*a* and second trenches 210*b* extending in the first direction and spaced in the second direction. Upper surfaces of the base pattern 112 or the base insulation layer 114 may be exposed by bottoms of the first trenches 210*a* and the second trenches 210*b*.

The first trench 210*a* may serve as a word line cut portion. Therefore, the first trench 210*a* may be disposed on the cell region A. The second trench 210*b* may serve as a block cut portion. Therefore, the second trench 210*b* may be disposed on the cell region A and the through cell wiring region B.

Sidewalls of the first insulation layers 120 and the second insulation layers 150 and the first sacrificial layers 122 and the second sacrificial layers 152 may be exposed by sidewalls of the first and second trenches 210*a* and 210*b*.

Adjacent stack structures including the first upper mold structure 160 and the first lower mold structure 130 may be separated by the second trench 210*b*. In some exemplary embodiments of the present inventive concept, the second trench 210*b* may extend through the wiring region C, so that a stacked structure including the second upper mold structure 162 and the second lower mold structure 132 may be separated by the second trench 210*b*.

In an exemplary embodiment of the present inventive concept, a third trench 210*c* serving as a string selection line SSL cutting region may be further formed. In the first upper mold structure 160, an uppermost fourth sacrificial layer 152 and at least one fourth sacrificial layers 152 thereunder may be partially etched to form the third trench 210c.

Referring to FIGS. 21 and 22, portions of the first sacrificial layer 122 and the fourth sacrificial layer 152 exposed by the first and second trenches 210a and 210b may be removed to form gaps between the first insulation layers 120 and between the second insulation layers 150, respectively. The removal process may include, for example, an isotropic etching process.

For example, all of the first sacrificial layers 122 and the fourth sacrificial layers 152 disposed on the cell region A may be removed. Therefore, a first gap 212 may be formed in the cell region A.

The first sacrificial layer 122 and the second sacrificial layer 152, and the second sacrificial patterns 128a and the third sacrificial patterns 128b, and the fifth sacrificial patterns 158a and the sixth sacrificial patterns 158b disposed on the through cell wiring region A may be partially removed.

In this case, the first sacrificial layers 122 and the fourth sacrificial layer 152 adjacent to the second trench 210b may be etched to form a second gap 214. Also, a portion in which the first sacrificial layer 122 and the second sacrificial patterns 128a and the third sacrificial patterns 128b are stacked, and a portion in which the fourth sacrificial layer 152 and the fifth sacrificial pattern 158a and the sixth sacrificial pattern 158b are stacked may be etched to form a third gap 216.

Since a spacing between the second trenches 210b is greater than a spacing between the first trenches 210a, the first sacrificial layers 122 and the fourth sacrificial layers 152, the second sacrificial patterns 128a and the third sacrificial patterns 128b, and the fifth sacrificial patterns 158a and the sixth sacrificial patterns 158b may be partially removed by the etching process. In other words, portions of the first lower mold structure 130 and the first upper mold structure 160 between the second trenches 210b may remain without being removed.

The second gap 214 may have a first length in a second direction perpendicular to the first direction from the second trench 210b.

The second sacrificial pattern 128a and the fifth sacrificial pattern 158a may be etched faster than the first sacrificial layers 122 and the fourth sacrificial layers 152 and the third and sacrificial patterns 128b and the sixth sacrificial patterns 158b. Also, an etchant may further penetrate in the first direction from the gap formed by removing the second sacrificial patterns 128a and the fifth sacrificial patterns 158a. Thus, the sacrificial layer and the sacrificial pattern portion formed on and under the second sacrificial patterns 128a and the fifth sacrificial patterns 158a may be further etched. Therefore, the portions including the second sacrificial pattern 128a and the fifth sacrificial pattern 158a may be etched to form the third gap 216 having a second length in the second direction greater than the first length. In other words, the third gap 216 may protrude from the second gap 214 in the second direction.

An etchant may flow from a portion adjacent to an end portion of the first trench 210a to form a fourth gap in the through cell wiring region B adjacent to the cell region A. In a same level in the vertical direction, the first gap 212, the second gap 214, the third gap 216 and the fourth gap 218 may connect with each other.

Figure 23:
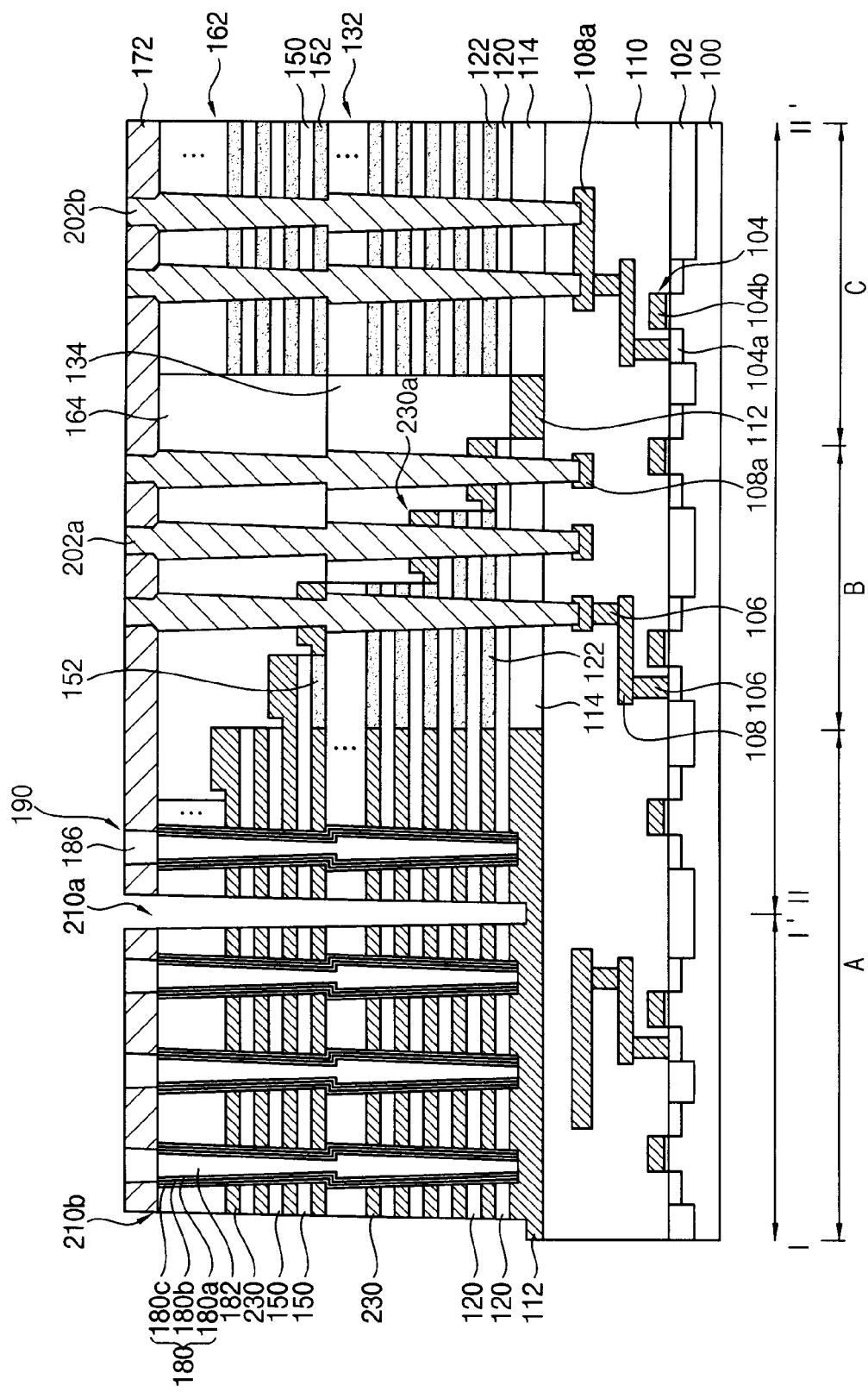

Referring to FIG. 23, a first conductive layer may be formed to fill the first gap 212, the second gap 214, the third gap 216 and the fourth gap 218, and the first conductive layer may be formed in the first trenches 210a and the second trenches 210b. The first conductive layer may include a metal, such as W, Cu, Al, or the like. Before forming the first conductive layer, a barrier metal layer may be further formed on surfaces of the first and second trenches 210a and 210b and the first gap 212, the second gap 214, the third gap 216 and the fourth gap 218.

Thereafter, a first conductive layer formed in the first trenches 210a and the second trenches 210b may be removed to form a conductive pattern in the first gap 212, the second gap 214, the third gap 216 and the fourth gap 218.

In an exemplary embodiment of the present inventive concept, the conductive pattern formed in the first gap 212 may serve as a gate pattern 230. The conductive pattern formed in the third gap 216 may serve as the pad pattern 230a. Also, the conductive patterns formed in the second gap 214 and the fourth gap 218 may serve as connection lines for connecting the gate pattern 230 and the pad pattern 230a.

In other words, the conductive patterns of the same level may be electrically connected to each other. The pad pattern 230a may serve as an actual pad for contacting the first contact plug 202a.

A portion of the through cell wiring region B in which the second gap 214, the third gap 216 and the fourth gap 218 are not formed may not be replaced with a conductive material, so that an insulating structure including the first insulation layer 120, the first sacrificial layer 122, the second sacrificial patterns 128a and third sacrificial patterns 128b, the second insulation layer 150, the fourth sacrificial layer 152, and the fifth sacrificial patterns 158a and the sixth sacrificial patterns 158b may remain.

Figure 24:
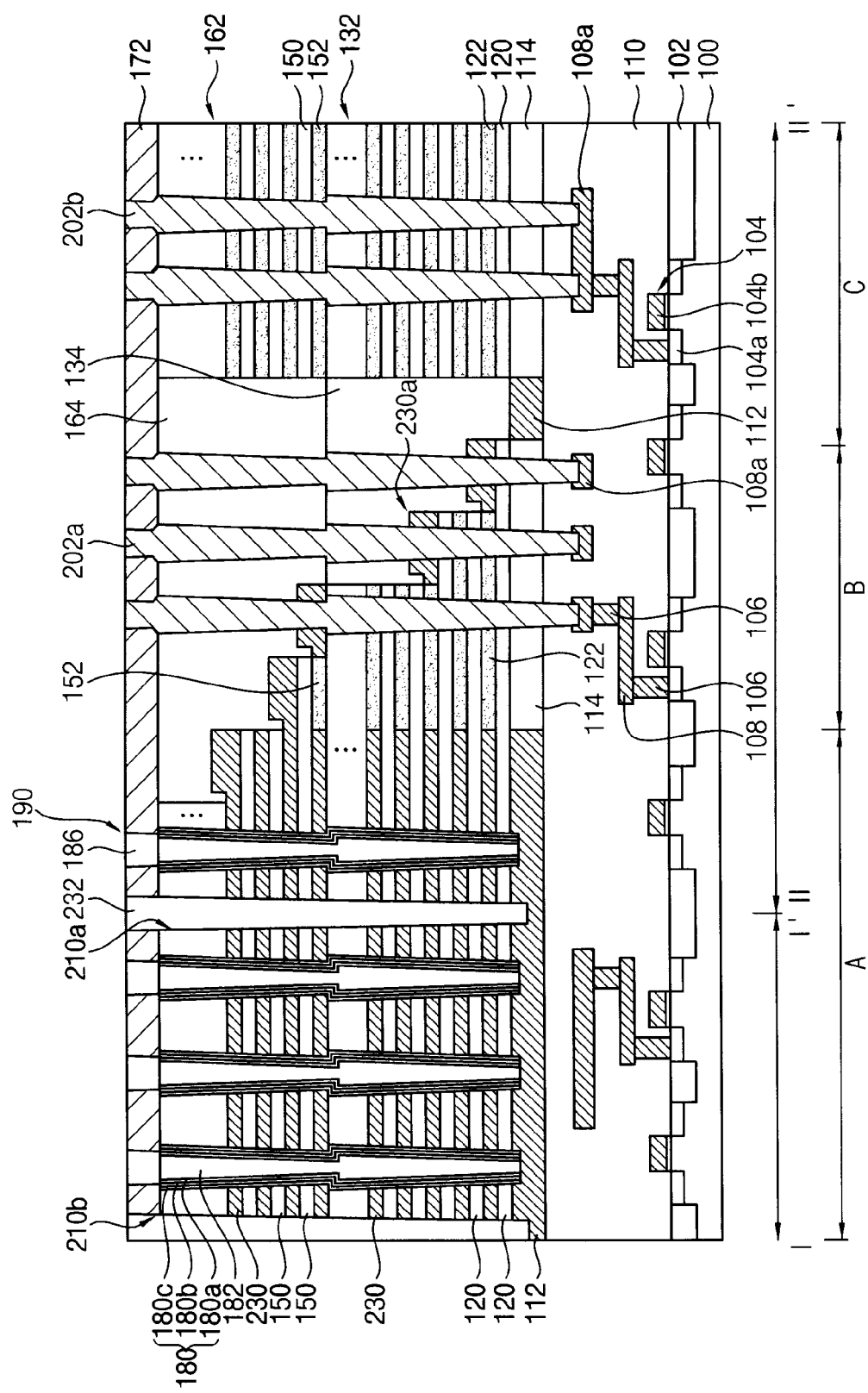

Referring to FIG. 24, an insulation pattern 232 may be formed to fill each of the first trenches 210a and the second trenches 210b.

By performing the above process, a sidewall of the first contact plug 202a may contact the pad pattern 230a. Also, a bottom of the first contact plug 202a may contact the lower pad 108a. Therefore, the pad pattern 230a connected to the gate pattern of one layer and the lower pad 108a connected to the peripheral circuit may be electrically connected by the first contact plug 202a.

In addition, a bottom of the second contact plug 202b may contact the lower pad 108a. Therefore, the second contact plug 202b may be electrically connected to the peripheral circuit.

As described above, the through holes for forming the channel structure 190 and the first contact plugs 202a and the second contact plugs 202b may not be formed by separate etching processes, but may be formed together by the same etching process. Thus, the process for forming the channel structure 190 and the first contact plugs 202a and the second contact plugs 202b may be simplified.

Referring to FIGS. 1 to 3 again, a fourth insulating interlayer 240 may be formed on the third insulating interlayer 172, the channel structure 190, the first contact plugs 202a and the second contact plugs 202b and the insulation pattern 232.

A first upper contact 242 contacting the upper conductive pattern 186 of the channel structure 190 and a second upper contact 254 contacting the second contact plug 202b may be formed through the fourth insulating interlayer 240. Also, a first upper wiring 244 electrically connected to the first upper contact 242 may be formed on the first upper contact 242, and a second upper wiring 256 may be electrically connected to the second upper contact 254 and may be formed on the second upper contact 254.

In an exemplary embodiment of the present inventive concept, an upper contact and an upper wiring may not be formed on the first contact plug 202a.

In some exemplary embodiments of the present inventive concept, a SSL contact 250 may be formed through the second insulating interlayer 164, the third insulating interlayer 172 and the fourth insulating interlayer 240 to contact an upper surface of each of the gate patterns corresponding to the string select lines SSLs. In addition, a third upper wiring 252 may be formed to connect the SSL contact 250.

According to an exemplary embodiment of the present inventive concept, a fifth insulating interlayer covering the first upper wiring 244, the second upper wiring 256 and the third upper wiring 252 may be formed on the fourth insulating interlayer 240.

Thereafter, additional upper wirings may be formed, so that the vertical semiconductor device may be manufactured.

Hereinafter, a method of manufacturing a vertical semiconductor device in accordance with some exemplary embodiments of the present inventive concept will be described.

FIGS. 25, 26, 27, 28, 29 and 30 are cross-sectional views illustrating stages of a method of manufacturing a vertical semiconductor device in accordance with exemplary embodiments of the present inventive concept.

Figure 25:
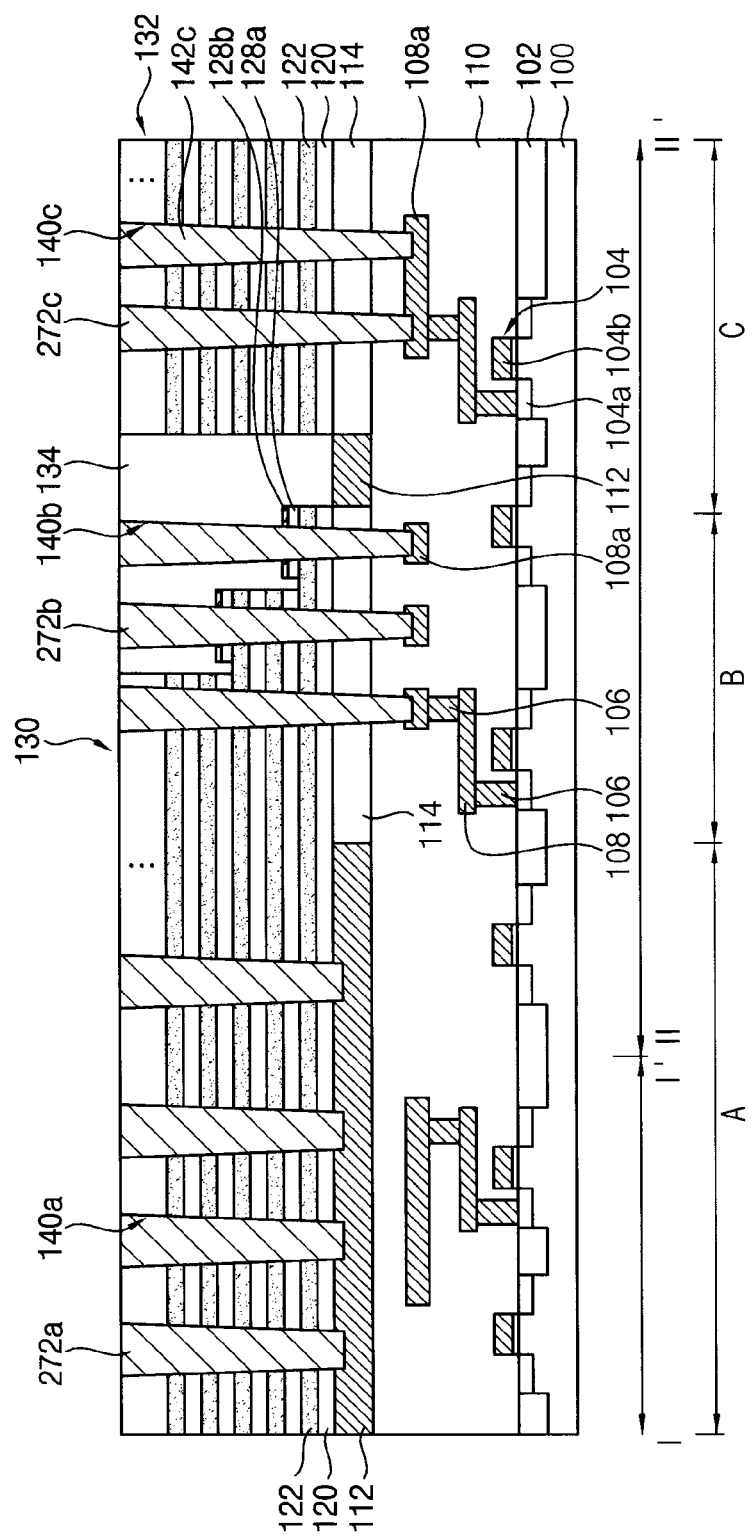
FIGS. 25, 26, 27, 28, 29 and 30 are cross-sectional views illustrating stages of a method of manufacturing a vertical semiconductor device in accordance with an exemplary embodiment of the present inventive concept.

Referring to FIG. 25, first, the processes illustrated with reference to FIGS. 5, 6, 7 and 8 may be performed to form the first channel holes 140a, the first through holes 140b, and the second through holes 140c.

A filling layer may be formed to fill the first channel holes 140a, the first through holes 140b, and the second through holes 140c. The filling layer may include a material having a high etching selectivity with respect to each of the first sacrificial layer 122 and the first insulation layer 120.

The filling layer may include a conductive material. In an exemplary embodiment of the present inventive concept, the filling layer may include a metal such as W, Cu, Al, or the like. For example, the filling layer may include a barrier metal layer and/or a metal layer.

The filling layer may be planarized until upper surfaces of the first insulating interlayer 134, the first lower mold structure 130 and the second lower mold structure 132 may be exposed to form the first filling pattern 272a, the first lower contact plug 272b and the second lower contact plug 272c. The first filling pattern 272a may be formed in each of the first channel holes 140a, the first lower contact plug 272b may be formed in each of the first through holes 140b, and the second lower contact plug 272c may be formed in each of the second through holes 140c.

Figure 26:
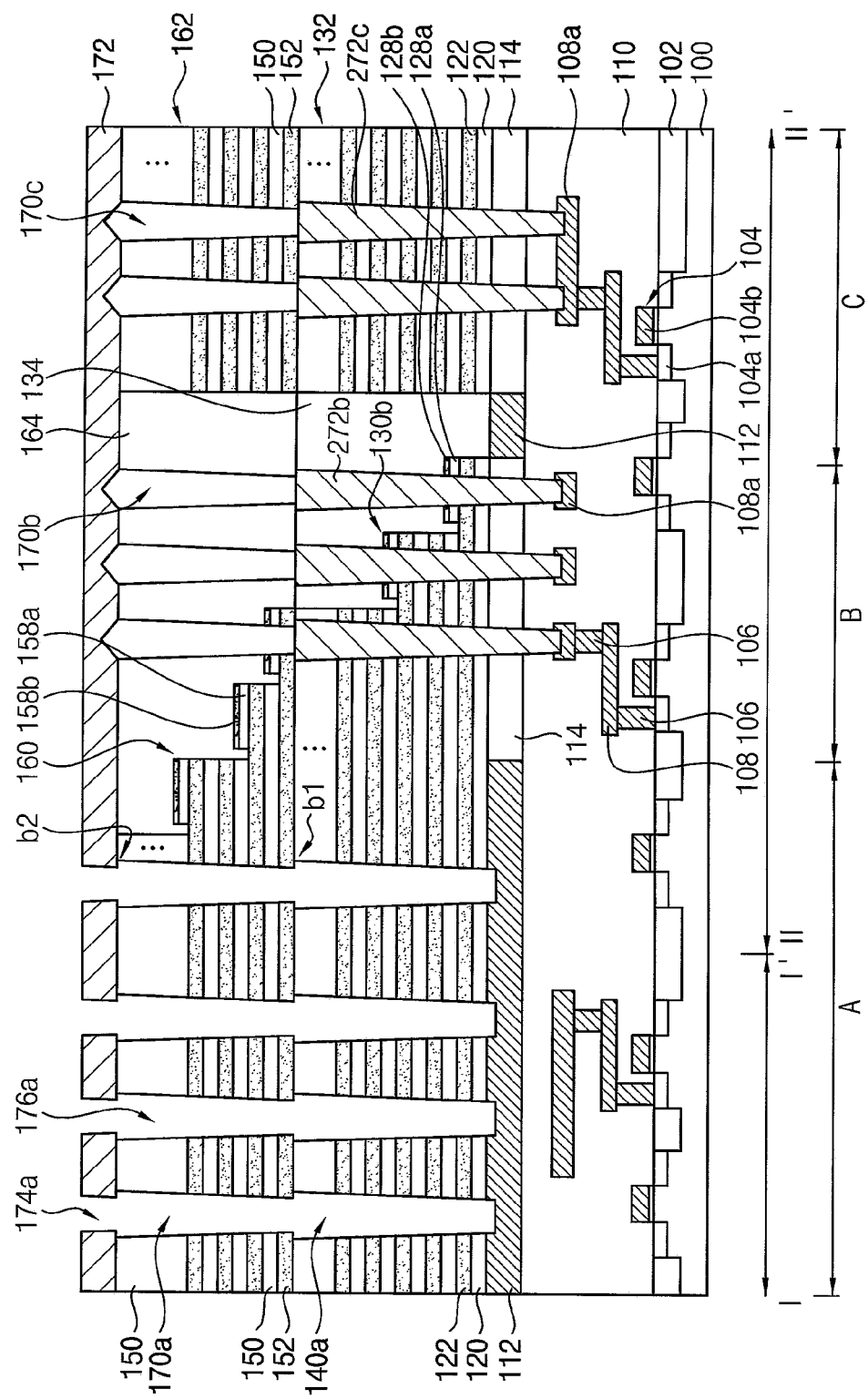

Referring to FIG. 26, the processes illustrated with reference to FIGS. 10, 11, 12, 13, and 14 may be performed to form a channel hole 176a including the first upper hole 174a, the second channel hole 170a, and the first channel hole 140a connect with each other in the vertical direction. In the channel hole 176a, bent portions b1 and b2 may be at a sidewall of a portion between the first upper hole 174a and the second channel hole 170a and a sidewall of a portion between the second channel hole 170a and the first channel hole 140a, respectively. In other words, the channel hole 176a may include two bent portions b1 and b2.

Figure 27:
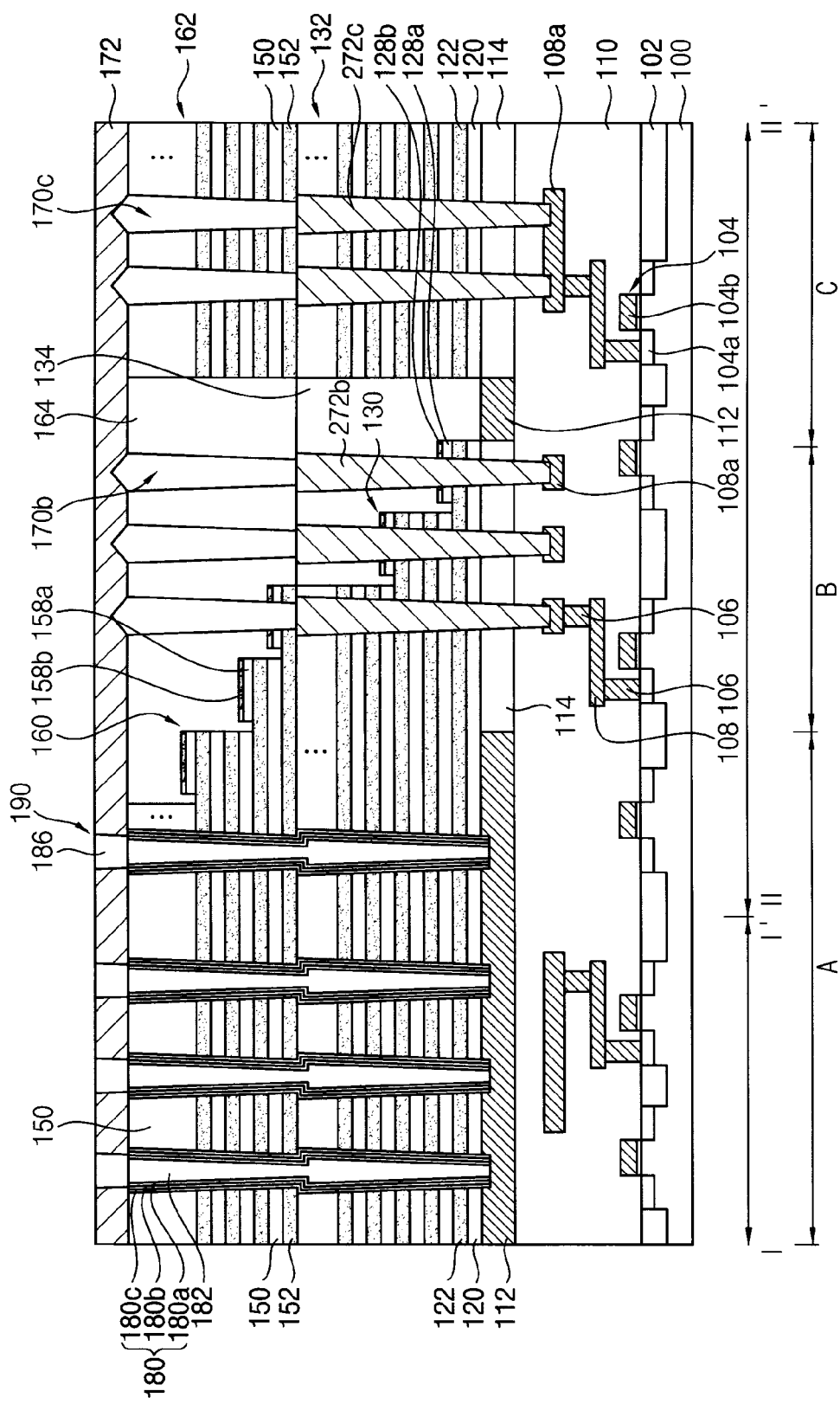

Referring to FIG. 27, a channel structure 190 may be formed in the channel hole 176a. The process for forming the channel structure 190 may be substantially the same as illustrated with reference to FIG. 15.

Figure 28:
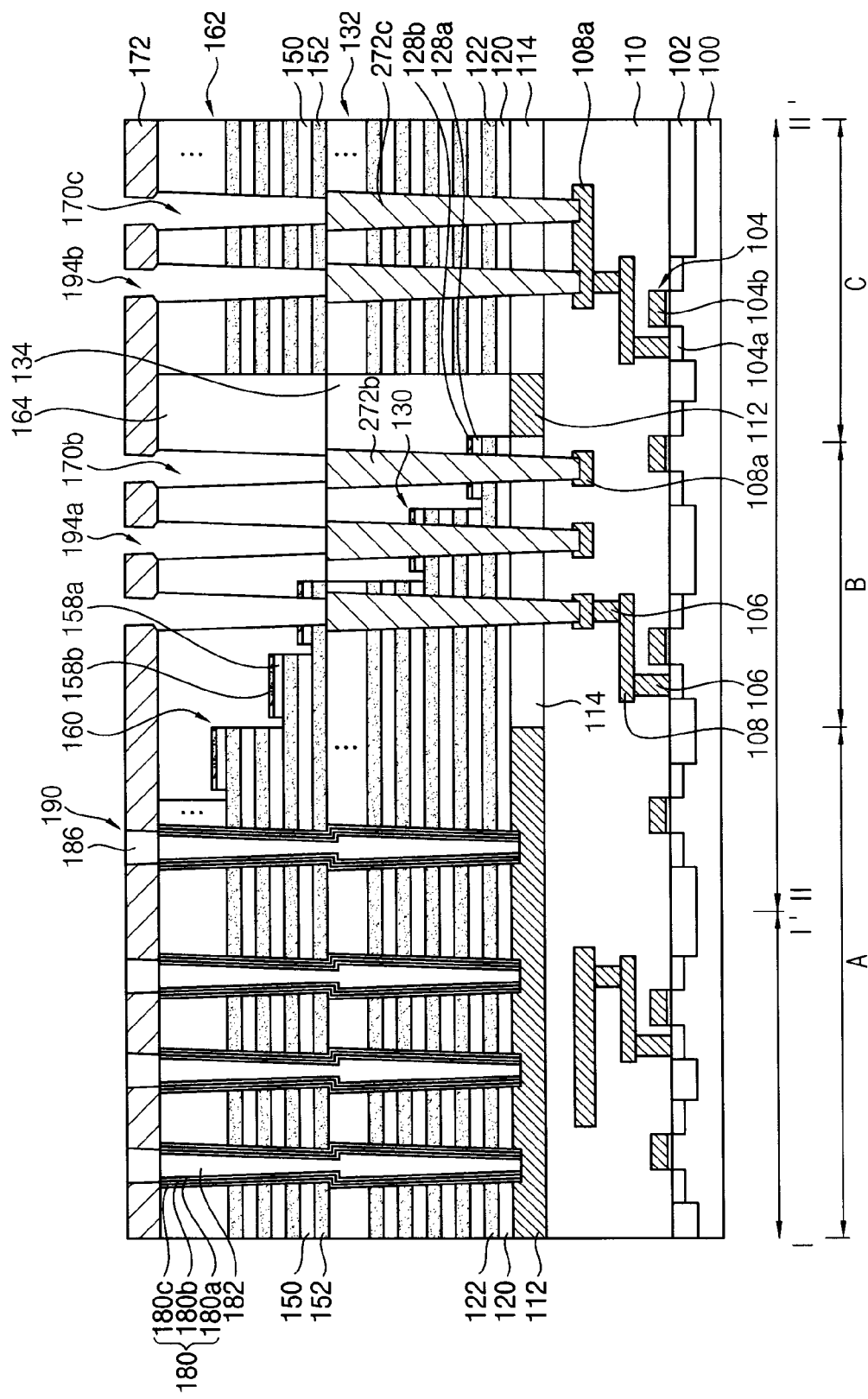

Referring to FIG. 28, a portion of the third insulating interlayer 172 formed on the through cell wiring region B may be etched to form a second upper hole 194a being connected with the third through hole 170b. Also, a portion of the third insulating interlayer 172 formed on the through wiring region C may be etched to form a third upper hole 194b being connected with the fourth through hole 170c. The second upper holes 194a and the third upper holes 194b may be formed together by the same etching process.

An upper surface of the first lower contact plug 272b may be exposed by the second upper hole 194a and the third through hole 170b. Also, an upper surface of the second lower contact plug 272c may be exposed by the third upper hole 194b and the fourth through hole 170c.

Figure 29:
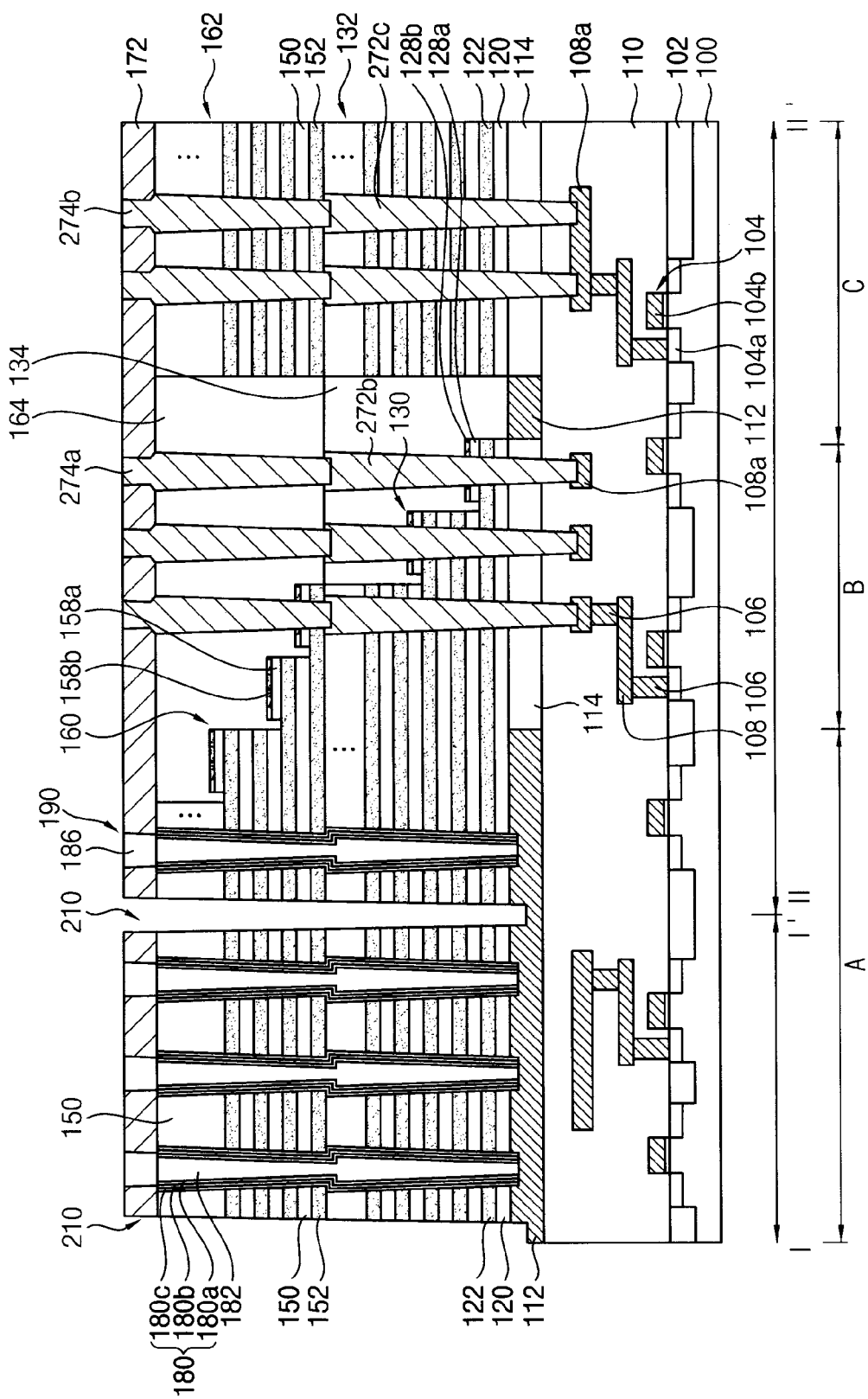

Referring to FIG. 29, a conductive layer may be formed on the third insulating interlayer 172 to fill the second upper hole 194a, the third through hole 170b and the third upper hole 194b, the fourth through hole 170c. The conductive layer may be planarized until an upper surface of the third insulating interlayer 172 may be exposed. Thus, a first upper contact plug 274a may be formed in the second upper hole 194a and the third through hole 170b, and a second upper contact plug 274b may be formed in the third upper hole 194b and the fourth through hole 170c. The first upper contact plugs 274a and the second upper contact plugs 274b may include a metal material. For example, the first upper contact plugs 274a and the second upper contact plugs 274b may include a barrier metal pattern and/or a metal pattern.

Thus, a stack including the first lower contact plug 272b and the first upper contact plug 274a may serve as a first contact plug. A stack including the second lower contact plug 272c and the second upper contact plug 274b may serve as a second contact plug. Thereafter, as illustrated with reference to FIG. 19, the first trenches 210a and the second trenches 210b are formed.

Figure 30:
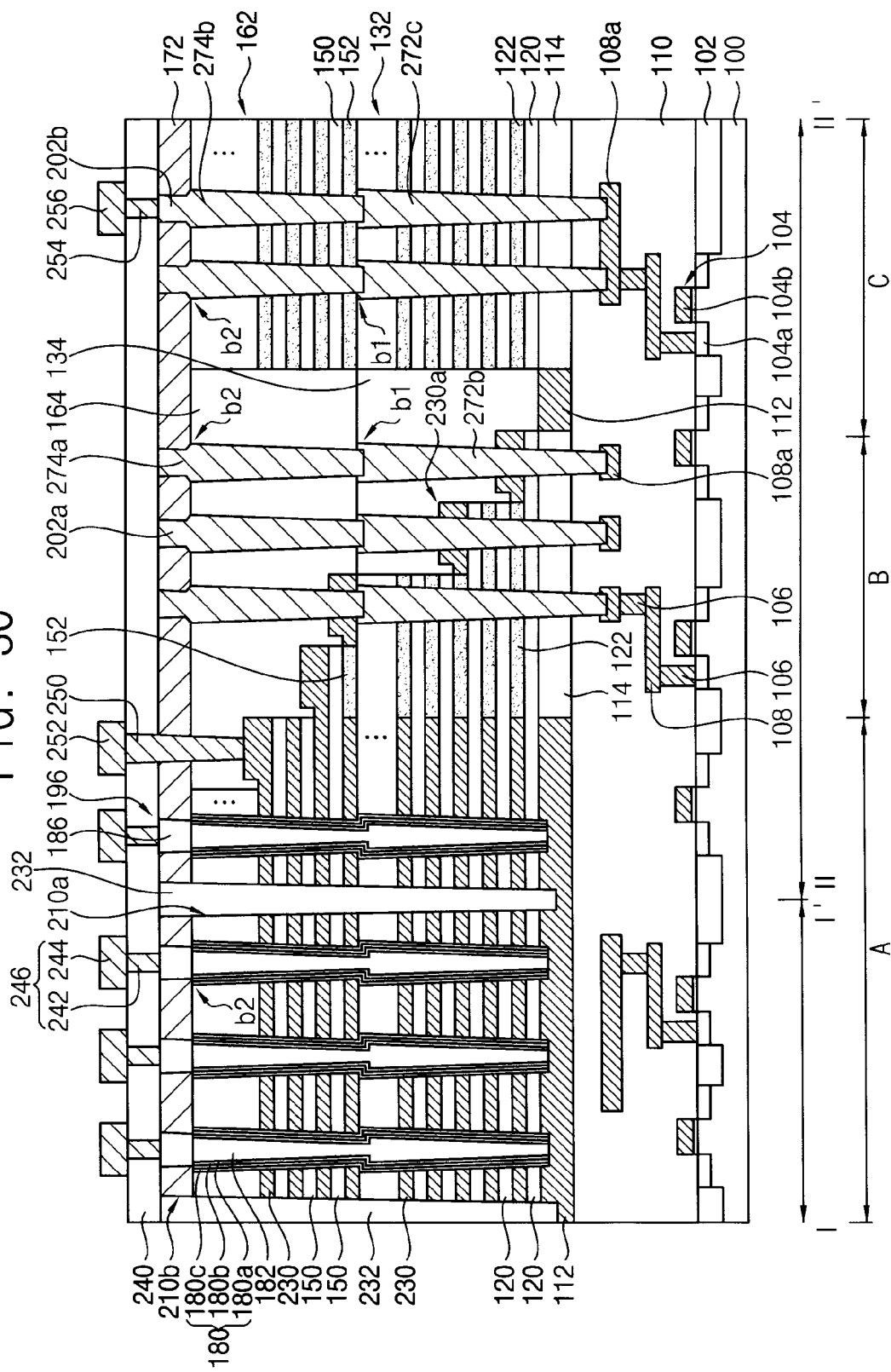

Also, processes substantially the same as or similar to those illustrated with reference to FIGS. 21, 22, 23, and 24 may be performed, so that the vertical semiconductor device as shown in FIG. 30 may be manufactured.

Figure 31:
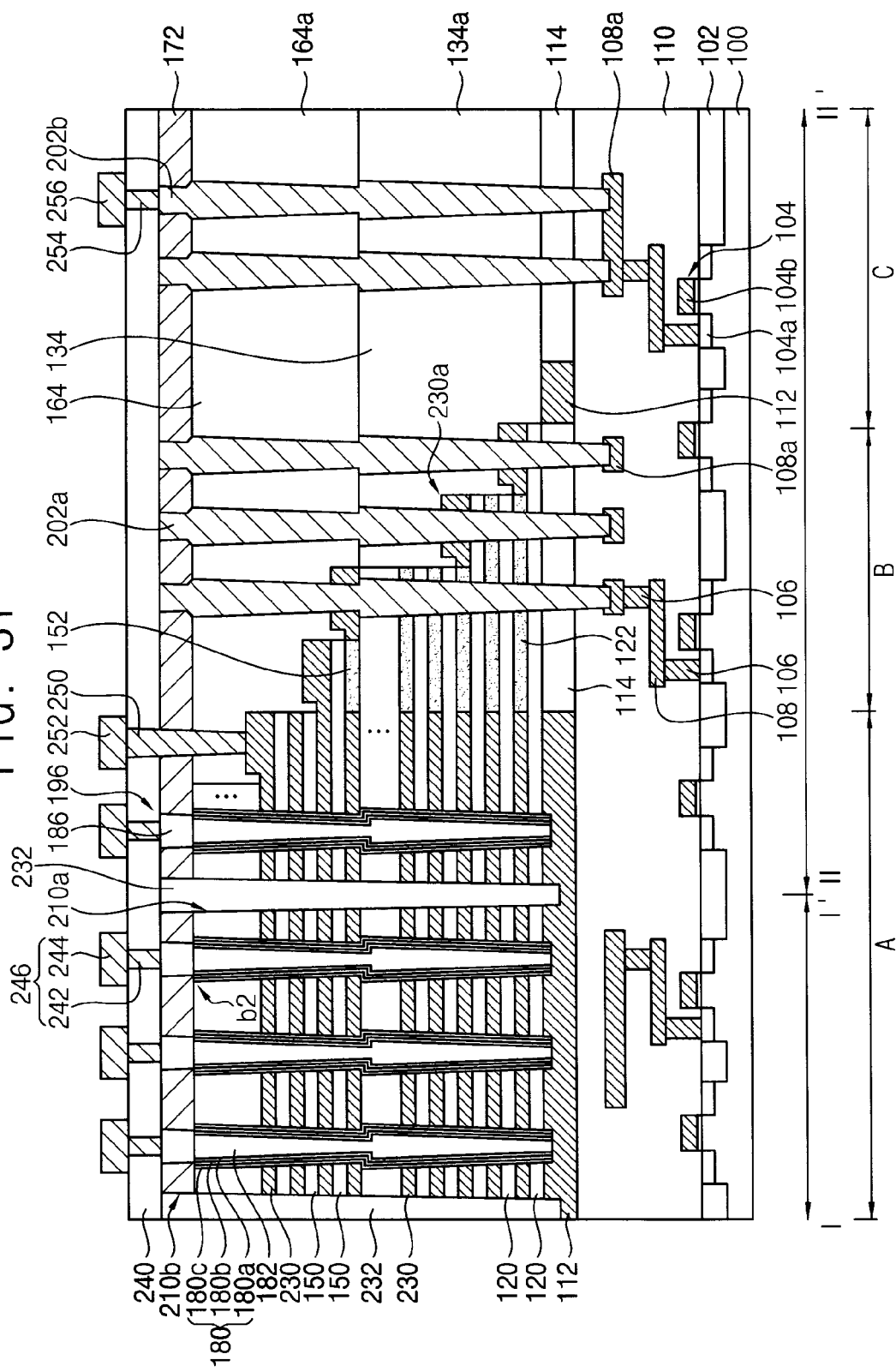
FIG. 31 is a cross-sectional view illustrating a vertical semiconductor device in accordance with an exemplary embodiment of the present inventive concept.

FIG. 31 is a cross-sectional view illustrating a vertical semiconductor device in accordance with an exemplary embodiment of the present inventive concept.

The vertical semiconductor device may be substantially the same as the vertical semiconductor device illustrated with reference to FIGS. 1, 2, 3, 4A, 4B and 4C, except that the second lower mold structure 132 and the second upper mold structure 162 may not be formed on the through wiring region C.

Referring to FIG. 31, a first insulating interlayer 134a and a second insulating interlayer 164a may be formed on the base insulation layer 114 of the through wiring region C.

Therefore, the second contact plug 202b may pass through the third insulating interlayer 172, the second insulating interlayer 164a, the first insulating interlayer 134a and the base insulation layer 114, and the second contact plug 202b may extend to an upper portion of the lower insulating interlayer 110. A bottom surface of the second contact plug 202b may contact an upper surface of the lower pad 108a.

Figure 32:
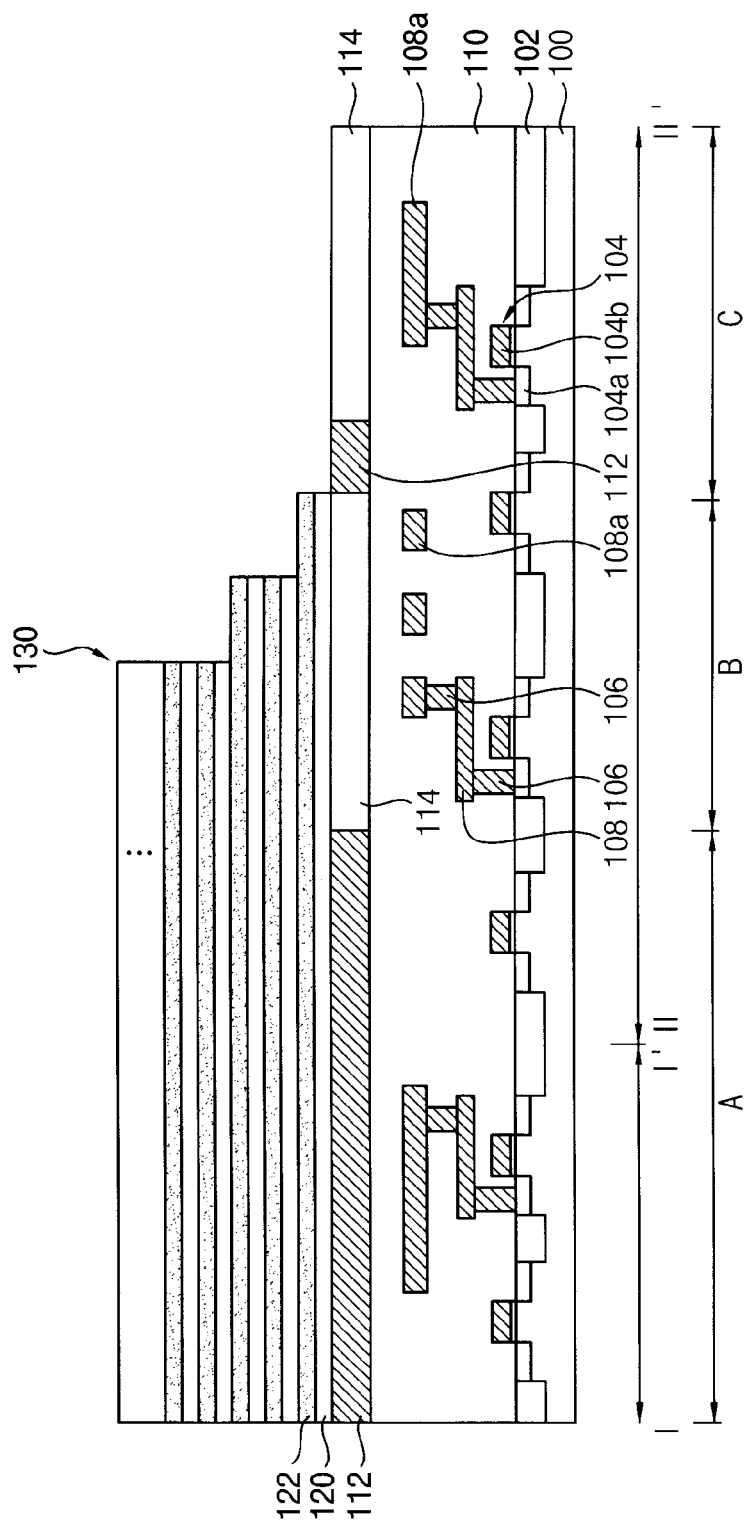
FIGS. 32 and 33 are cross-sectional views illustrating a method of manufacturing a vertical semiconductor device in accordance with an exemplary embodiment of the present inventive concept.
Figure 33:
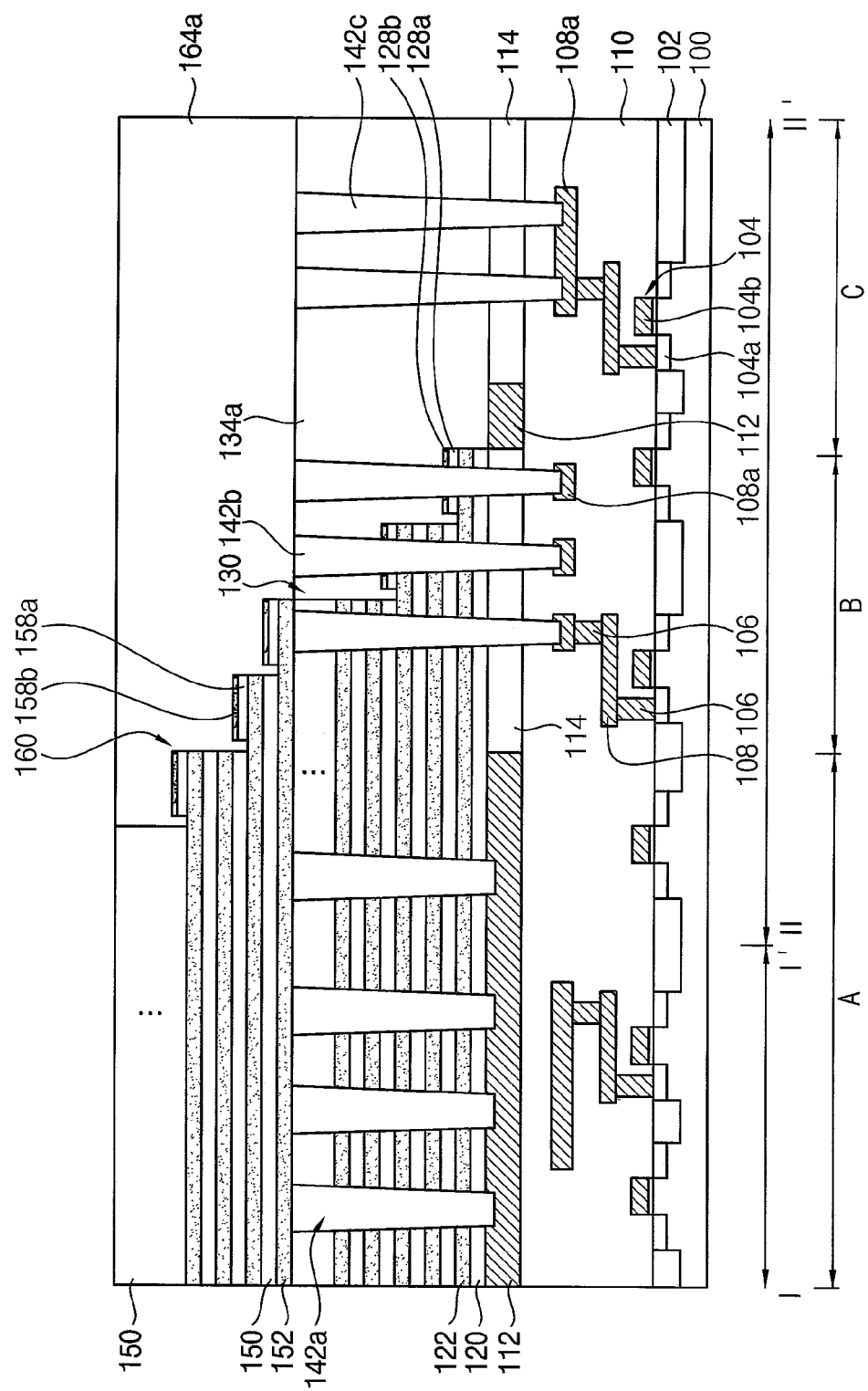

Referring to FIGS. 32 and 33 are cross-sectional views illustrating a method of manufacturing a vertical semiconductor device in accordance with an exemplary embodiment of the present inventive concept.

The vertical semiconductor device may be manufactured by processes that are the same as or similar to illustrated with reference to FIGS. 4, 5, 6, 7, 8, 9, 10, 11, 12, 13, 14, 15, 16, 17, 18, 19, 20, 21, 22, 23, and 24. However, the second lower mold structure 132 and the second upper mold structure 162 may not be formed.

First, the process that is the same as illustrated with reference to FIG. 5 may be performed.

Referring to FIG. 32, the first insulation layers 120 and the first sacrificial layers 122 may be alternately and repeatedly stacked on the base pattern 112 and the base insulation layer 114. A structure including the first insulation layers 120 and the first sacrificial layers 122 repeatedly stacked may be patterned to form the first lower mold structure 130. The first lower mold structure may be formed on the cell region A and the through cell wiring region B of the substrate 100, and an edge portion of the first lower mold structure layer 130 may have a staircase shape (e.g., a stepped shape). In this case, a second lower mold structure may not be formed on the through wiring region C.

Thereafter, processes that are substantially the same as illustrated with reference to FIGS. 6 and 7 may be performed to form a structure including the second sacrificial pattern 128*a* and the third sacrificial pattern 128*b* stacked on the first sacrificial layer 122 of a stepped portion of the first lower mold structure 130.

Referring to FIG. 33, processes that are the same as illustrated with reference to FIGS. 8 and 9 may be performed. In this case, the first insulating interlayer 134*a* may cover the base insulation layer 114 of the through wiring region C.

Also, processes that are the same as those described with reference to FIG. 10 may be performed to form the first upper mold structure 160, the fifth sacrificial pattern 158*a* and the sixth sacrificial pattern 158*b*. However, in the process for forming the first upper mold structure 160, the second upper mold structure 162 may not be formed on the through wiring region C.

A second insulating interlayer 164*a* may be formed to cover an edge portion of the first upper mold structure 160 and the first insulating interlayer 134*a*. In an exemplary embodiment of the present inventive concept, upper surfaces of the first upper mold structure 160 and the second insulating interlayer 164*a* may be substantially coplanar with each other.

Subsequently, processes that are the same as described with reference to FIGS. 11, 12, 13, and 14 may be performed to manufacture the vertical semiconductor device shown in FIG. 31.

Figure 34:
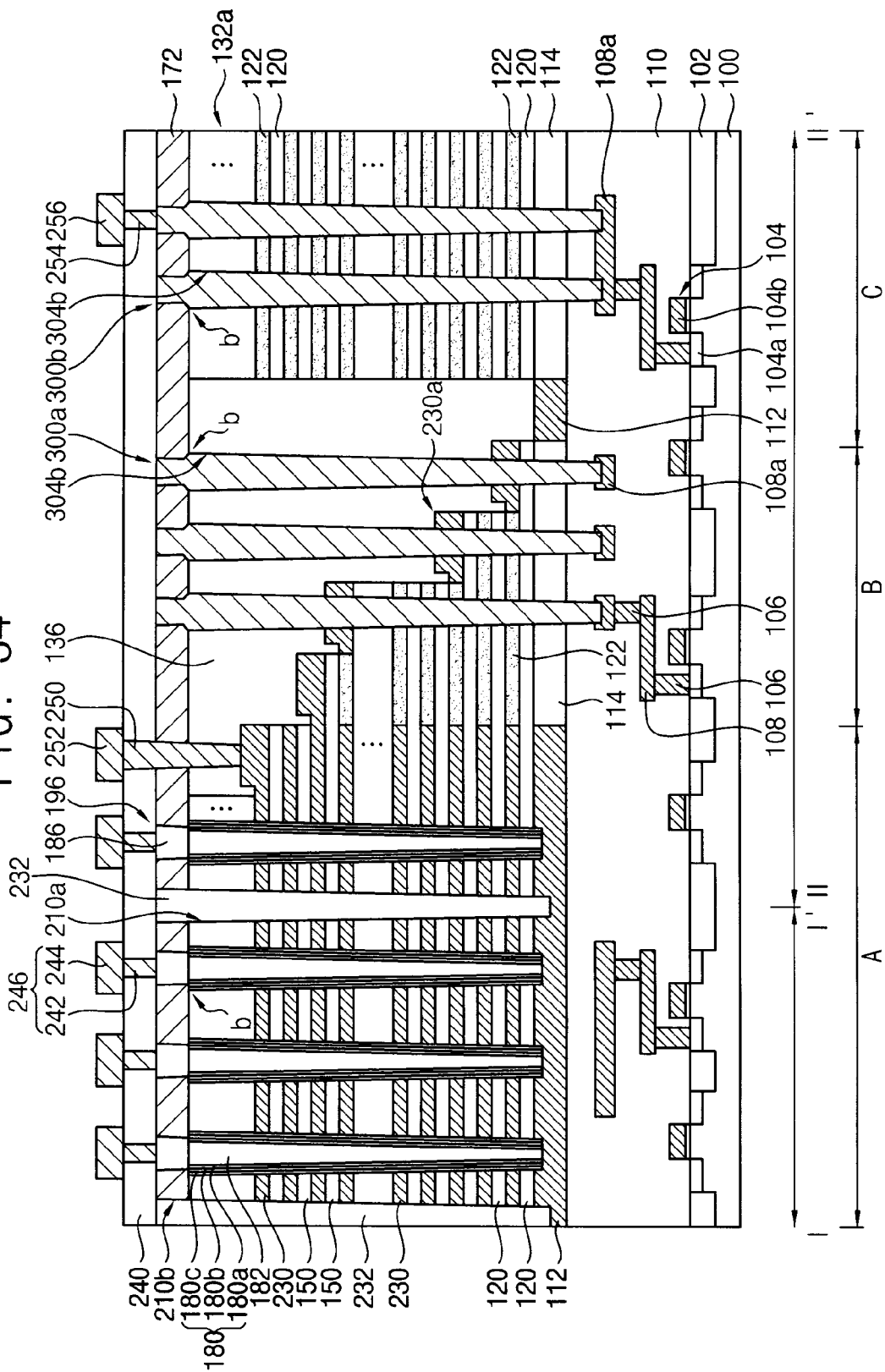
FIG. 34 is a cross-sectional view illustrating a vertical semiconductor device in accordance with an exemplary embodiment of the present inventive concept.

FIG. 34 is a cross-sectional view illustrating a vertical semiconductor device in accordance with an exemplary embodiment of the present inventive concept.

The vertical semiconductor device may be substantially the same as the vertical semiconductor device illustrated with reference to FIGS. 1, 2, 3, 4A, 4B and 4C, except for shapes of the channel structure and the first contact plugs and the second contact plugs. In other words, each of the channel structure and the first and the second contact plug may include only one bent portion of the upper portions thereof.

Referring to FIG. 34, the first insulating interlayer 136 may be formed to cover the second structure. In other words, a second insulating interlayer as shown in FIG. 1 may not be formed.

The channel structure 190 may include a bend portion b between the third insulating interlayer 172 and the first structure thereunder. The first contact plug 300*a* may include a bend portion b between the third insulating interlayer 172 and the first insulating interlayer 136 thereunder. The second contact plug 300*b* may include a bent portion b between the third insulating interlayer 172 and a third structure thereunder.

In an exemplary embodiment of the present inventive concept, the bent portions b of the channel structure 190, the first contact plug 300*a*, and the second contact plug 300*b* may be substantially coplanar with each other.

In an exemplary embodiment of the present inventive concept, the upper surfaces of the channel structure 190, the first contact plug 300*a* and the second contact plug 300*b* may be substantially coplanar with each other.

FIGS. 35, 36, 37, 38, and 39 are cross-sectional views illustrating a method of manufacturing a vertical semiconductor device in accordance with an exemplary embodiment of the present inventive concept.

First, processes that are the same as illustrated with reference to FIG. 5 may be performed.

Figure 35:
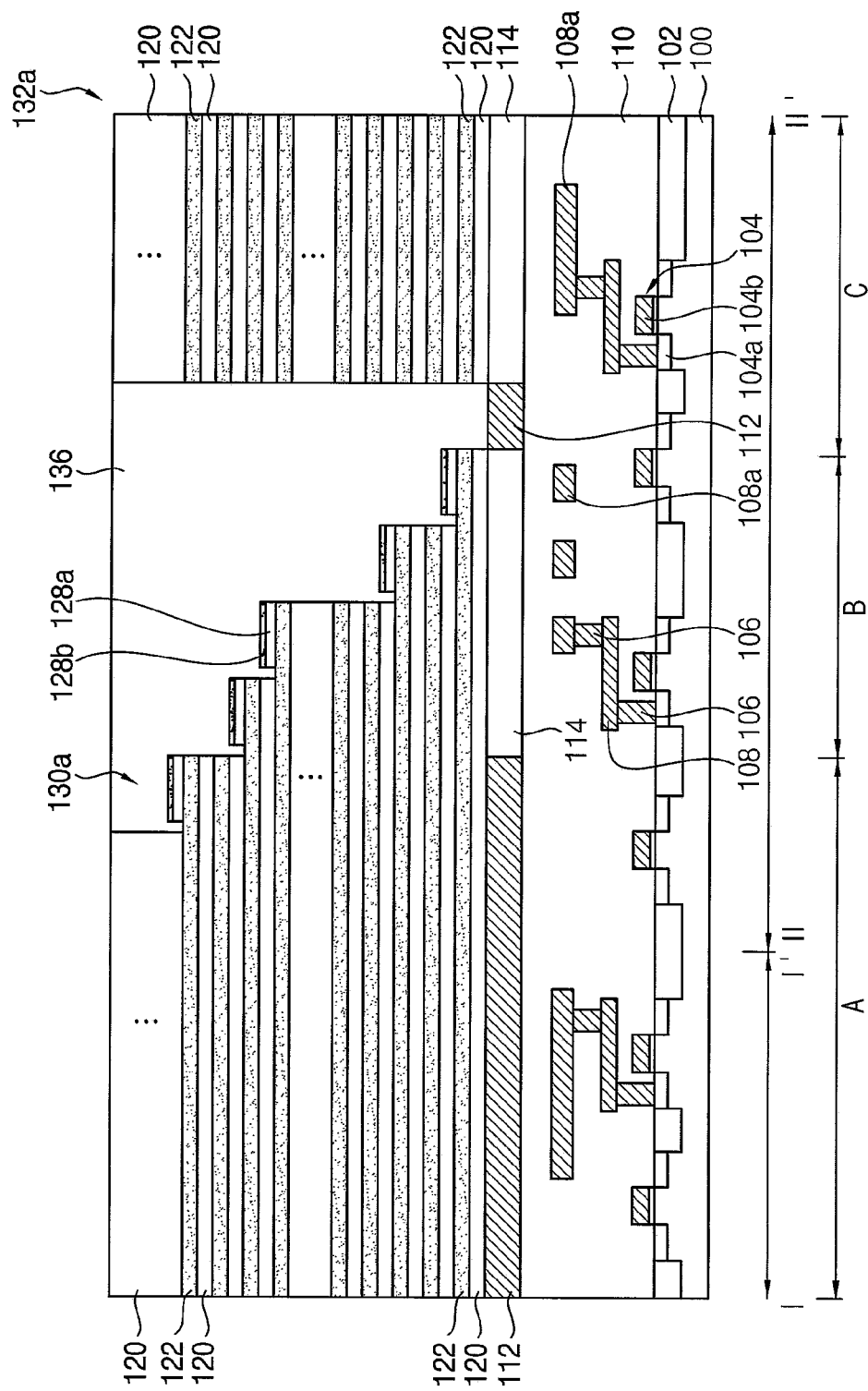
FIGS. 35, 36, 37, 38 and 39 are cross-sectional views illustrating stages in a method of manufacturing a vertical semiconductor device in accordance with an exemplary embodiment of the present inventive concept.

Referring to FIG. 35, the first insulation layers 120 and the first sacrificial layers 122 may be alternately and repeatedly formed on the base pattern 112 and the base insulation layer 114, and the stack including the first insulation layers 120 and the first sacrificial layers 122 may be patterned to form the first mold structure 130*a*. The first mold structure 130*a* may be formed on the cell region A and the through cell wiring region B of the substrate, and the first mold structure may have a staircase shape (e.g., a stepped shape) at an edge portion. Also, the second mold structure 132*a* may be formed on the through wiring region C.

Subsequently, processes that are substantially the same as described with reference to FIGS. 6 and 7 may be performed to form a stacked structure including second sacrificial patterns 128*a* and third sacrificial patterns 128*b* on the first sacrificial layer 122 of the stepped portion of the first mold structure 130*a*. Also, an insulation layer may be formed to cover an edge portion of the first mold structure 130*a*, and an upper surface of the insulation layer may be planarized to form the first insulating interlayer 136.

Figure 36:
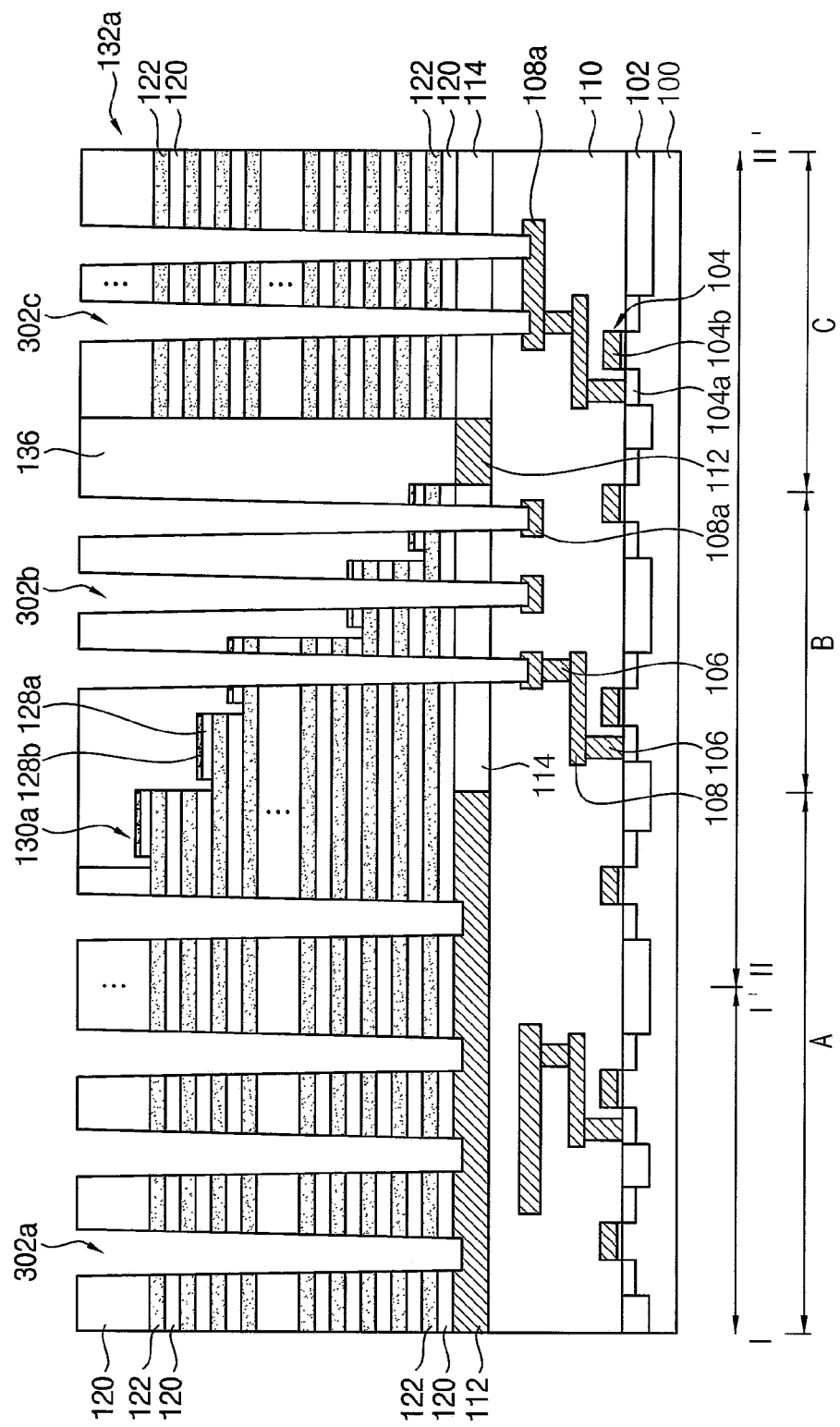

Referring to FIG. 36, the first insulating interlayer 136, the first mold structure 130*a*, the second sacrificial patterns 128*a* and the third sacrificial patterns 128*b*, the second mold structure 132*a*, and the base insulation layer 114 and the lower insulating interlayer may be partially etched to form the first channel holes 302*a*, first through holes 302*b* and second through holes 302*c*, respectively. The etching process may include, for example, an anisotropic etching process.

The first channel hole 302*a* may be formed through the first mold structure 130*a* on the cell region A. An upper surface of the base pattern 112 may be exposed by a lower surface of the first channel hole 302*a*.

The first through hole 302*b* may pass through the first insulating interlayer 136, the first mold structure 130*a*, the second sacrificial patterns 128*a* and the third sacrificial patterns 128*b* and the base insulation layer on the through cell wiring region B. The second sacrificial patterns 128*a* and the third sacrificial patterns 128*b* may be exposed by a sidewall of the first through hole 302*b*, and an upper surface of the lower pad 108*a* may be exposed by a lower surface of the first through hole 302*b*.

The second through hole 302*c* may pass through the second mold structure 132*a* and the base insulation layer 114 on the through wiring region C. An upper surface of the lower pad 108*a* may be exposed by a lower surface of the second through hole 302*c*.

Figure 37:
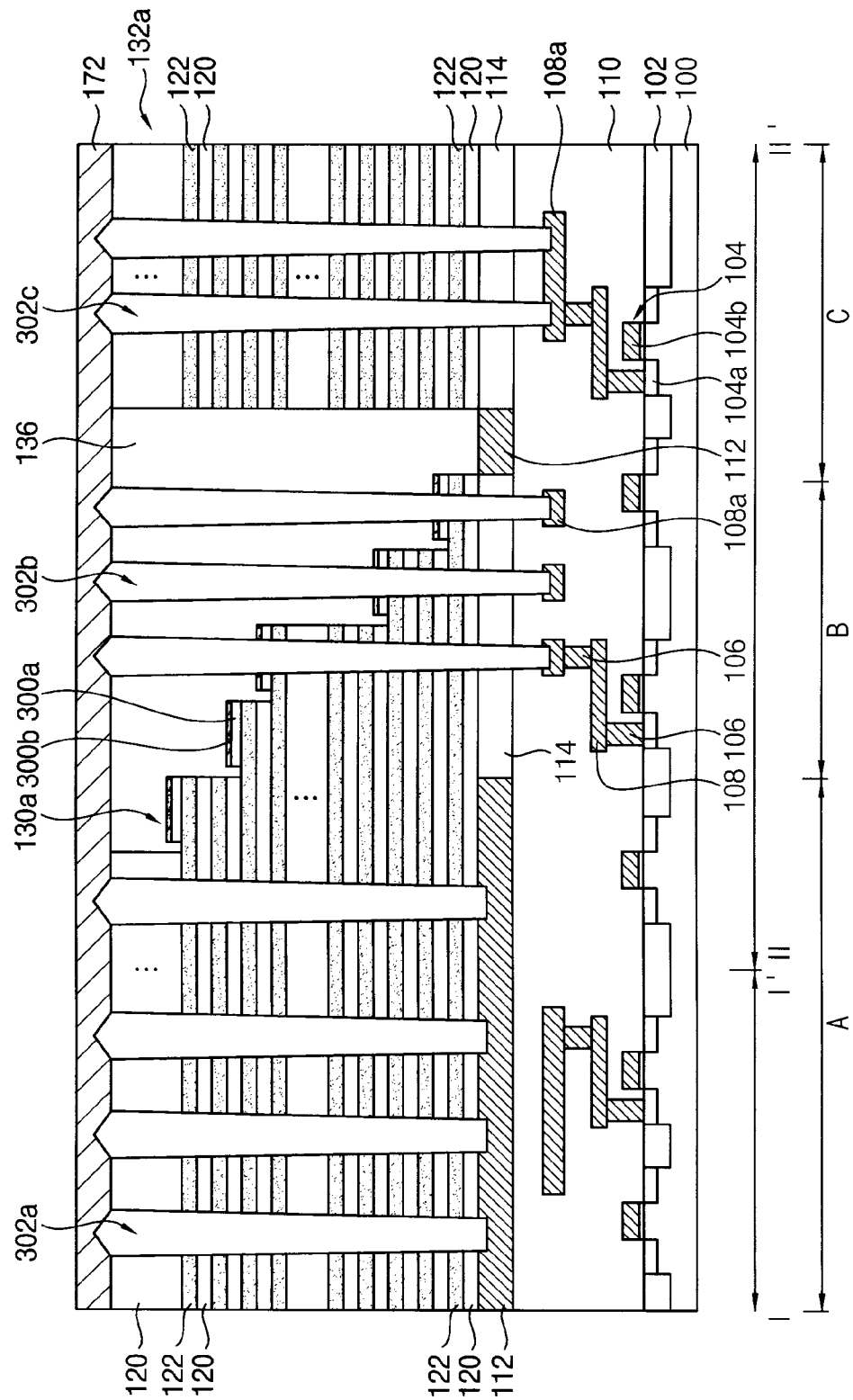

Referring to FIG. 37, a third insulating interlayer 172 may be formed to cover the first mold structure 130*a*, the second mold structure 132*a* and the first insulating interlayer 136. The third insulating interlayer 172 may be formed not to fill the first channel holes 302*a*, the first through holes 302*b* and the second through holes 302*c*.

Figure 38:
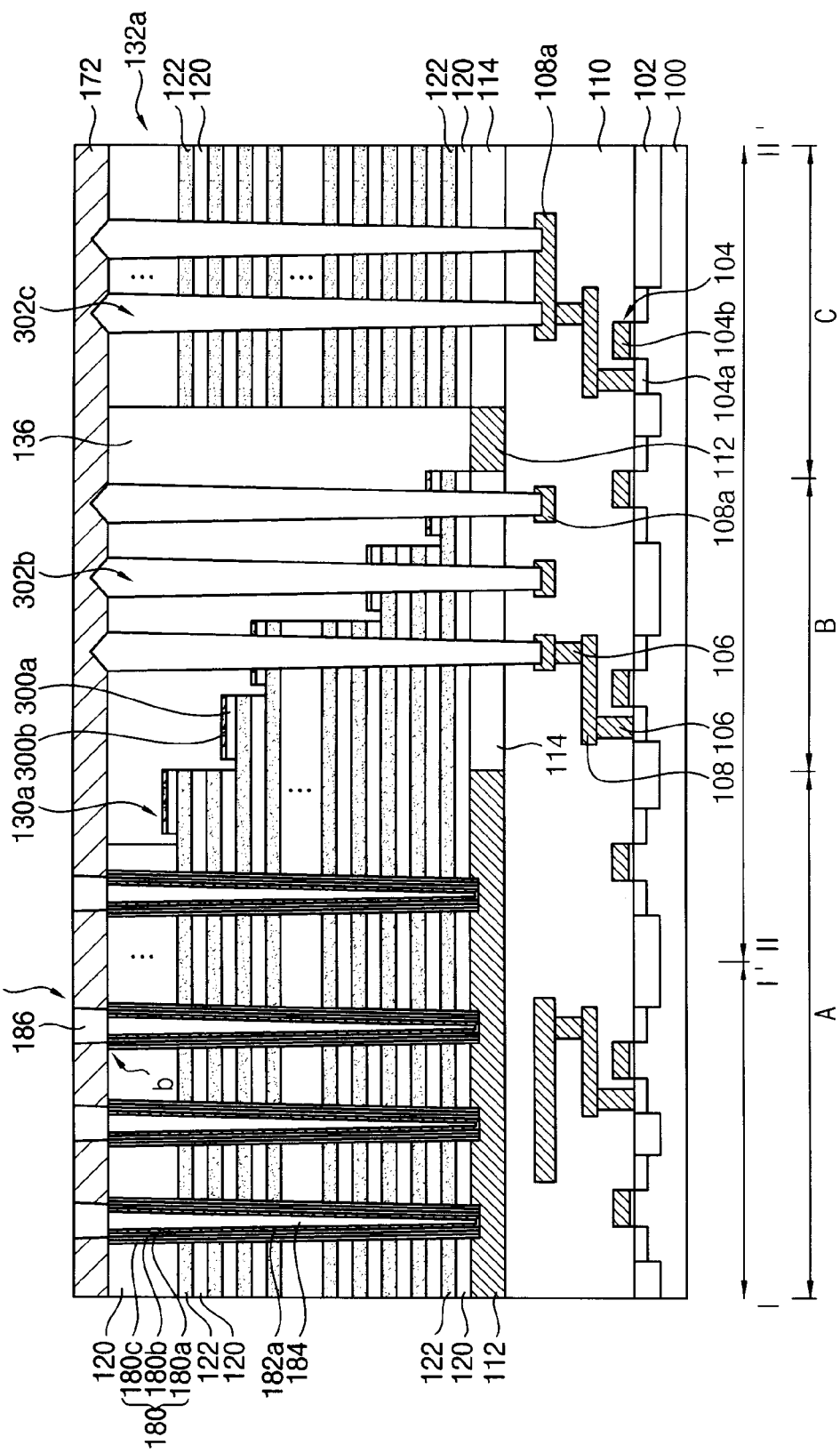

Referring to FIG. 38, a portion of the third insulating interlayer 172 formed on the cell region A may be etched to form a first upper hole to connect with the first channel hole 302a. Therefore, the first upper hole and the first channel hole 302a may be connected with each other, so that the first upper hole and the first channel hole 302a may serve as the channel hole. In an exemplary embodiment of the present inventive concept, in the channel hole, a sidewall between the first upper hole and the first channel hole 302a may have a bent shape. For example, the bent shape of the first channel hole 302a, and accordingly the channel structure 190, may have a continuously bent shape featuring a consistent slope.

The channel structure 190 may be formed in the first channel hole 302a. The channel structure 190 may be formed by processes that are the same as the processes illustrated with reference to FIG. 15. The channel structure 190 may have one bent portion b at an upper portion thereof that extends in the vertical direction.

Figure 39:
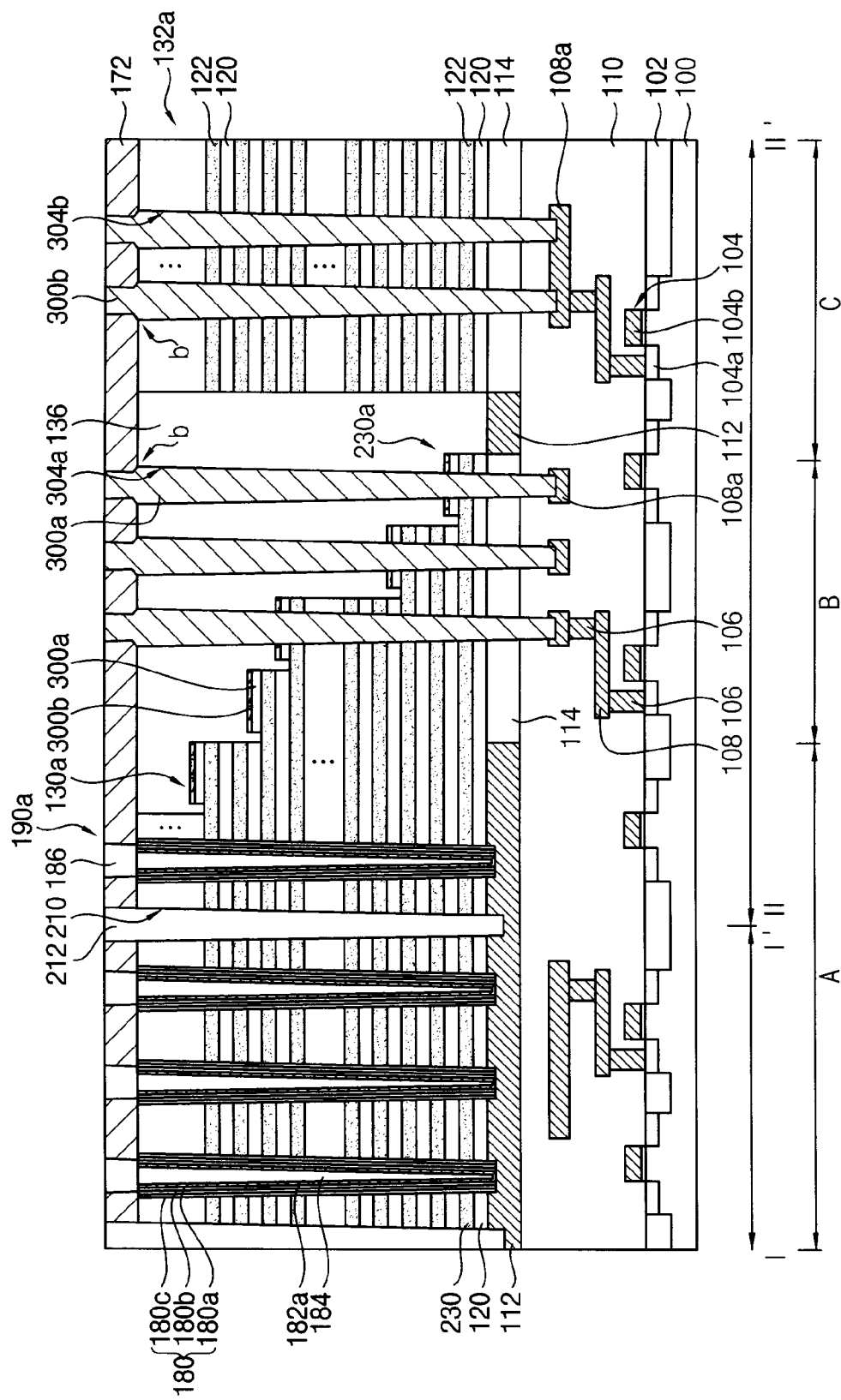

Referring to FIG. 39, a portion of the third insulating interlayer 172 formed on the through cell wiring region B may be etched to form a second upper hole 194a being connected with the first through hole 302b. Also, a portion of the third insulating interlayer 172 formed on the through wiring region C may be etched to form a third upper hole 194b being connected with the second through hole 302c. The second upper holes 194a and the third upper holes 194b may be formed together by the same etching process.

The second upper hole 194a and the first through hole 302b may be connected with each other in the vertical direction to form a first contact hole 304a.

Also, the third upper hole 194b and the second through hole 140c may connect with each other in the vertical direction to form a second contact hole 304b. An upper surface of the lower pad 108a may be exposed by a lower surface of the second contact hole 304b. Each of the first and second contact holes 304b may include one bent portion b.

Thereafter, a conductive layer may be formed to fill in the first contact hole 304a and the second contact hole 304b, and the conductive layer may be planarized until an upper surface of the third insulating interlayer 172 may be exposed to form the first contact plug 300a and the second contact plug 300b. Thus, the first contact plug 300a may be formed in the first contact hole 304a, and the second contact plug 300b may be formed in the second contact hole 304b. Thereafter, as illustrated with reference to FIG. 19, the first trenches 210a and the second trenches 210b may be formed.

Subsequently, processes that are the same as illustrated with reference to FIGS. 19, 20, 21, 22, 23 and 24 may be performed to manufacture the semiconductor device shown in FIG. 34.

Figure 40:
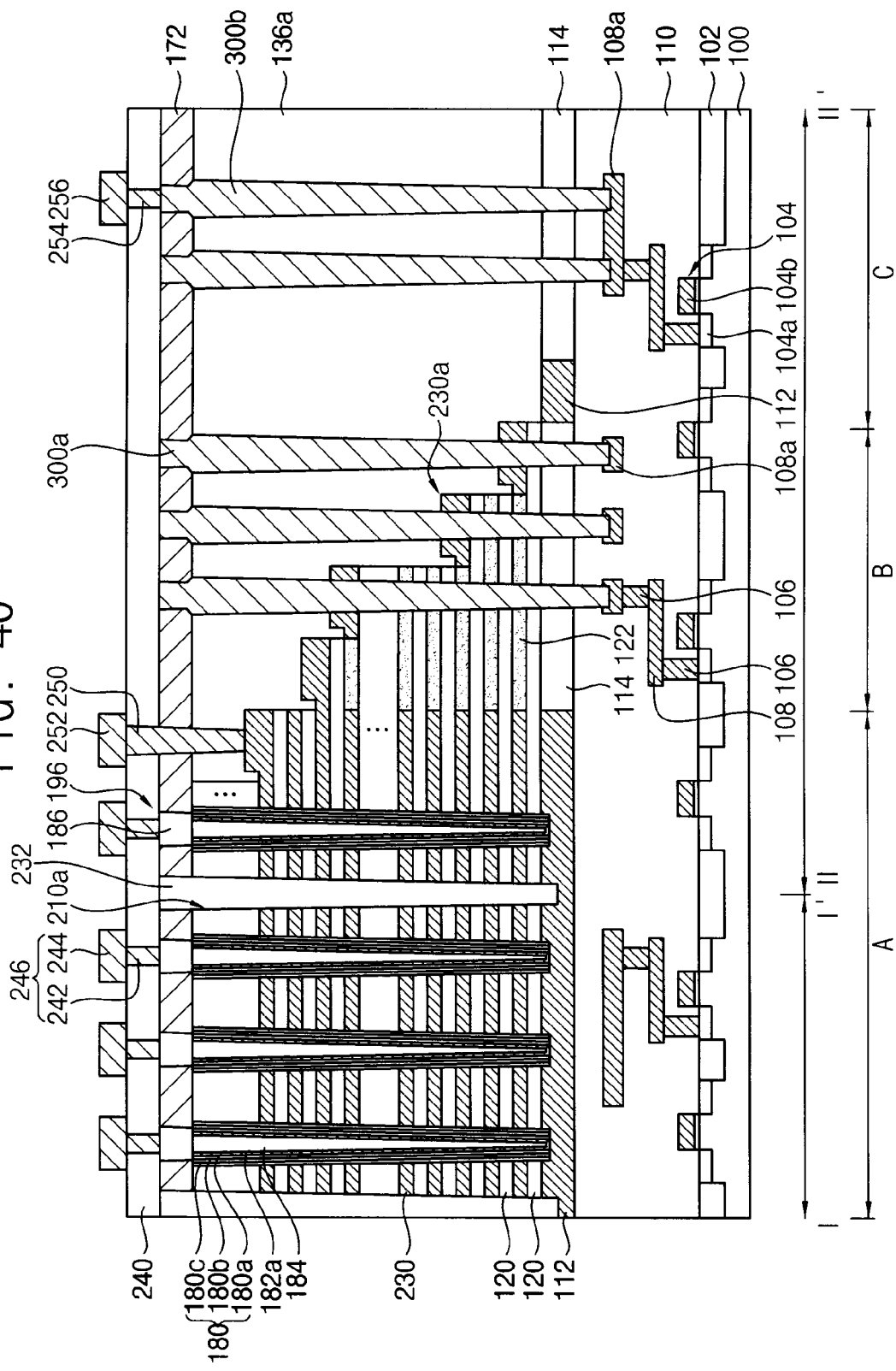
FIG. 40 is a cross-sectional view illustrating a vertical semiconductor device in accordance with an exemplary embodiment of the present inventive concept.

FIG. 40 is a cross-sectional view illustrating a vertical semiconductor device in accordance with an exemplary embodiment of the present inventive concept.

The vertical semiconductor device may be the same as the vertical semiconductor device illustrated with reference to FIG. 34, except that the second mold structure 132a may not be formed on the through wiring region C.

Referring to FIG. 40, the first insulating interlayer 136a may be formed on the base insulation layer 114 of the through wiring region C.

Thus, the second contact plug 300b may pass through the third insulating interlayer 172, the first insulating interlayer 136a and the base insulation layer 114. A lower surface of the second contact plug 300b may contact an upper surface of the lower pad 108a.

Figure 41:
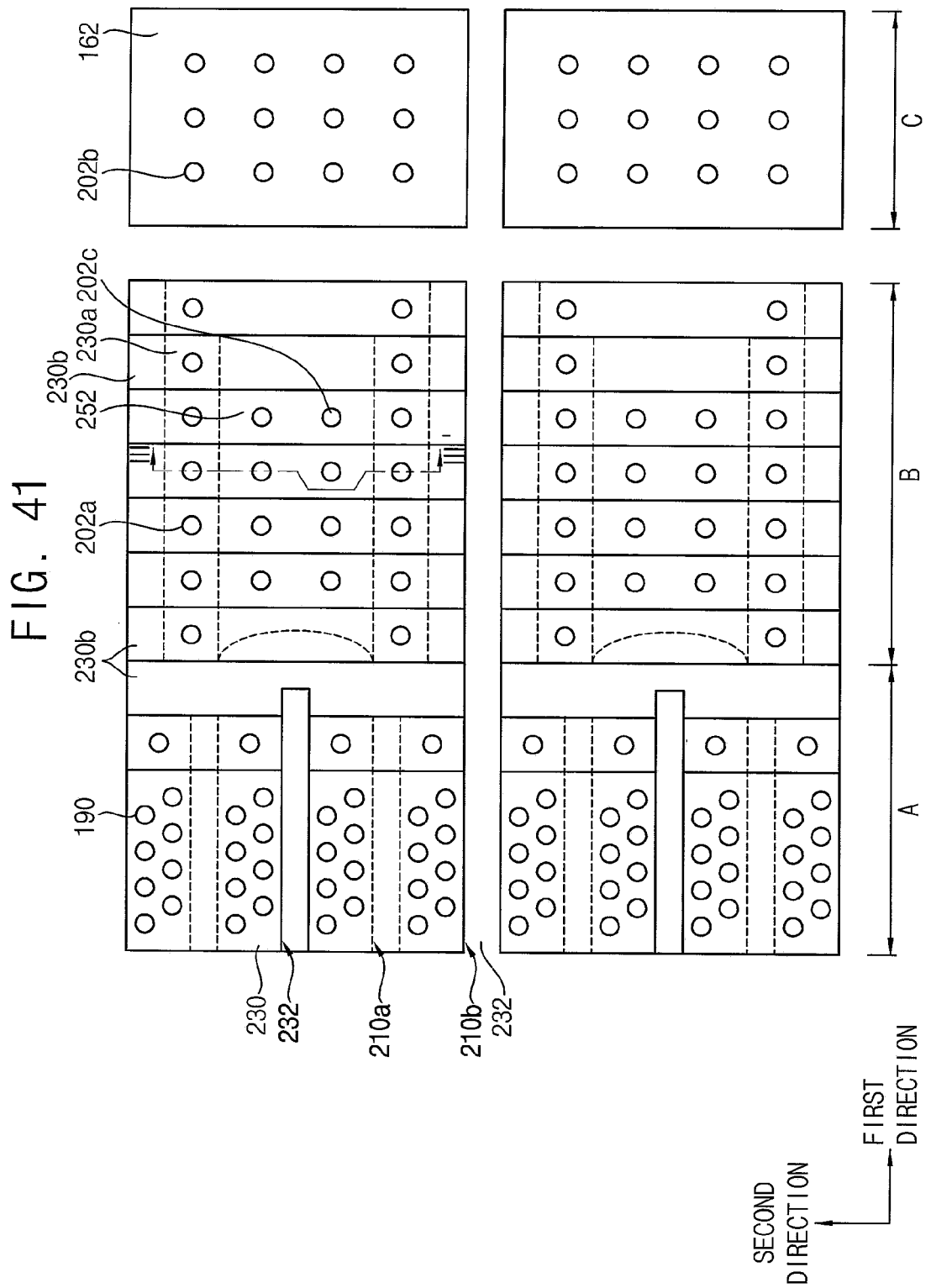
FIG. 41 is a plan view illustrating a vertical semiconductor device in accordance with an exemplary embodiment of the present inventive concept.
Figure 42:
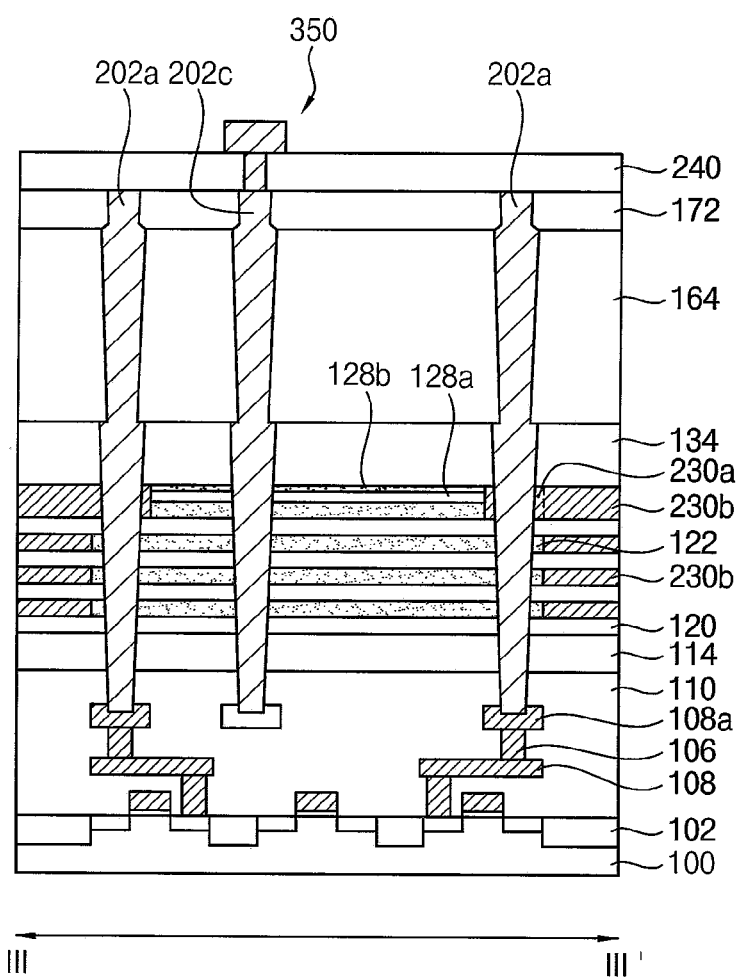
FIG. 42 is a cross-sectional view illustrating a cross-section taken along line of the vertical semiconductor device of FIG. 41 in accordance with an exemplary embodiment of the present inventive concept.

FIGS. 41 and 42 are a plan view and a cross-sectional view illustrating vertical semiconductor devices in accordance with an exemplary embodiment of the present inventive concept.

FIG. 42 is a cross-sectional view taken along a line III-III' of FIG. 41. The vertical semiconductor device may be the same as the vertical semiconductor device illustrated with reference to FIGS. 1, 2, 3 and 4, except that a third contact plug 202c penetrating the first structure may be further formed on the through cell wiring region B.

With respect to FIGS. 41 and 42, the third contact plug 202c may be further formed at a portion of only an insulating material in the second structure of the cell wiring region B. In other words, a plurality of third contact plugs 202c may extend in the vertical direction from the third insulating interlayer 172 to the lower pad 108a. Ones of the third contact plugs 202c may pass through the first insulation layer 120, the second insulation layer 150, the first sacrificial layers 122 and the fourth sacrificial layers 152 in the second structure. Ones of the third contact plugs 202c may pass through the first insulation layer 120, and the first sacrificial layers 122 in the second structure.

Upper surfaces of the third contact plug 202c and the first contact plugs 202a and the second contact plugs 202b may be coplanar with each other. A lower surface of the third contact plug 202c may contact an upper surface of the lower pad 108a.

An upper wiring 350 may be further formed on the fourth contact plug 202c.

While exemplary embodiments have been described with reference to the figures, it will be understood by those of ordinary skill in the art that various changes in form and details may be made therein without departing from the spirit and scope of the present invention as defined by the following claims.

What is claimed is:
1. A vertical memory device, comprising:
a first structure on a substrate, the first structure including gate patterns spaced apart from each other in a vertical direction perpendicular to an upper surface of the substrate to form a plurality of layers;
a second structure connected to the first structure, the second structure including pad patterns electrically connected to the gate patterns of a respective one of the layers;
a channel structure passing through the gate patterns; and
a first contact plug passing through the second structure and electrically connected with a pad pattern of one of the layers, wherein the first contact plug is electrically insulated from gate patterns of other layers through which the first contact plug passes,
wherein at least one bent portion is included at each of a sidewall of the channel structure and a sidewall of the first contact plug,
wherein the bent portion of the channel structure and the bent portion of the first contact plug are coplanar with each other.

2. The vertical memory device of claim 1, wherein an upper surface of the channel structure and an upper surface of the first contact plug are coplanar with each other.

3. The vertical memory device of claim 1, wherein a lower surface of the channel structure is higher than a lower surface of the first contact plug.

4. The vertical memory device of claim 1, further comprising:
a circuit pattern formed on the substrate;

a lower pad electrically connected to the circuit pattern; and a base pattern and a base insulation layer on the lower pad, wherein the first structure and the second structure are formed on the base pattern or the base insulation layer.

5. The vertical memory device of claim 4, wherein a lower surface of the channel structure contacts the base pattern, and a lower surface of the first contact plug contacts the lower pad.

6. The vertical memory device of claim 1, further comprising:
a third structure spaced apart from the second structure, and the third structure including an insulation material; and
a second contact plug passing through the third structure, and the second contact plug including a bent portion at a sidewall thereof.

7. The vertical memory device of claim 6, further comprising:
a first upper wiring on the channel structure, the first upper wiring electrically connected to the channel structure; and
a second upper wiring on the second contact plug, the second upper wiring electrically connected to the second contact plug.

8. The vertical memory device of claim 1, further comprising an insulating interlayer covering the first structure and the second structure, and
wherein an upper surface of the insulating interlayer is coplanar with upper surfaces of each of the channel structure and the first contact plug.

9. The vertical memory device of claim 8, wherein the bent portion of the channel structure is positioned between the first structure and the insulating interlayer, and the bent portion of the first contact plug is positioned between the second structure and the interlayer insulating layer.

10. A vertical memory device, comprising:
a circuit pattern on a substrate;
a base pattern and a base insulation layer on the circuit pattern;
a first structure on the base pattern, the first structure including gate patterns spaced apart from each other in a vertical direction perpendicular to an upper surface of the substrate, and the gate patterns extending in a first direction parallel to the upper surface of the substrate;
a second structure connected to the first structure, the second structure including pad patterns in separate layers, wherein the pad patterns are electrically connected to the gate patterns of a same layer;
a channel structure passing through the gate patterns, and the channel structure extending in the vertical direction;
a first contact plug passing through the second structure and electrically connected with a pad pattern of one of the layers, and the first contact plug extending in the vertical direction; and
at least one bent portion is included at a sidewall of the channel structure and a sidewall of the first contact plug,
wherein the bent portion of the channel structure and the bent portion of the first contact plug are coplanar with each other, and wherein an upper surface of the channel structure and an upper surface of the first contact plug are coplanar with each other.

11. The vertical memory device of claim 10, further comprising an insulating interlayer covering the first structure and the second structure, and
wherein an upper surface of the insulating interlayer is coplanar with upper surfaces of at least one of the channel structure and the first contact plug.

12. The vertical memory device of claim 10, wherein a lower surface of the channel structure contacts an upper surface of the base pattern, and the first contact plug passes through the base insulation layer, and wherein a lower surface of the first contact plug is disposed lower than the lower surface of the channel structure.

13. The vertical memory device of claim 10, further comprising a lower pad electrically connected to the circuit pattern, and
wherein a sidewall of the first contact plug contacts a portion of the pad pattern, and a lower surface of the first contact plug contacts the lower pad.

14. A vertical memory device, comprising:
a first structure on a substrate, the first structure including gate patterns spaced apart from each other in a vertical direction perpendicular to an upper surface of the substrate, and the gate patterns extending in a first direction parallel to the upper surface of the substrate;
a second structure connected to the first structure, the second structure including pad patterns spaced apart in separate layers and electrically connected to gate patterns of a same layer;
a channel structure passing through the gate patterns, and the channel structure extending in the vertical direction;
a first contact plug passing through the second structure and electrically connected with a pad pattern of one of the layers, and the first contact plug extending in the vertical direction, and the first contact plug passing through the second structure, wherein the first contact plug is electrically insulated from gate patterns of other layers through which the first contact plug passes;
a third structure spaced apart from the second structure; and
a second contact plug passing through the third structure, and the second contact plug extending in the vertical direction,
wherein an upper surface of the channel structure and upper surfaces of the first contact plug and the second contact plug are coplanar with each other,
wherein at least one of a sidewall of the channel structure and sidewalls of the first contact plug and the second contact plug includes at least one bent portion, and
wherein the bent portion of the channel structure and the bent portions of the first contact plug and the second contact plug are coplanar with each other.

15. The vertical memory device of claim 14, further comprising a circuit pattern formed on the substrate, the circuit pattern disposed under the first structure and the second structure;
wherein each of the first contact plug and the second contact plug are electrically connected to the circuit pattern.

* * * * *